United States Patent
Okamoto et al.

(10) Patent No.: US 7,017,261 B2
(45) Date of Patent: Mar. 28, 2006

(54) COMPONENT SUCTION DEVICE, COMPONENT MOUNTING APPARATUS AND COMPONENT MOUNTING METHOD

(75) Inventors: Kenji Okamoto, Hirakata (JP); Akira Kabeshita, Hirakata (JP); Hideo Sakon, Suita (JP); Yoichi Makino, Hirakata (JP); Ken Takano, Takaishi (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 164 days.

(21) Appl. No.: 10/130,118

(22) PCT Filed: Sep. 18, 2001

(86) PCT No.: PCT/JP01/08088

§ 371 (c)(1),
(2), (4) Date: May 15, 2002

(87) PCT Pub. No.: WO02/26011

PCT Pub. Date: Mar. 28, 2002

(65) Prior Publication Data

US 2002/0178578 A1 Dec. 5, 2002

(30) Foreign Application Priority Data

Sep. 19, 2000 (JP) .................................... 2000-283650
Mar. 21, 2001 (JP) .................................... 2001-080654

(51) Int. Cl.
*H05K 3/30* (2006.01)
*B23P 19/00* (2006.01)

(52) U.S. Cl. .......................... 29/832; 29/740; 29/741; 29/825; 29/840

(58) Field of Classification Search .................. 29/740, 29/741, 825, 832, 834, 840
See application file for complete search history.

(56) References Cited

U.S. PATENT DOCUMENTS

| | | | | |
|---|---|---|---|---|
| 3,210,631 A | * | 10/1965 | Niccolls | 318/138 |
| 5,086,559 A | * | 2/1992 | Akatsuchi | 29/834 |
| 5,377,405 A | * | 1/1995 | Sakurai et al. | 29/833 |
| 5,491,888 A | * | 2/1996 | Sakurai et al. | 29/832 |
| 5,539,977 A | * | 7/1996 | Kano et al. | 29/833 |
| 5,588,195 A | * | 12/1996 | Asai et al. | 29/33 M |
| 5,836,746 A | * | 11/1998 | Maruyama et al. | 417/44.1 |
| 5,864,944 A | * | 2/1999 | Kashiwagi et al. | 29/833 |
| 5,960,534 A | * | 10/1999 | Yazawa et al. | 29/743 |
| 6,161,277 A | * | 12/2000 | Asai et al. | 29/740 |
| 6,216,341 B1 | * | 4/2001 | Nakahara | 29/833 |
| 6,276,051 B1 | * | 8/2001 | Asai et al. | 29/740 |
| 6,550,134 B1 | * | 4/2003 | Asai et al. | 29/833 |

FOREIGN PATENT DOCUMENTS

| | | |
|---|---|---|
| DE | 39 38 088 | 5/1991 |
| JP | 5-82998 | 4/1993 |
| JP | 2000- 114787 | 4/2000 |

* cited by examiner

Primary Examiner—Carl J. Arbes
(74) Attorney, Agent, or Firm—Wenderoth, Lind & Ponack, L.L.P.

(57) ABSTRACT

A component suction device includes a suction nozzle for sucking and holding a component, a nozzle turning device for holding the suction nozzle and turning the suction nozzle, and a nozzle up-and-down device which is located above the nozzle turning device and which is connected to the suction nozzle for moving up and down the suction nozzle along an axial direction of the suction nozzle.

33 Claims, 47 Drawing Sheets

COMPONENT-MOUNTING-APPARATUS MAIN BODY SIDE            MOUNTING HEAD SIDE

COMPONENT-MOUNTING-APPARATUS MAIN BODY SIDE            MOUNTING HEAD SIDE

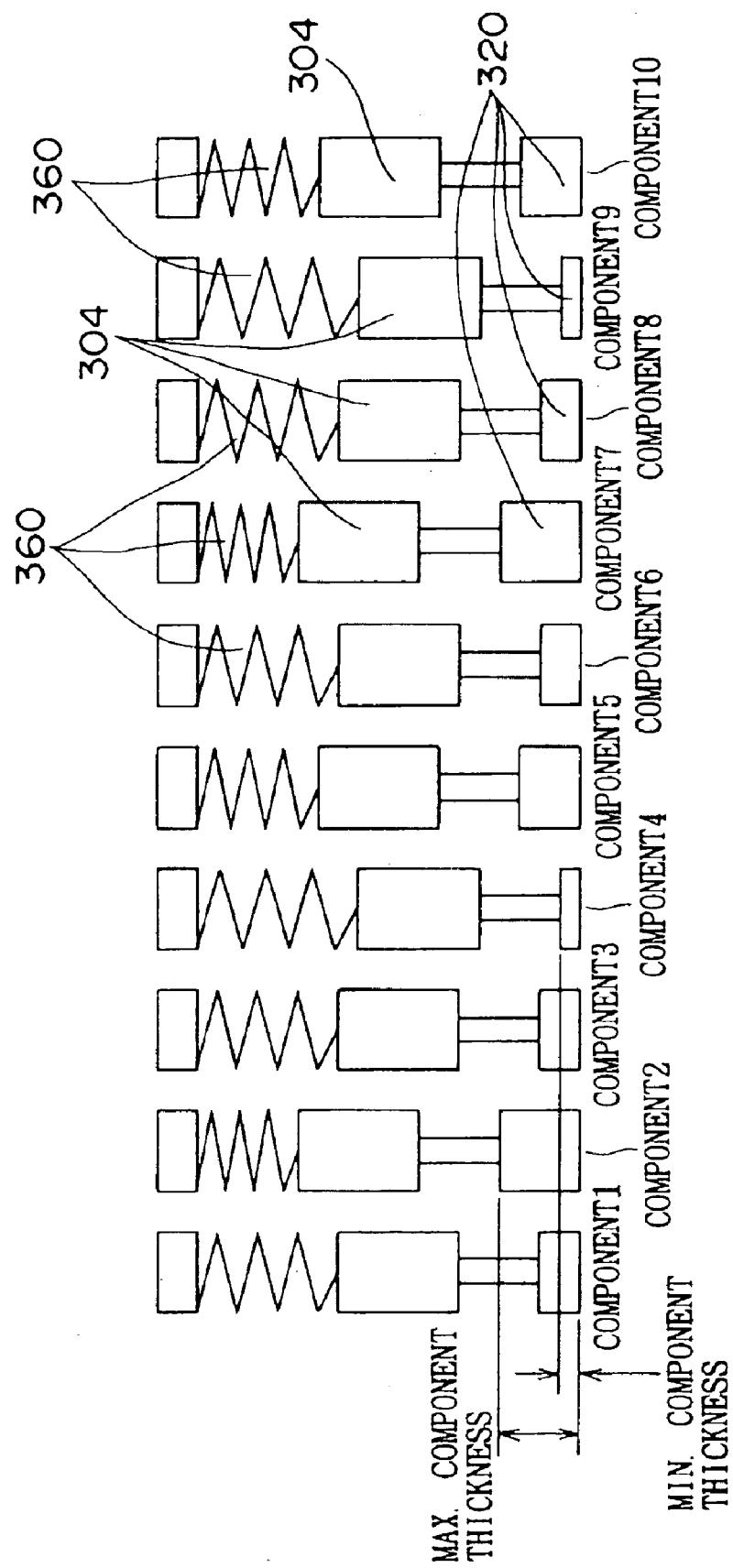

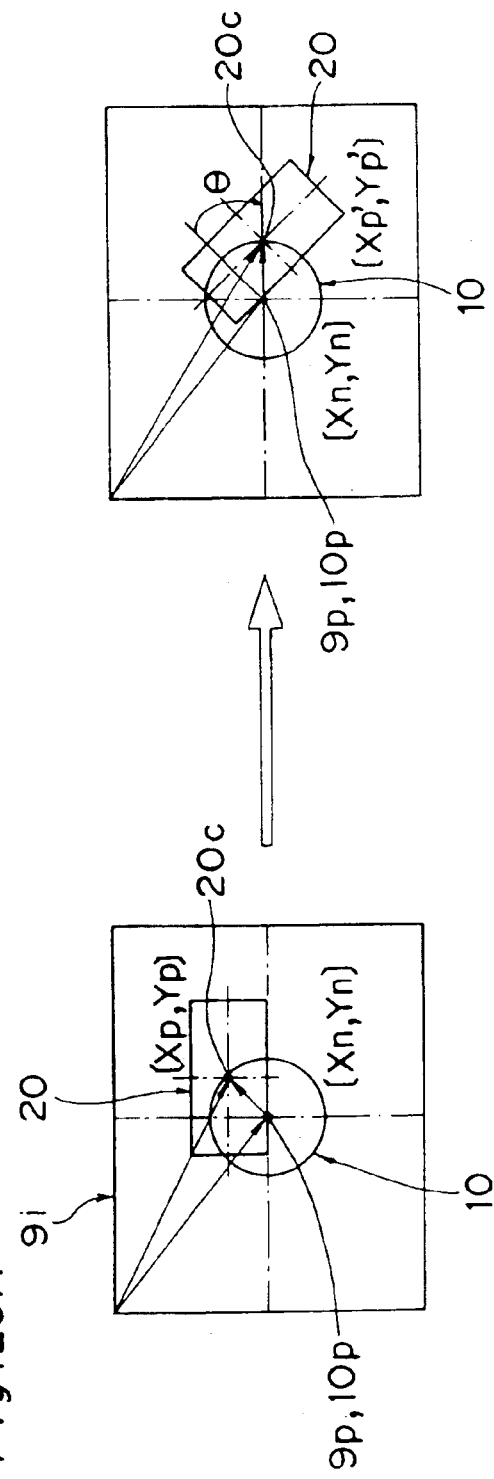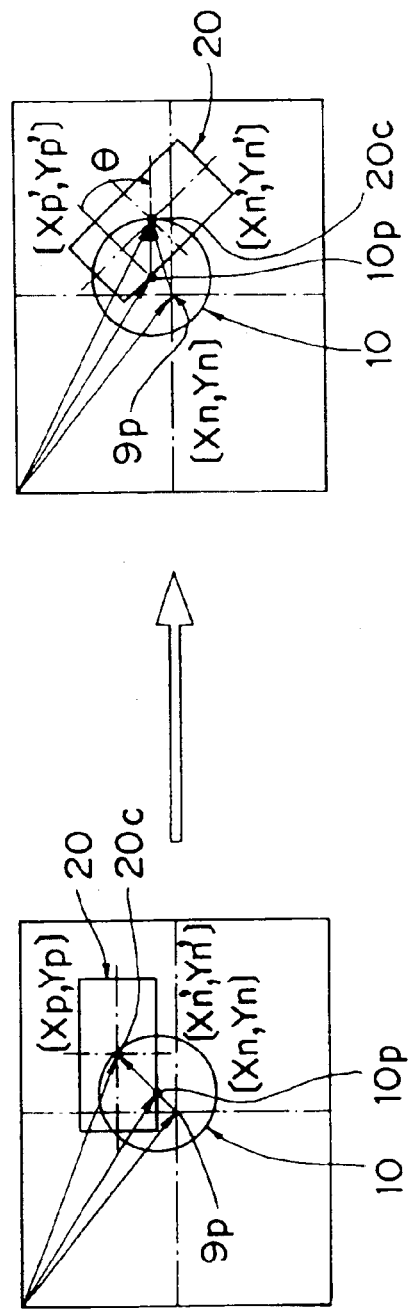

COMPONENT SUCTION DEVICE, COMPONENT MOUNTING APPARATUS AND COMPONENT MOUNTING METHOD

TECHNICAL FIELD

The present invention relates to a component suction device for sucking and holding a component, which is to be mounted onto a circuit-forming body such as a board, and then turning the component to its mounting-posture angle before mounting the component onto the circuit-forming body, also relates to a component mounting apparatus equipped with the component suction device, and further relates to a component mounting method for sucking and holding a component, which is to be mounted onto a circuit-forming body such as a board, and then turning the component to its mounting-posture angle before mounting the component onto the circuit-forming body.

BACKGROUND ART

As this type of component suction device, those of various structures have been known conventionally. For example, as shown in FIG. 22, there has been provided a component mounting apparatus equipped with a mounting head 307 having as component suction devices, for example, ten nozzles 304 that are turnable together, and selectively up-and-down movable. This mounting head 307 is moved to a component feed device side, sucks and holds components received from component feed positions of individual component cassettes of component supply devices, then moves to a recognition device to recognize postures of these sucked-and-held components. Thereafter, the mounting head 307 moves to a board onto which the components are to be mounted, and based on a recognition result, mounts the components at mounting positions of the board.

In this case, the mounting head 307 is so designed that for adjustment of turning postures of components by turning individual nozzles 304 about their axes, the ten nozzles 304, . . . , 304 are simultaneously turned to the same angle by driving one turn-actuating motor 311. Also, for suction and mounting of components, only specified nozzles 304 out of the ten nozzles 304, . . . , 304 are selectively moved down to a specified extent by driving cylinders 310 based on switching of valves so as to be protruded lower than other nozzles, and then the mounting head 307 in its entirety is moved down by drive of a up-and-down motor 312.

However, with component suction devices of the above structure, there has been a demand for making it possible to turn the nozzles independently of one another in a case where a shorter mounting cycle time is desired. That is, when the nozzles are turned after component recognition and before component mounting, all the nozzles need to be turned at once to a correction angle of a nozzle holding a component which is to be next mounted, and after mounting by this nozzle, all the nozzles need to be turned at once to a correction angle of a nozzle holding a component which is to be next mounted, followed by mounting with the nozzle. Thus, it has been a case that a mounting operation is enabled only after each nozzle is turned and corrected. It has been impossible to turn all the nozzles to their respective desired angles at the same time.

Therefore, an object of the present invention is to solve the above-described issues and provide a component suction device capable of turning a plurality of component suction nozzles individually up and down and about their axes, respectively.

SUMMARY OF INVENTION

In accomplishing these and other objects, according to a first aspect of the present invention, there is provided a component suction device for sucking a component which is to be mounted onto a circuit-forming body, comprising:

a suction nozzle for sucking and holding the component;

a nozzle turning device for holding the suction nozzle and turning the suction nozzle; and a nozzle up-and-down device which is located above the nozzle turning device and which is connected to the suction nozzle to serve for moving up and down the suction nozzle along an axial direction of the suction nozzle.

According to a second aspect of the present invention, there is provided a component suction device according to the first aspect, wherein the nozzle up-and-down device is implemented by an up-and-down linear motor for moving up and down the nozzle turning device along the axial direction of the suction nozzle, and wherein the nozzle turning device is moved up and down by driving the up-and-down linear motor, whereby the suction nozzle is moved up and down along the axial direction of the suction nozzle.

According to a third aspect of the present invention, there is provided a component suction device according to the second aspect, wherein a coil is up-and-down movable relative to a magnetic-circuit forming member fixed to a mechanism forming member of the linear motor, and wherein the nozzle turning device is fixed to a support member that supports the coil.

According to a fourth aspect of the present invention, there is provided a component mounting apparatus comprising a mounting head having a plurality of component suction devices as described in any one of the first to third aspects, wherein nozzle turning devices of the plurality of component suction devices are driven individually and independently of one another, and nozzle up-and-down devices of the plurality of component suction devices are driven individually and independently of one another.

According to a fifth aspect of the present invention, there is provided a component mounting apparatus comprising:

a mounting head having a plurality of component suction devices as described in any one of the first to third aspects; and a main controller for controlling operations of: turning individual components, which have been sucked and held by suction nozzles, respectively, of the plurality of component suction devices, to placing posture angles of the individual components by drive of the nozzle turning devices; thereafter, recognizing postures of the individual components that have been sucked and held by the suction nozzles and turned to their placing posture angles; correcting postures based on recognition results; and thereafter mounting the individual components onto the circuit-forming body.

According to a sixth aspect of the present invention, there is provided a component mounting apparatus according to the fifth aspect, wherein the main controller controls to simultaneously turn the individual components sucked and held by the suction nozzles, respectively, to placing posture angles of the individual components by drive of the nozzle turning devices.

According to a seventh aspect of the present invention, there is provided a component mounting apparatus comprising:

a mounting head having a plurality of component suction devices as described in any one of the first to third aspects; and a main controller for controlling operations of: simultaneously turning individual components, which have been sucked and held by suction nozzles, respectively, of the plurality of component suction devices, to placing posture angles of the individual components by drive of the nozzle turning devices; thereafter, placing the individual components, which have been turned to their placing posture angles, onto the circuit-forming body.

According to an eighth aspect of the present invention, there is provided a component mounting apparatus comprising:

a mounting head having a plurality of component suction devices as described in any one of the first to third aspects; and a main controller for controlling operation of: immediately after sucking and holding individual components by suction nozzles of the plurality of component suction devices, turning the individual components to their respective placing posture angles by drive of nozzle turning devices of the component suction devices individually and independently of one another; and thereafter placing the individual components, which have been turned to their placing posture angles, onto the circuit-forming body.

According to a ninth aspect of the present invention, there is provided a component mounting method for sucking and holding individual components, which are to be mounted onto a circuit-forming body, by a plurality of suction nozzles, and thereafter placing these sucked and held components onto the circuit-forming body, the method comprising:

turning the individual components, which have been sucked and held respectively by the suction nozzles, to placing posture angles of the components individually and independently of one another;

thereafter, recognizing postures of the individual components that have been sucked and held by the suction nozzles and turned to their respective placing posture angles; and thereafter, correcting the postures based on recognition results and then placing the individual components onto the circuit-forming body.

According to a tenth aspect of the present invention, there is provided a component mounting method according to the ninth aspect, wherein in turning the individual components, which have been sucked and held respectively by the suction nozzles, to placing posture angles of the components individually and independently of one another, the components, which have been sucked and held respectively by the plurality of suction nozzles, are simultaneously turned to the placing posture angles of the individual components.

According to an eleventh aspect of the present invention, there is provided a component mounting method according to the ninth aspect, wherein in turning the individual components, which have been sucked and held respectively by the suction nozzles, to placing posture angles of the components individually and independently of one another, the individual components are turned to their respective placing posture angles individually and independently of one another immediately after sucking and holding of the components by the suction nozzles.

According to a twelfth aspect of the present invention, there is provided a component mounting apparatus comprising:

a mounting head having a plurality of component suction devices as described in any one of the first to third aspects;

a main controller which is located on a component-mounting-apparatus main body and which controls component mounting operation;

a head controller which is located on the mounting head and connected to the main controller to perform one-to-one asynchronous communications in serial connection with the main controller in association with drive-control related information; and a plurality of servo drivers which are located on the mounting head and connected to the head controller and which perform one-to-multi synchronous communications in serial connection with the head controller in association with drive-control related information, and thus drive and control nozzle up-and-down devices of the component suction devices based on resulting drive-control related information obtained from the head controller.

According to a thirteenth aspect of the present invention, there is provided a component mounting apparatus according to the twelfth aspect, wherein the plurality of servo drivers have addresses different from one another; and the drive-control related information comprises: drive-amount information containing addresses of the servo drivers, and information as to drive amounts for the nozzle up-and-down devices or the nozzle turning devices; and an operation start signal to be communicated at a time different from that of communicating the drive-amount information, wherein after the drive-control related information has been received by the servo drivers having the addresses, the servo drivers, upon receiving the operation start signal, exert control so that a nozzle up-and-down device or a nozzle turning device is driven based on the drive-amount information.

According to a fourteenth aspect of the present invention, there is provided a component mounting apparatus according to any one of the fourth to eighth aspects, wherein after the components are sucked and held by their corresponding suction nozzles of the plurality of component suction devices, and before component recognition is started, the nozzle up-and-down devices are driven to move the suction nozzles up and down so that bottom faces of the individual components are aligned.

According to a fifteenth aspect of the present invention, there is provided a component suction device for sucking a component which is to be mounted onto a circuit-forming body, comprising:

a drive shaft which is up-and-down movable and rotatable about its axis;

a suction nozzle which is fitted at a lower end of the drive shaft so as to be relatively non-rotatable and up-and-down relatively immovable, and which can suck and hold the component;

a θ-turn driving motor which is connected to an upper portion of the drive shaft so as to be up-and-down relatively movable and relatively non-rotatable, and which turns the drive shaft about its axis; and an up-and-down driver device which has a first coupling section connected to the drive shaft up-and-down relatively immovably and relatively rotatably, and which drives up and down the first coupling section to thereby drive the drive shaft up and down.

According to a sixteenth aspect of the present invention, there is provided a component suction device according to the fifteenth aspect, wherein there are plural drive shafts and each of the drive shafts is equipped with an up-and-down driver device and an θ-turn driving motor, and wherein array pitches of the up-and-down driver devices and the θ-turn driving motors are equal to an array pitch of the suction nozzles and further equal to an array pitch of a plurality of component feed sections of a component feed device which feeds components to be sucked and held by the suction nozzles.

According to a seventeenth aspect of the present invention, there is provided a component suction device according to the fifteenth or sixteenth aspect, wherein the up-and-down driver device is a linear motor.

According to an eighteenth aspect of the present invention, there is provided a component suction device according to any one of the fifteenth to seventeenth aspects, wherein the θ-turn driving motor is a brushless motor.

According to a nineteenth aspect of the present invention, there is provided a component suction device according to any one of the fifteenth to eighteenth aspects, further comprising a suction control valve for controlling suction operation of the nozzle.

According to a twentieth aspect of the present invention, there is provided a component suction device according to the eighteenth aspect, wherein the brushless motor comprises:

a rotor which is supported so as to be axially turnable and which is magnetized to have a plurality of peripheral poles; and a stator in which a fore end portion of teeth having a coil wound around a tooth winding portion of each tooth is opposed to an outer periphery of the rotor, so that the rotor is turned along with a rotating magnetic field of the stator, and wherein the fore end portion of each of the teeth of the stator is shaped into a circular-arc surface extending along the outer periphery of the rotor, and the tooth winding portions are formed parallel to one another.

According to a twenty-first aspect of the present invention, there is provided a component suction device according to the twentieth aspect, wherein in the brushless motor, the stator is so formed that the circular-arc surfaces of the fore end portions of the teeth confronting the outer periphery of the rotor have a symmetrical slot pitch.

According to a twenty-second aspect of the present invention, there is provided a component suction device according to the twentieth or twenty-first a spect, wherein in the brushless motor, the stator has a thickness along an axis of the rotor and has such a flat shape along an end face of the rotor that a first length formed by interconnecting points of the stator corresponding to 0° and 180° about the axis of the rotor is shorter than a second length formed by interconnecting points of the stator corresponding to 90° and 270° about the axis of the rotor.

According to a twenty-third aspect of the present invention, there is provided a component suction device according to the twenty-second aspect, wherein in the brushless motor, the stator is formed of first and second stator blocks which contact each other at a boundary of connection between the points of the stator corresponding to 0° and 180° about the axis of the rotor.

According to a twenty-fourth aspect of the present invention, there is provided a component suction device according to the twenty-third aspect, wherein in the brushless motor, each of the first stator block and second stator block is composed of a plurality of tooth blocks which are joined together so that a magnetic path is formed by base end portions of their tooth winding portions.

According to a twenty-fifth aspect of the present invention, there is provided a component suction device according to the twenty-fourth aspect, wherein in the brushless motor, the stator is formed of a single stator block.

According to a twenty-sixth aspect of the present invention, there is provided a component suction device according to the twenty-fourth aspect, wherein in the brushless motor, the stator has grooves which serve as the tooth winding portions, and which are formed thicknesswise in a side surface of the stator crossing a direction of the first length, wherein an outermost peripheral surface of the coil wound on the grooves is positioned so as to be flush with the side surface or inward of the side surface.

According to a twenty-seventh aspect of the present invention, there is provided a component suction device according to the seventeenth aspect, wherein the linear motor includes:

a plurality of frame coils provided inside a cylindrical outer yoke on a stationary side;

an inner yoke having a plurality of teeth passing through the coils, and a magnetic communicating portion formed at at least one end of the teeth; and magnets provided on both surfaces of each tooth so that faces of one tooth opposed to a respective frame coil have a single polarity, while faces of another tooth opposed to another frame coil has a single different polarity, wherein a magnetic flux radiated from a specific magnet, out of the magnets, flows to an adjacent tooth via the outer yoke, passes through the magnetic communicating portion, and flows through the tooth on which the specific magnet is provided, and thus flows back to the specific magnet, and wherein with an electric current supplied to the frame coils, a movable side composed of the magnets and the inner yoke moves longitudinally of the teeth.

According to a twenty-eighth aspect of the present invention, there is provided a component suction device according to the twenty-seventh aspect, wherein in the linear motor, the inner yoke is U-shaped.

According to a twenty-ninth aspect of the present invention, there is provided a component suction device according to the twenty-seventh aspect, wherein in the linear motor, the frame coil has an opening face having such a rectangular shape that a length of its side line opposite to the magnets is longer than a length of its span section.

According to a thirtieth aspect of the present invention, there is provided a component suction device according to the seventeenth aspect, wherein the linear motor includes:

an inner yoke having a plurality of teeth in which a magnetic communicating portion is formed at at least one end thereof;

an outer yoke which externally surrounds the plurality of teeth;

magnets provided opposite to both faces of the teeth inside the outer yoke so that faces of the magnets opposed to the teeth are of a single pole and faces opposed to their respective adjoining teeth are different in polarity from each other; and coils wound on individual teeth of the inner yoke , wherein a magnetic flux radiated from a specific magnet, out of the magnets, flows to an adjacent tooth via the outer yoke, passes through the magnetic communicating portion, and flows through the tooth opposing the specific magnet, and thus flows back to the specific magnet, and wherein with an electric current supplied to the coil, a movable side composed of the magnets and the outer yoke moves in a longitudinal direction of the teeth.

According to a thirty-first aspect of the present invention, there is provided a component suction device according to the thirtieth aspect, wherein in the linear motor, the teeth each have such a rectangular shape that a length of its side line opposite to the magnets is longer than a length of a connection side connecting opposite side lines to each other.

BRIEF DESCRIPTION OF DRAWINGS

These and other aspects and features of the present invention will become clear from the following description taken in conjunction with the preferred embodiments thereof with reference to the accompanying drawings, in which:

FIG. 18 is an explanatory view showing a state in which differences in component thickness are absorbed by contracting, to extents of component thickness differences, springs provided for individual nozzles of the mounting head, in the component mounting apparatus of the prior art;

FIGS. 23A and 23B are explanatory views for explaining a placing-position shift during turning of a nozzle in cases where the nozzle is not subjected to effects of heat or the like, and where the nozzle is, respectively;

DETAILED DESCRIPTION OF THE PREFERRED EMBODIMENTS

Figure 1:
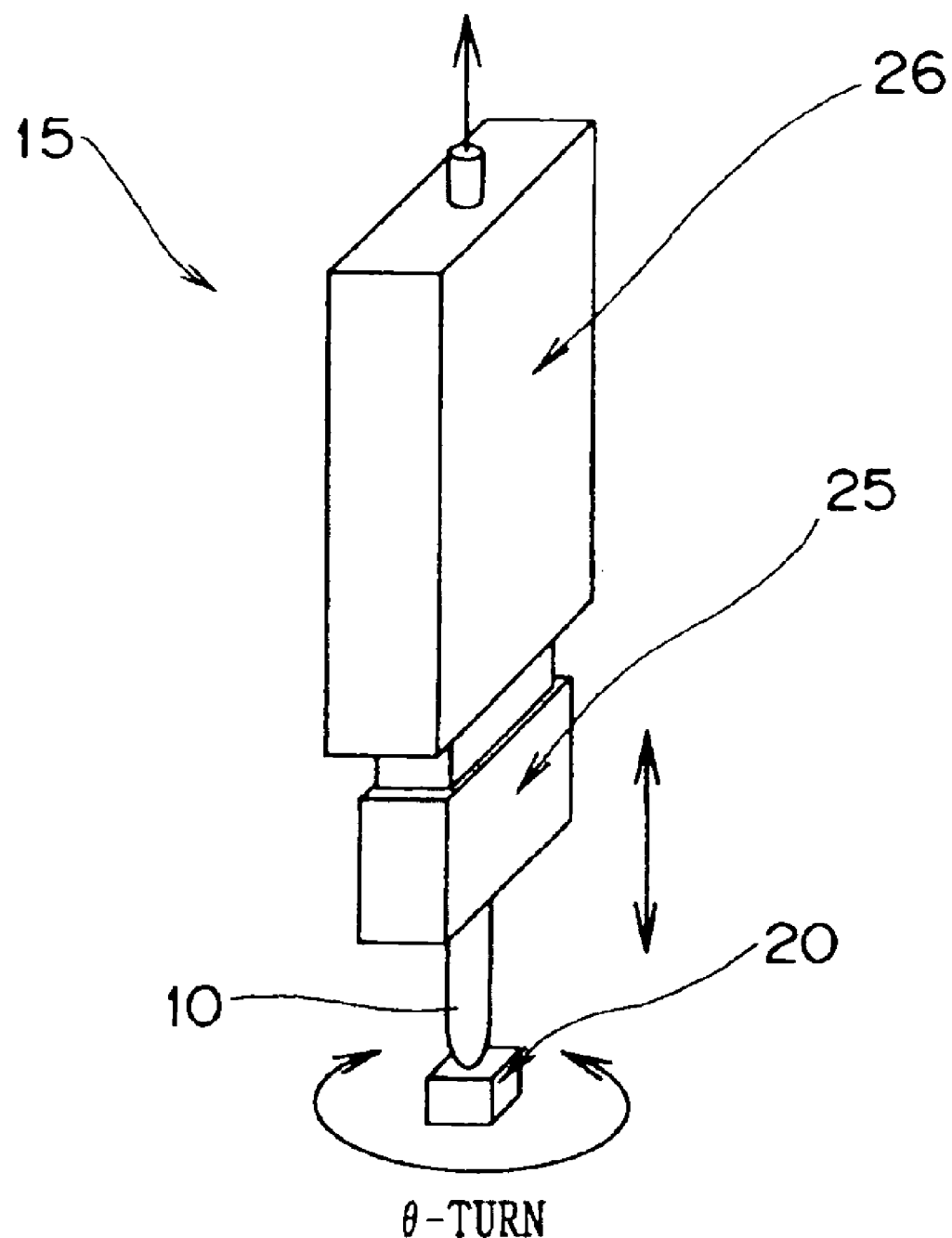
FIG. 1 is a schematic perspective view of a component suction device according to a first embodiment of the present invention.

Before description of the present invention proceeds, it is to be noted that like parts are designated by like reference numerals throughout the accompanying drawings.

A component suction device 15 according to a first embodiment of the present invention is, as shown in FIG. 1, a component suction device for sucking a component 20 which is to be mounted onto a circuit-forming body, for example, a board 2. The component suction device 15 includes a suction nozzle 10 for sucking and holding the component 20, a nozzle turning device 25 for holding the suction nozzle 10 and turning the suction nozzle 10, and a nozzle up-and-down device 26 which is disposed above the nozzle turning device 25 and connected to the suction nozzle 10, and which moves the suction nozzle 10 up and down along an axis of the suction nozzle 10.

The term "circuit-forming body" herein refers to circuit boards such as resin boards, paper-phenol boards, ceramic boards, glass epoxy boards, and film boards, circuit boards such as single-layer boards or multi-layer boards, and objects with circuits formed thereon such as components, casings, and frames. Also, the term "component" includes electronic components, mechanical components, optical components, and the like.

Figure 2:
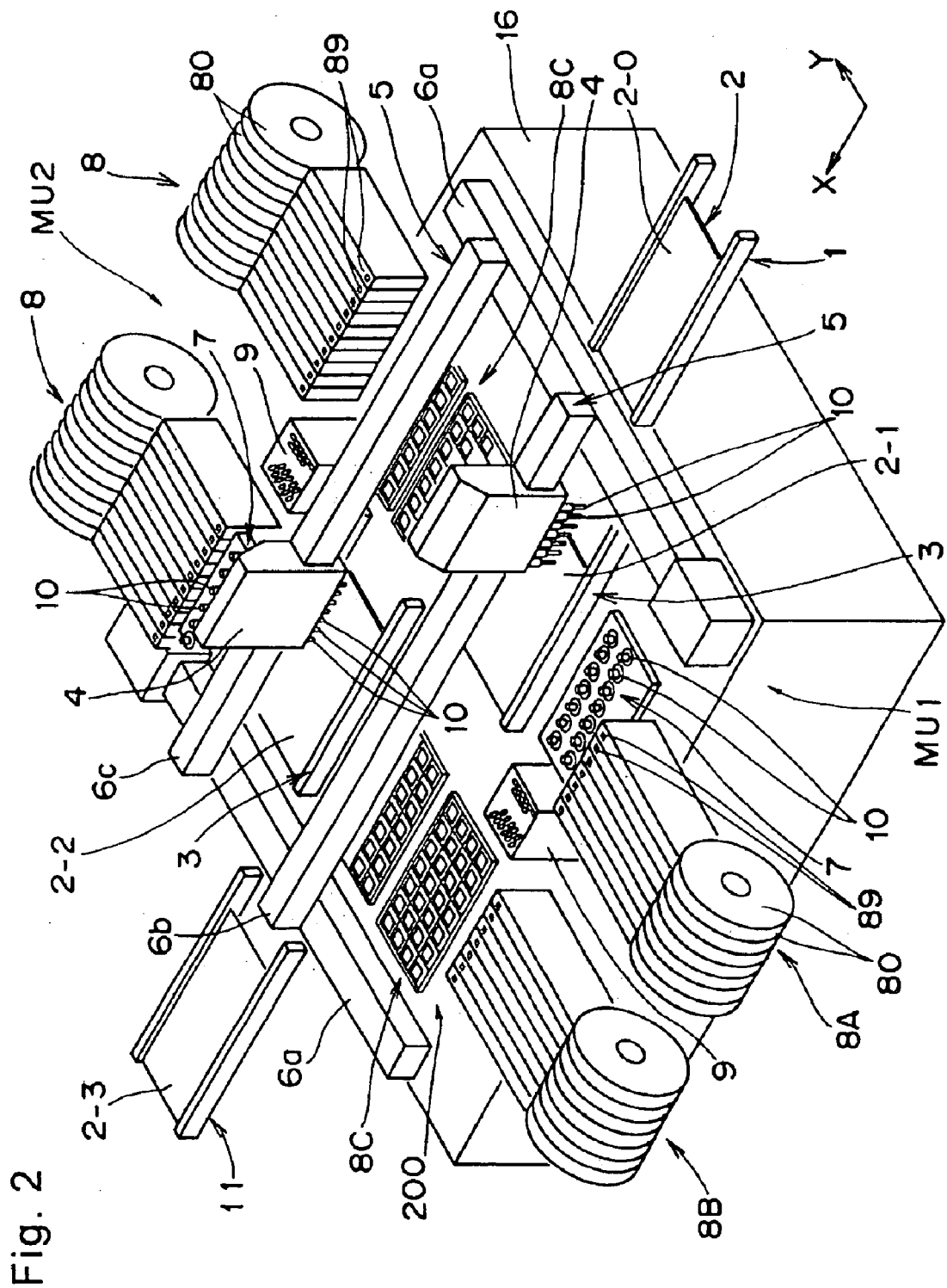
FIG. 2 is an overall schematic perspective view of a component mounting apparatus on which the component suction device according to the first embodiment of the present invention is mounted.
Figure 3:
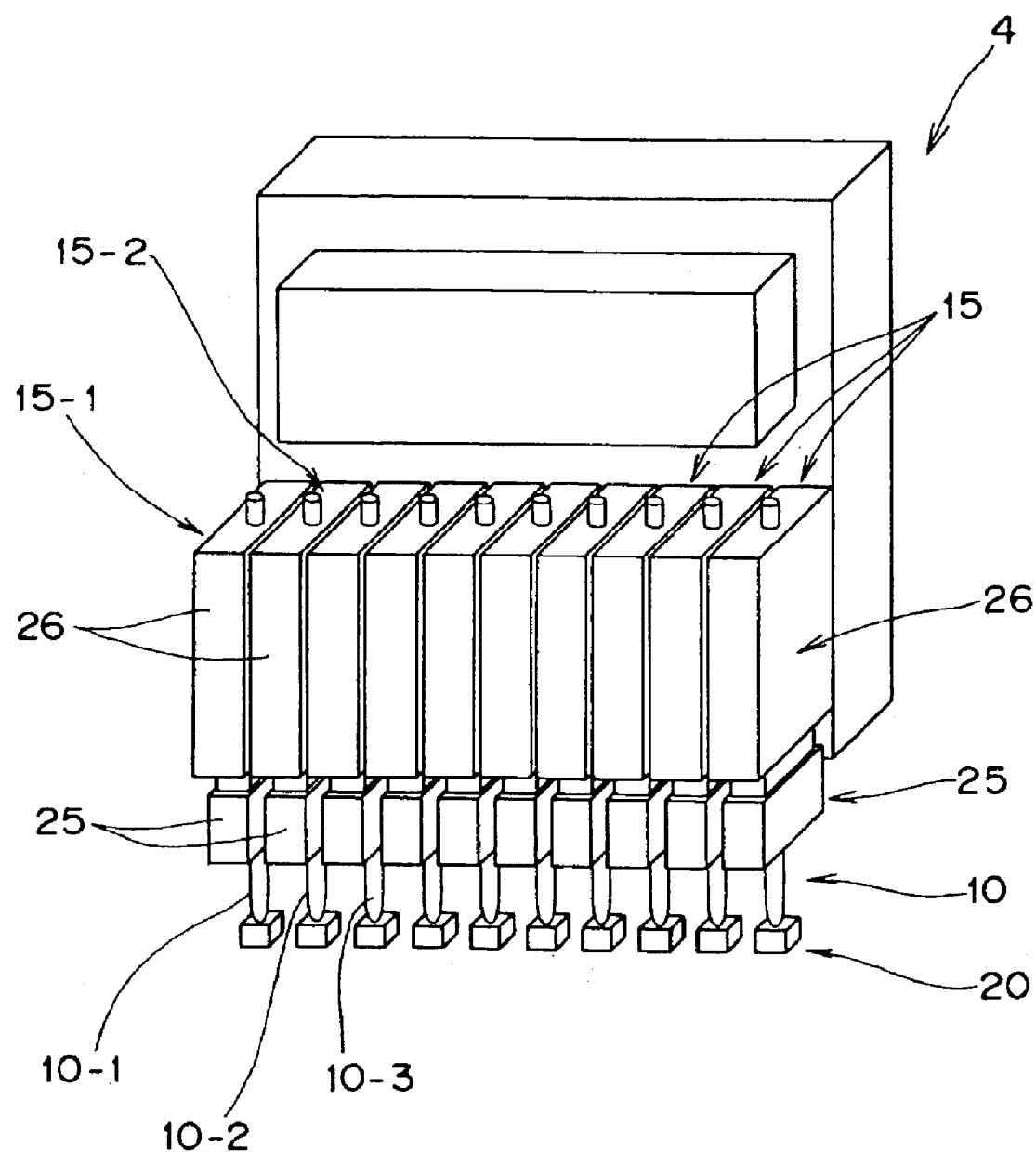
FIG. 3 is a perspective view of a mounting head of the component mounting apparatus equipped with the component suction device.

FIG. 2 shows an overall schematic perspective view of a component mounting apparatus which has two mounting heads 4 equipped with ten component suction devices 15, . . . , 15 as described above and which perform component mounting operations, and FIG. 3 shows a perspective view of one mounting head 4. This component mounting apparatus has two mounting sections, a front-side mounting section MU1 that is located obliquely left-downward in FIG. 2 and a rear-side mounting section MU2 that is located obliquely right-upward, wherein these individual mounting sections are enabled to perform component mounting operations such as component suction, recognition, and placement independently of one another for each board. It is noted that the component mounting operations refer to, for example, component suction, component carriage, component recognition, component placement and the like.

In FIG. 2, reference numeral 1 denotes a loader for carrying in a circuit board 2-0 (circuit boards are denoted by numeral 2 when referred to regardless of their positions, and boards of specific positions are denoted by numerals 2-0, 2-1, 2-2, 2-3 etc.), and numeral 11 denotes an unloader for carrying out a circuit board 2-3. Numeral 3 denotes a board carrying-and-holding device as an example of circuit-forming-body holding device which is provided in each mounting section and which carries and holds the board 2 carried in from the loader 1, numeral 4 denotes a mounting head which is provided in each mounting section and has the component suction devices 15 and equipped with a plurality of, for example, ten component suction nozzles 10 that suck and hold the components 20. The component suction nozzles 10 are replaceable. Numeral 5 denotes an X-Y robot which is provided in each mounting section and which positions a respective mounting head 4 to a specified position in X- and Y-directions, which are two perpendicular directions within a component-mounting working area, and numeral 7 denotes a nozzle station which is provided near a component feed device 8A in an individual component-mounting working area of each mounting section and which accommodates therein a plurality of kinds of component suction nozzles 10 suited to a plurality of kinds of components and, as required, replaces these nozzles with nozzles 10 set on mounting head 4. Numerals 8A, 8B denote component-parts-cassette type component feed devices which are provided at a shallow-side, i.e. front-side, end portion and a deep-side, i.e. rear-side, end portion, respectively, of the component-mounting working areas with respect to an operator, and which have a plurality of component feed cassettes 80 for accommodating the components 20, which are to be mounted onto the board 2, individually into, for example, component-accommodation recessed portions of carrier tapes, and for feeding the components 20 one by one to component feed positions 89. Numeral 8C denotes a tray type component feed device which is provided near each component feed device 8B and which accommodates thereon tray components accommodated and held in a tray-like manner, which are to be mounted onto the board 2, and numeral 9 denotes a two-dimensional or three-dimensional recognition camera which is provided in vicinity of each component feed device 8A and on a near side of a center of a respective component-mounting working area, and which picks up suction posture images of the components 20 sucked by the nozzles 10 of each mounting head 4.

The X-Y robot 5 is constituted as follows. Two Y-axis drive sections 6*a*, 6*a* of the X-Y robot 5 are fixedly set at front-and-rear end edges of component-mounting working areas 200 of the individual mounting sections on a mounting apparatus base 16, and two X-axis drive sections 6*b*, 6*c* are extended over these two Y-axis drive sections 6*a*, 6*a* so as to be movable independently in the Y-axis direction and capable of avoiding collisions, where the mounting head 4 that moves within the front-side half mounting area of the component-mounting working area is disposed on the X-axis drive section 6*b* so as to be movable in the X-axis direction, while the mounting head 4 that moves within the rear-side half mounting area of the component-mounting working area is disposed on the X-axis drive section 6*c*. Each of the Y-axis drive sections 6*a*, 6*a* and the X-axis drive sections 6*b*, 6*c*, is constructed from X-Y robot motors 6*y*, 6*x*, ball screws that are driven forward and reverse by the motors 6*y*, 6*x*, and advanceable and retreatable members in which members to be moved are screwed with the ball screws and which are moved by forward and reverse rotation of the ball screws based on forward and reverse rotational drive of the motors 6*y*, 6*x*. The motors 6*y*, 6*x* are drive-controlled by an X-Y robot controller 1010 which is controlled by a later-described main controller 1000.

Figure 4:
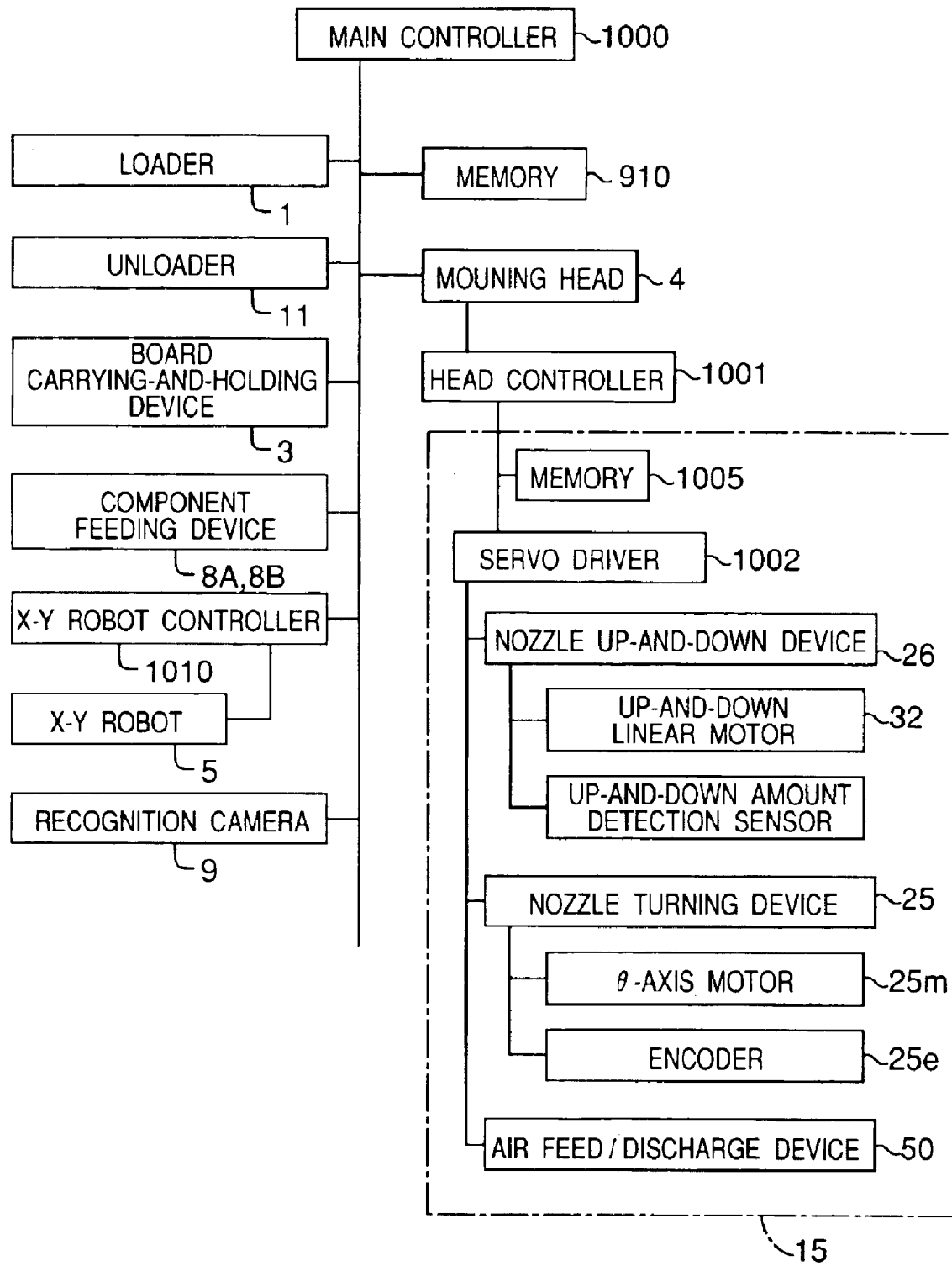
FIG. 4 is a block diagram showing a relationship between a main controller, which is a control section of the component mounting apparatus, and other devices or members.

Further, as shown in FIG. 4, the main controller 1000 for controlling board carriage-in and carriage-out, component holding, component recognition, component placement operations and the like is provided, and the component feed devices 8A, 8B, the component feed cassettes 80, the mounting heads 4, the recognition cameras 9, the board carrying-and-holding devices 3, the X-Y robots 5, a memory 910, the loader 1, the unloader 11, and the like are connected. In the memory 910 are stored NC data showing mounting programs as to, for example, which components are mounted, to which position and in which order these components are mounted, arrangement programs as to, for example, which components are arranged on which component feed members, or arrangement information as to, for example, which components have been arranged on which component feed members, component libraries of component information as to configuration, height, and the like of individual components, board information as to configuration of individual boards, and other information as to configuration of component suction nozzles and a board carriage position for each individual board carrying-and-holding device 3, or the like.

As a basic operation of this component mounting apparatus, under control of the main controller 1000, the front- and rear-side board carrying-and-holding devices 3 are driven to be moved toward a center so that the front- and rear-side board carrying-and-holding devices 3 are arranged so as to be connected in line with the loader 1 and the unloader 11, and thereafter, a circuit board 2-2 is carried in from the loader 1 via the front-side board carrying-and-holding device 3 to the rear-side board carrying-and-holding device 3, and also circuit board 2-1 is carried in from the loader 1 to the front-side board carrying-and-holding device 3, with individual circuit boards 2-1, 2-2 being held by the front- and rear-side board carrying-and-holding devices 3. After that, by drive of the front- and rear-side board carrying-and-holding devices 3, 3, the boards are moved from center-side board carrying-and-holding positions to specified placing positions near the component feed devices 8A, respectively, as shown in FIG. 2.

Next, under control of the main controller 1000, each group of ten suction nozzles 10 is moved to, for example, suction preparatory positions above individual component feed positions 89 for ten component feed cassettes 80, respectively, by a respective mounting head 4 based on individual drive of the X-Y robots 5.

Next, each group of ten suction nozzles 10 moves down simultaneously from the suction preparatory positions toward the component feed positions 89 corresponding thereto, sucks and holds ten components 20 located at the ten component feed positions 89, respectively, collectively and simultaneously or individually, and then moves again up to the suction preparatory positions.

Next, by individual drive of the X-Y robots 5, the suction nozzles 10 move from the suction preparatory positions toward the recognition cameras 9, respectively, wherein while each group of ten suction nozzles 10 moves above its corresponding recognition camera 9, the recognition cameras 9 individually recognize positions, postures, and configurations of a corresponding ten components 20.

Next, after completion of this recognition, based on recognition results and under control of the main controller 1000, individual posture or position corrections of the components 20 are performed, as required, by performing X- and Y-directional drive control of the mounting heads 4 (drive control of the X-Y robot motors 6*y*, 6*x* by the X-Y robot controller 1010) or θ-rotation drive control of individual suction nozzles 10 (drive control of a θ-axis motor 25*m* by a servo driver 1002). Thereafter, the components 20 are set to specified mounting positions of the boards 2, respectively.

Meanwhile, the component suction devices 15, in which the nozzle turning device 25 and the nozzle up-and-down device 26 of each suction nozzle 10 are provided in the same unit, each have the following constitution in detail.

Figure 5A:
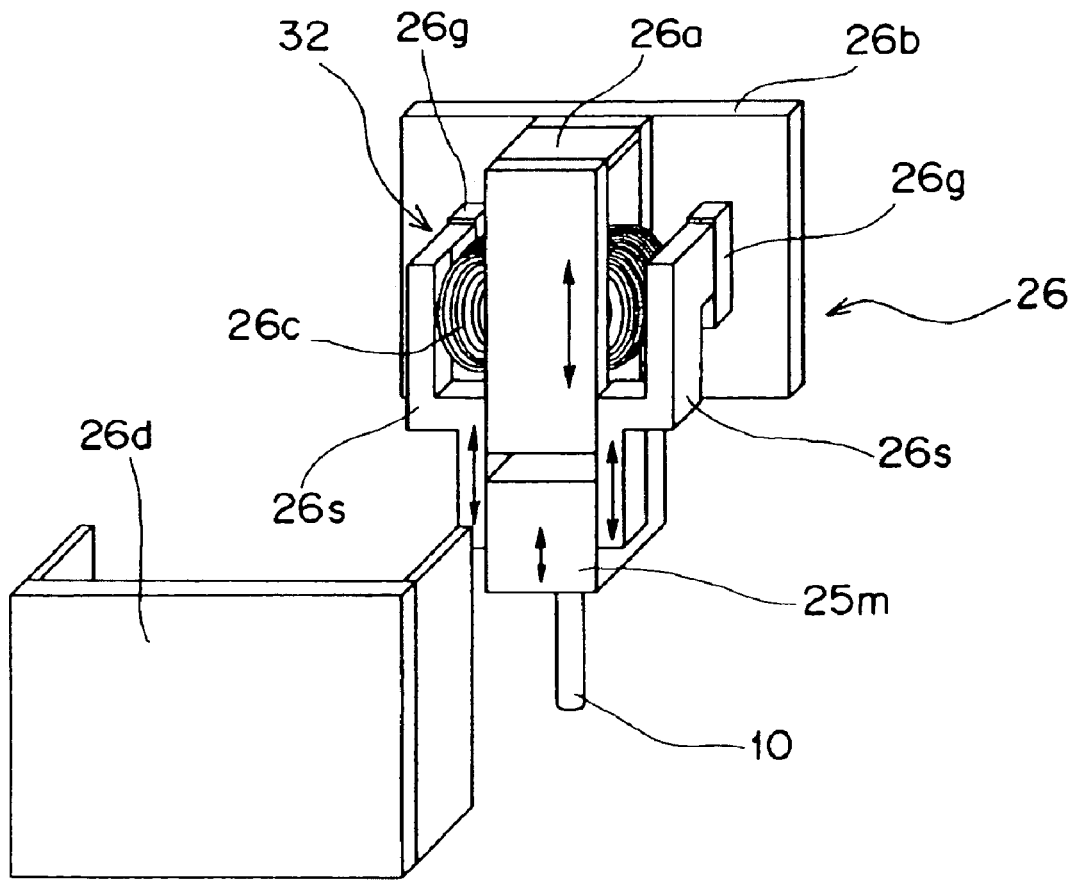
FIGS. 5A and 5B are an exploded perspective view of a nozzle up-and-down device, and a partial sectional view of a nozzle turning device in the component suction device.

First, as shown in FIG. 5A, the nozzle up-and-down device 26 is implemented by an up-and-down linear motor 32 for moving up and down the nozzle turning device 25 along the axis of the suction nozzle 10. The nozzle turning device 25 is moved up and down by driving the up-and-down linear motor 32, by which the suction nozzle 10 is moved up and down along the axis of the suction nozzle 10.

More specifically, in the nozzle up-and-down device 26, as shown in FIG. 5A, a magnetic-circuit forming member 26*a* made of iron and magnets in a rectangular frame shape is fixed on a surface of a plate-shaped mechanism-forming member 26*b* of aluminum alloy or the like, and an up-and-down movable linear motor coil 26*c* within the magnetic-circuit forming member 26*a* is disposed so as to be movable in an up-and-down direction. The movable linear motor coil 26*c* is fixed and supported on a surface of the mechanism-forming member 26*b* by being sandwiched between upper portions of a pair of support members 26*s* which are linearly guided in the up-and-down direction by linear guides 26*g*. θ-axis motor 25*m* is fixed and supported at a lower portion of these paired support members 26*s* by being sandwiched from both sides thereby. In this arrangement, preferably, a center line of the θ-axis motor 25*m* is placed at a center of a thrust imparted by the linear motor 32 so that occurrence of an unnecessary moment is prevented during up-and-down operations, by which swings due to the up-and-down operations are prevented. Therefore, the magnetic-circuit forming member 26*a* and the linear motor coil 26*c* constitute the up-and-down linear motor 32, wherein by an electric current supplied to the linear motor coil 26*c*, the linear motor coil 26*c* is moved up and down while guided by the linear guides 26*g* within the magnetic-circuit forming member 26*a*, by which the θ-axis motor 25*m* coupled to the linear motor coil 26*c* with the pair of support members 26*s* is moved up and down integrally with the linear motor coil 26*c*. It is noted that reference numeral 26*d* denotes a cover of the up-and-down linear motor 32. Also, an up-and-down amount detection sensor for detecting an up-and-down amount of the linear motor coil 26*c* or the support members 26*s* is provided, so that a detected up-and-down amount is fed back to a later-described servo driver 1002 that controls drive of the up-and-down linear motor 32.

Figure 5B:
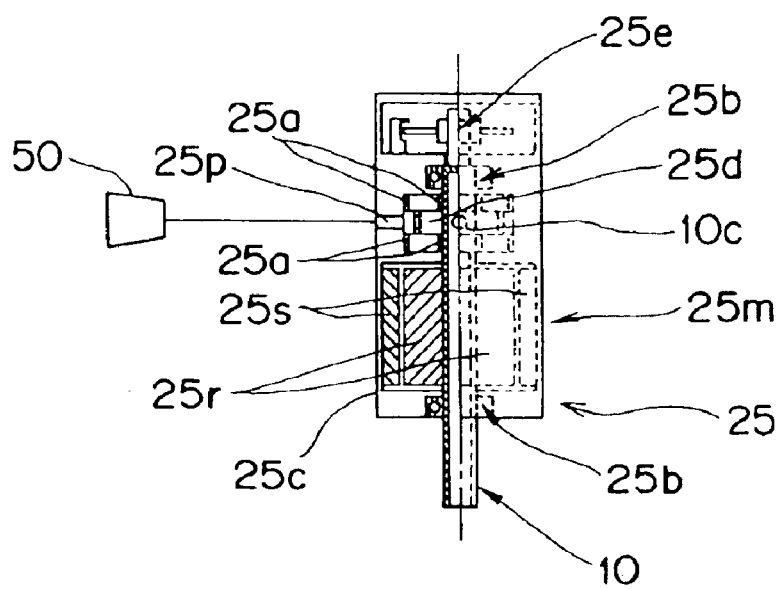

The nozzle turning device 25, as shown in FIG. 5B, supports the suction nozzle 10 by up-and-down bearings 25*b* so that the suction nozzle 10 is rotatable, and an encoder 25*e* is provided at an upper end of the suction nozzle 10, wherein a current position of the suction nozzle 10 with respect to an origin position in its turning direction is detected by the encoder 25*e*, and a detected current position is fed back to the servo driver 1002 that controls drive of the θ-axis motor 25*m*. A cylindrical magnet 25*r* is fixed on a central-part outer periphery of the suction nozzle 10, and a stator 25*s* is fixed to a casing 25*c* of the nozzle turning device 25, wherein the cylindrical magnet 25*r* and the stator 25*s* constitute the θ-axis motor 25*m*. A suction discharge chamber 25*d* sandwiched by packings 25*a* is formed at an upper portion of the suction nozzle 10, and an upper-end opening 10*c* of the suction nozzle 10 is kept in communication with the suction discharge chamber 25*d* at all times so as to be coupled to an air feed/discharge passage 25*p* via the suction discharge chamber 25*d*. By drive of an air feed/discharge device 50 which is connected to the air feed/discharge passage 25*p* by being coupled to the air feed/discharge passage 25*p* via the suction discharge chamber 25*d*, and which is composed of a vacuum pump, a compressed-air feed device, and the like, suction and discharge (blow) operations of the suction nozzle 10 can be performed, when necessary, regardless of a turning position of the suction nozzle 10 by, for example, performing opening and closing operations and suction and discharge (blow) switching operations by valves 90 shown in FIG. 16.

Next, a variety of examples of operations of ten component suction devices 15 are explained. First described is a case where ten nozzles 10 move down independently, one by one, to perform component suction.

In this case, typically, a first component suction device 15-1 and a second component suction device 15-2 are described with reference to FIG. 3. After component feed from the component feed device 8A or 8B by suction nozzle 10-1 of the first component suction device 15-1 and a component suction-and-holding operation by the suction nozzle 10-1 are performed, the suction nozzle 10-1 is subjected to a component turning operation such that the suction nozzle 10-1 is turned about its axis, for example, a θ-axis extending along the up-and-down direction, by its θ-axis motor 25*m* so as to be turned to its placing posture angle. Meanwhile, after component feed from the component feed device 8A or 8B by suction nozzle 10-2 of the second component suction device 15-2 and a component suction-and-holding operation by the suction nozzle 10-2 are performed, the suction nozzle 10-2 is subjected to a turning operation such that the suction nozzle 10-2 is turned to its placing posture angle by its θ-axis motor 25*m*, wherein the component suction-and-holding operation performed by the suction nozzle 10-2 of the second component suction device 15-2 is started when the component turning operation performed by the suction nozzle 10-1 of the first component suction device 15-1 is started. By doing so, while a suction operation by one suction nozzle 10 is being performed, another suction nozzle 10 is enabled to perform a turning operation to its placing posture angle, so that a mounting time can be reduced greatly, as compared with cases where a turning operation for all components to their placing posture angles is performed after a suction operation for all the components is performed.

As another example, component suction, recognition, and placing operations of ten components 20 may also be performed simultaneously by ten nozzles 10 by one operation. This is described in detail below with reference to FIGS. 6 and 7.

Figure 6:
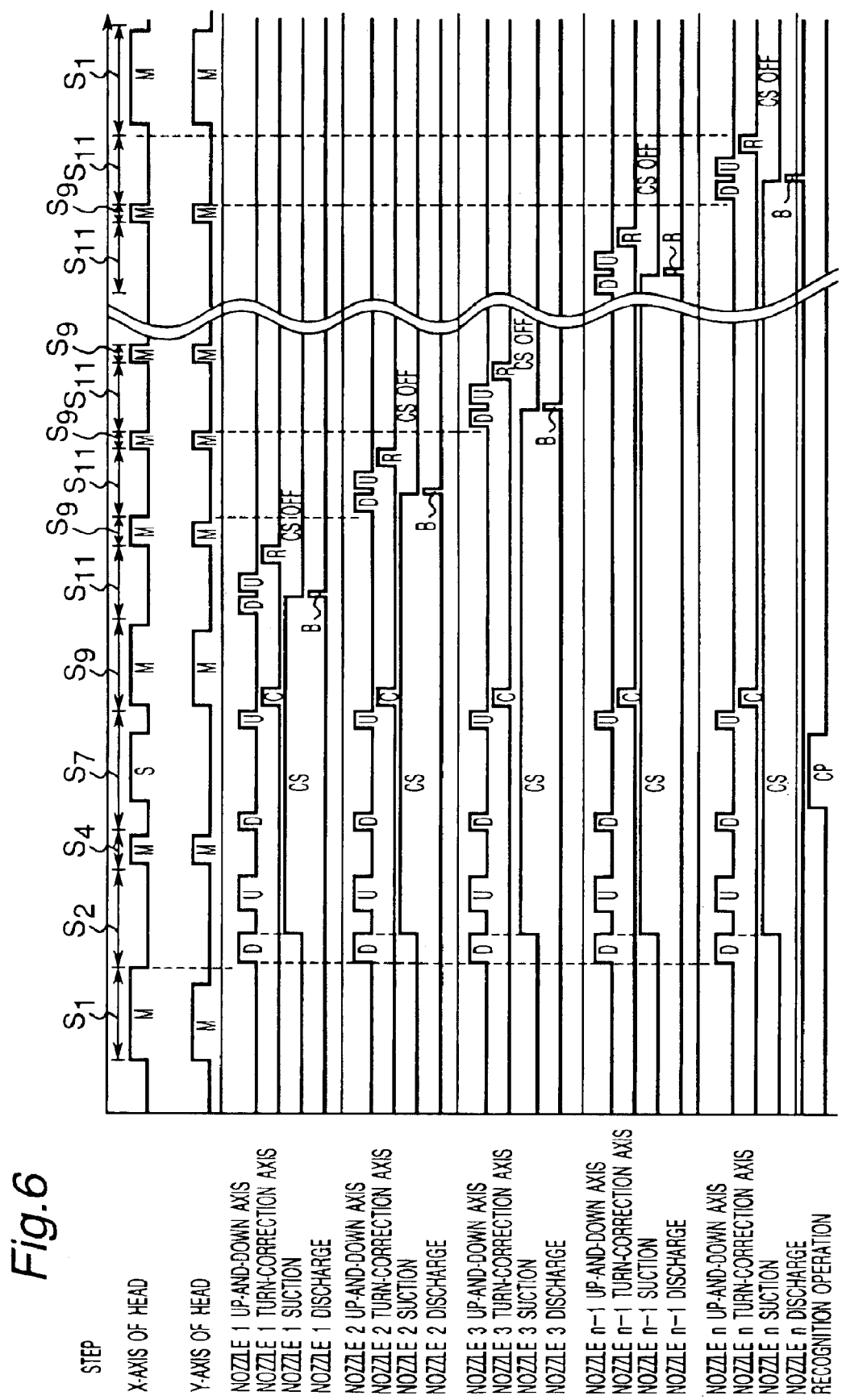
FIG. 6 is a timing chart of X- and Y-directional movements of the mounting head, up-and-down operations and turning operations of nozzles, and the like in the component mounting apparatus of the first embodiment.

In FIG. 6, "M" denotes movement, "S" a scanning operation, "D" a moving-down operation, "U" a moving-up operation, "C" a correction operation, "R" origin, "CS" a component suction operation, "CSOFF" release of component suction, "B" a blow operation, and "CP" a recognition processing operation.

As a reference, operations in the prior art are described first.

Figure 8:
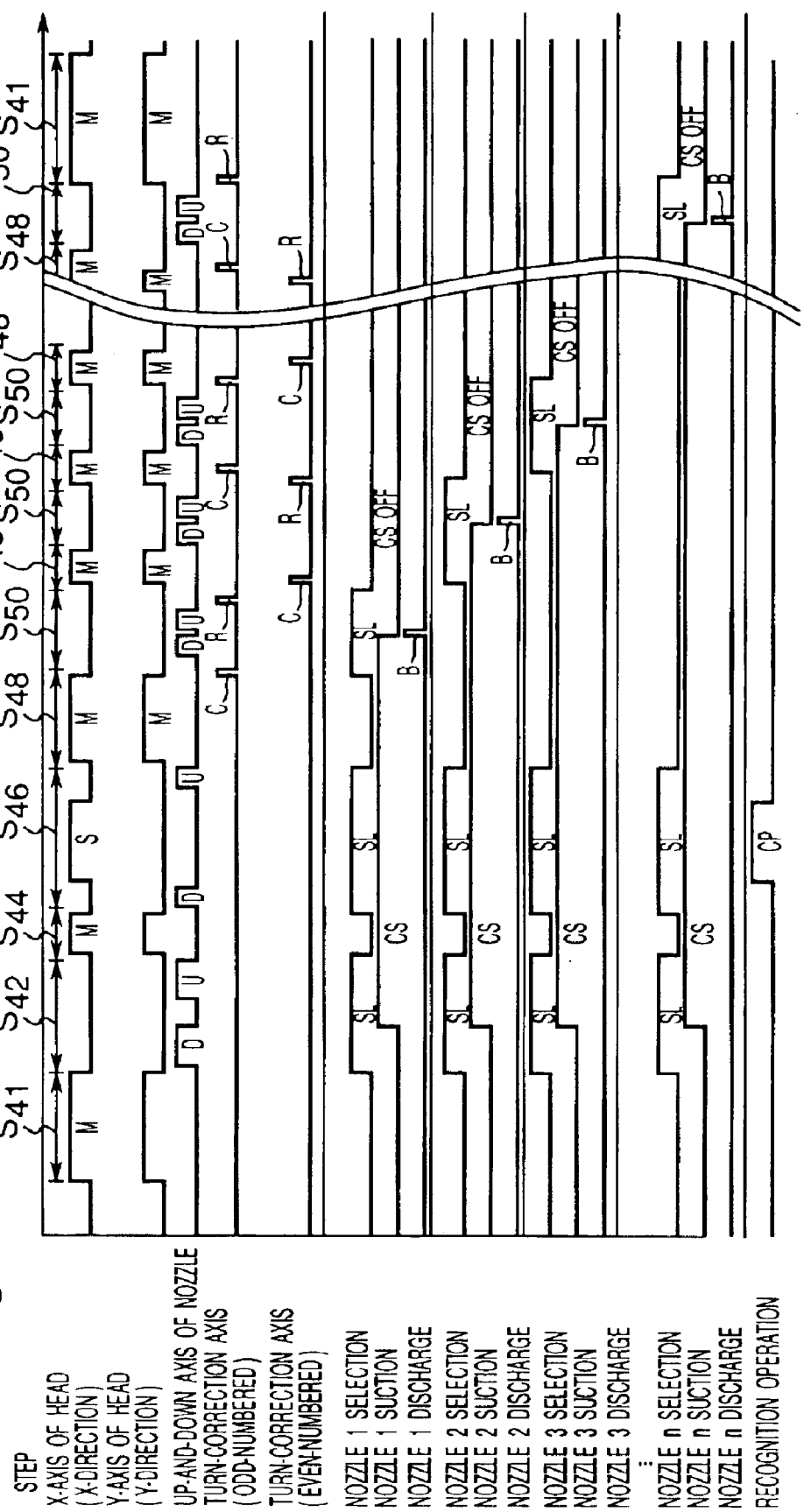
FIG. 8 is a timing chart of X- and Y-directional movements of the mounting head, up-and-down operations and turning operations of nozzles, and the like in a component mounting apparatus of the prior art.
Figure 9:
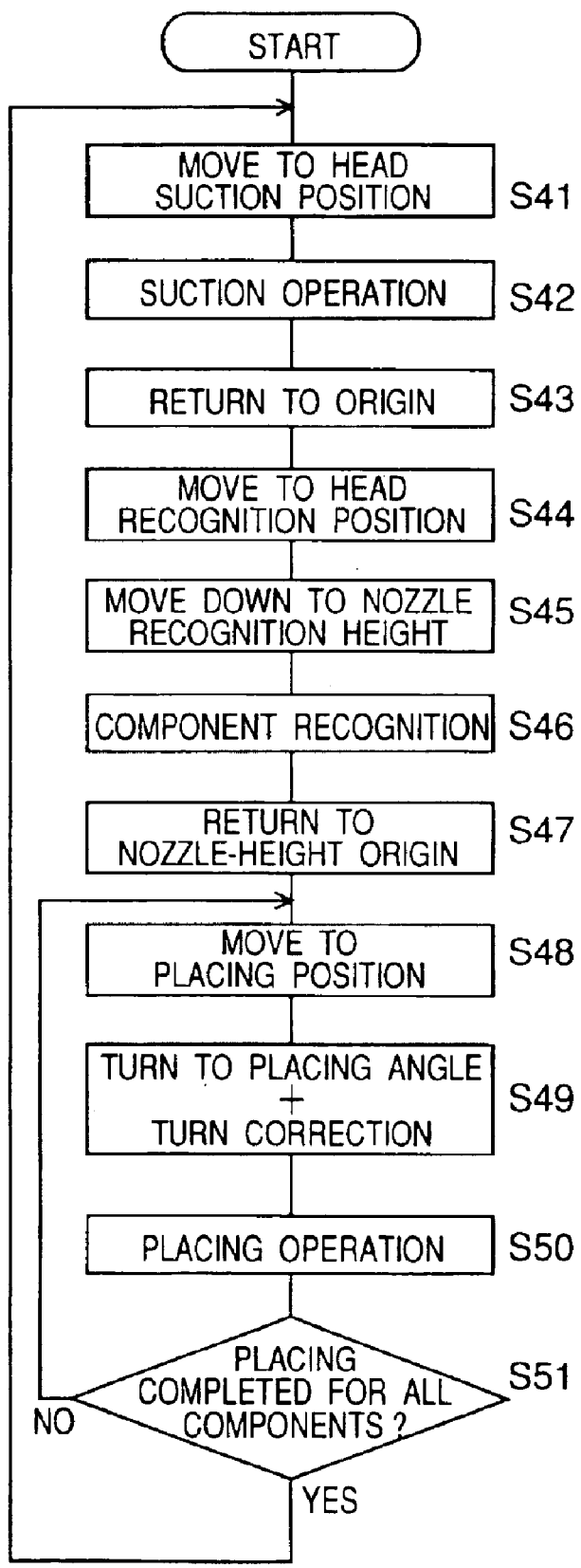
FIG. 9 is a flowchart of X- and Y-directional movements of the mounting head, up-and-down operations and turning operations of the nozzles, or other mounting operations in the component mounting apparatus of the prior art.
Figure 22:
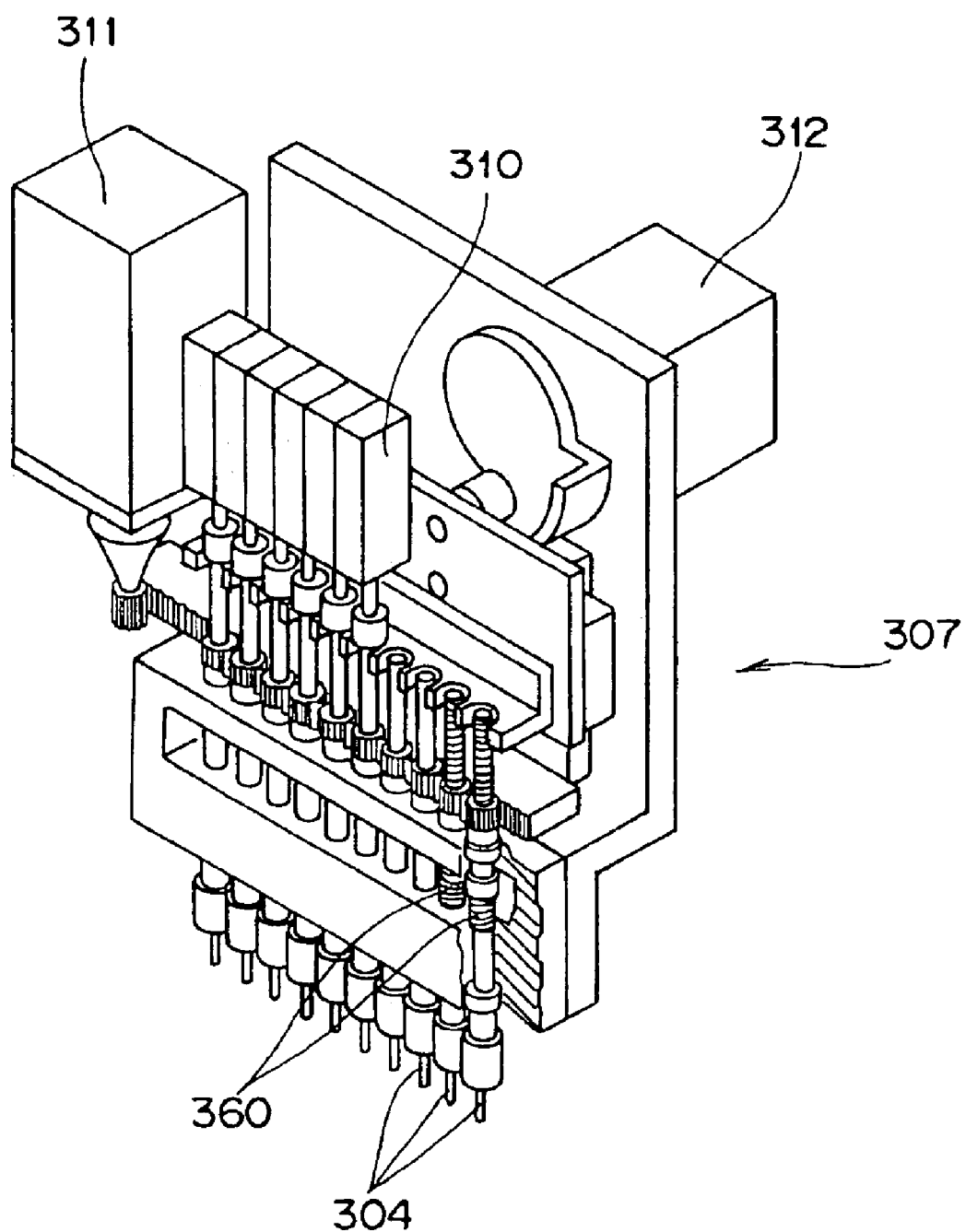
FIG. 22 is a perspective view of a prior-art mounting head.

In the prior art, as shown in FIG. 22, FIG. 8 and FIG. 9, mounting head 307 moves in an X-axis direction and/or a Y-axis direction to above specified component feed positions of ten component feed cassettes (step S41 in FIG. 9), and ten nozzles 304 are moved down simultaneously from their move-enabled height positions, which are their initial positions, to their component-suction-enabled height positions by drive of up-and-down motor 312, so that ten components located at the component feed positions of the ten component feed cassettes are sucked and held by the ten nozzles 304 (step S42 in FIG. 9). Thereafter, the ten nozzles 304 are moved simultaneously up from their component-suction-enabled height positions to their move-enabled height positions by drive of the up-and-down motor 312, i.e., returned to their heightwise origin position (step S43 in FIG. 9).

In FIG. 8, "M" denotes movement, "S" a scanning operation, "D" a moving-down operation, "U" a moving-up operation, "C" a correction operation, "R" origin, "CS" a component suction operation, "CSOFF" release of component suction, "B" a blow operation, "CP" a recognition processing operation, and "SL" selection.

Next, the mounting head 307 moves in the X-axis direction to a recognition position (step S44 in FIG. 9). After the ten nozzles 304 are moved down simultaneously from their move-enabled height positions to their component-recognition-enabled height positions by drive of the up-and-down motor 312 (step S45 in FIG. 9), the nozzles are moved linearly in one direction above a recognition camera to thereby accomplish a recognition operation of the ten components sucked and held by the ten nozzles 304 (step S46 in FIG. 9). Thereafter, by drive of the up-and-down motor 312, the ten nozzles 304 are moved simultaneously up from their component-recognition-enabled height positions to their move-enabled height positions, i.e., returned to the heightwise origin position (step S47 in FIG. 9).

Next, the mounting head 307 is moved to, for example, a component mounting position for a component held by a first nozzle 304 (step S48 in FIG. 9). Then, based on a component recognition result, the first nozzle 304 is turned about its axis from its turning-direction origin position to a position corresponding to a total of placing posture angle and correction angle by drive of turn-actuating motor 311, thereby correcting a posture angle of the held component (step S49 in FIG. 9). By drive of the up-and-down motor 312, the first nozzle 304 alone is selected by a cylinder 310 and moved down from its move-enabled height position to its component-placing-enabled height position, by which the component held by the first nozzle 304 is placed onto the board (step S50 in FIG. 9). After that, by drive of the up-and-down motor 312, the first nozzle 304 alone is moved up from its component-placing-enabled height position to its move-enabled height position. Then, by drive of the turn-actuating motor 311, the first nozzle 304 is turned about its axis to its turning-direction origin position.

Subsequently, if component placing has not yet been completed for all the components held by the mounting head 307 (step S51 in FIG. 9), the program proceeds to a next mounting operation.

For the next mounting operation, the mounting head 307 is moved to, for example, a component mounting position for a component held by a second nozzle 304 (step S48 in FIG. 9). Then, based on a component recognition result, the second nozzle 304 is turned about its axis from its turning-direction origin position to a position corresponding to a total of placing posture angle and correction angle by drive of the turn-actuating motor 311, by which a held component is corrected in posture angle (step S49 in FIG. 9). By drive of up-and-down motor 312, the second nozzle 304 alone is selected by a cylinder 310 and moved down from its move-enabled height position to its component-placing-enabled height position, by which the component held by the second nozzle 304 is mounted onto the board (step S50 in FIG. 9). After that, by drive of the up-and-down motor 312, the second nozzle 304 alone is moved up from its component-placing-enabled height position to its move-enabled height position. Then, by drive of the turn-actuating motor 311, the second nozzle 304 is turned about its axis to its turning-direction origin position.

Thereafter, similarly, placing of components held by third to tenth nozzles 304 onto the board is performed one after another (steps S48 to S51 in FIG. 9), and the mounting head 307 moves to above specified component feed positions of ten component feed cassettes for a next component suction operation in the X-axis direction and/or Y-axis direction (step S41 in FIG. 9). Then, component suction, move to recognition positions, component recognition, move to component placing positions, correction of component posture angle, and component placing operation of steps S41 to S51 of FIG. 9 are iterated.

That is, in the prior art, since one nozzle 304 alone for next placing a component is turned after component recognition and subjected to positional correction, and thereafter a placing operation onto the board is performed, it has inevitably been necessary to perform two operations for each nozzle 304 that is over the recognition position (step S46 in FIG. 9), i.e., turning-position correction (step S49 in FIG. 9) and component placing (step S50 in FIG. 9).

Figure 7:
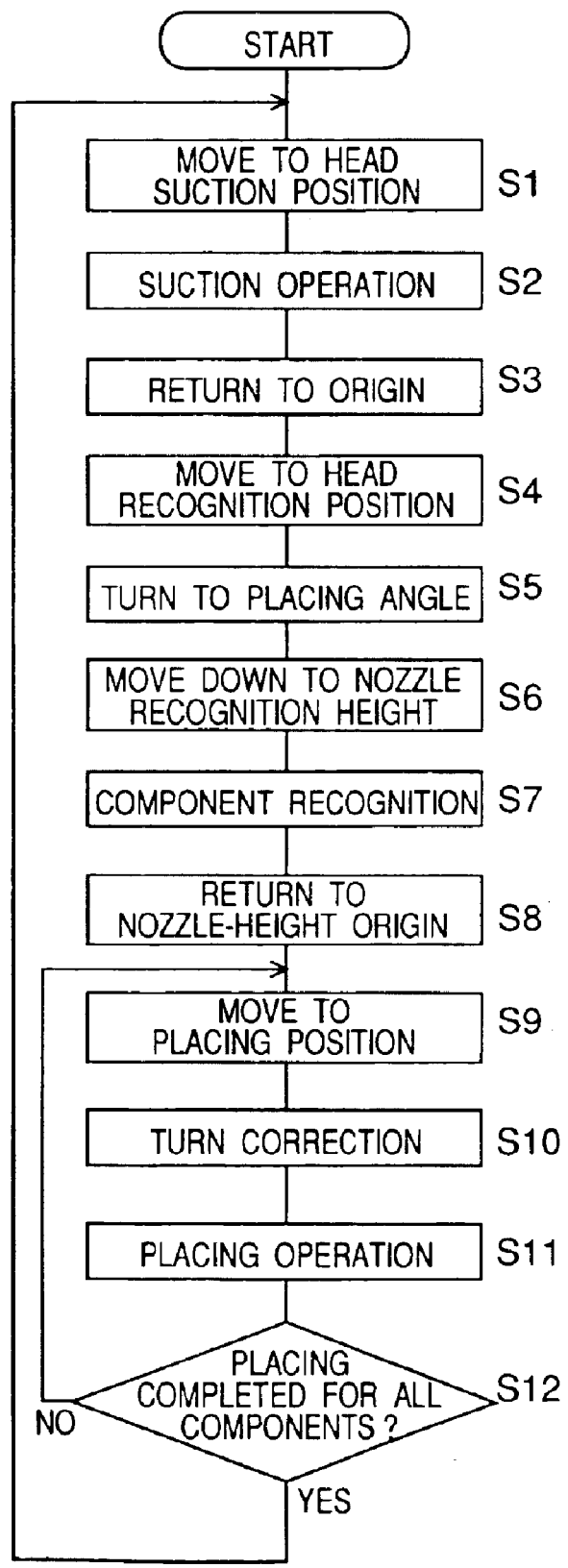
FIG. 7 is a flowchart of X- and Y-directional movements of the mounting head, up-and-down operations and turning operations of the nozzles, or other mounting operations in the component mounting apparatus of the first embodiment.
Figure 13:
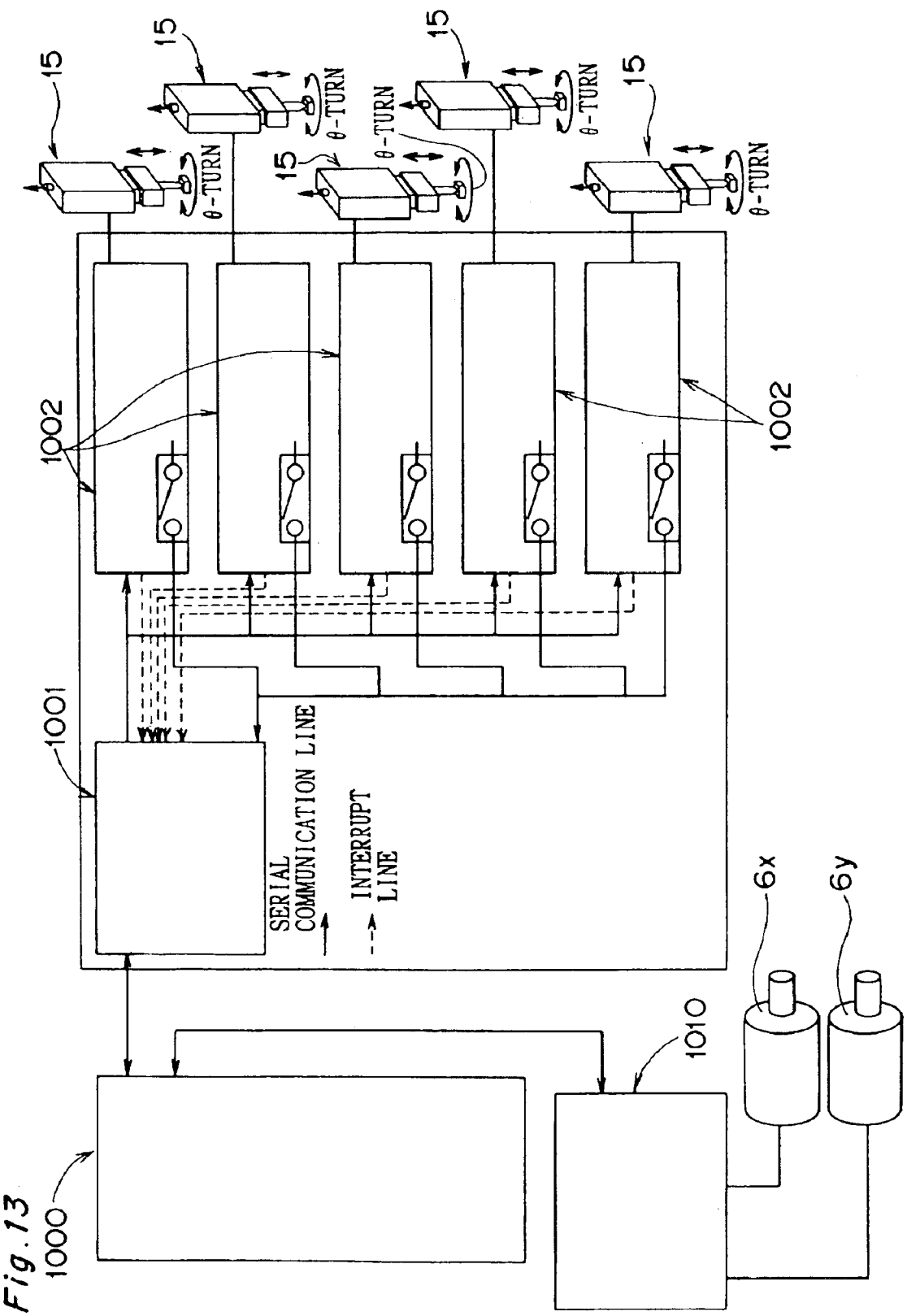
FIG. 13 is an explanatory view of the control section composed of the main controller, the head controller, servo drivers, and the like in the component mounting apparatus of the first embodiment.

In contrast to this, in the first embodiment, as shown in FIGS. 13 and 7, mounting head 4 is moved by drive of the X-Y robot motors 6y, 6x of the X-Y robots 5 in the X-axis direction and/or the Y-axis direction to above specified component feed positions 89 of ten component feed cassettes 80 (step S1 in FIG. 7), and the ten nozzles 10 are moved down by drive of the up-and-down linear motors 32 of the nozzle up-and-down devices 26 simultaneously from their move-enabled height positions, which are their initial positions, to their component-suction-enabled height positions so that ten components 20 located at the component feed positions of the ten component feed cassettes are sucked and held simultaneously by the ten nozzles 10 (step S2 in FIG. 7). Thereafter, by drive of the nozzle up-and-down devices 26, the ten nozzles 10 are moved up simultaneously from their component-suction-enabled height positions to their move-enabled height positions, i.e., returned to their heightwise origin positions (step S3 in FIG. 7).

Next, while the mounting head 4 is moved by drive of the X-Y robot 5 to a recognition position in the X-axis direction (step S4 in FIG. 7), the nozzles 10 are individually turned about their respective axes from turning-direction origin positions to their placing posture angles by drive of the nozzle turning devices 25, by which the components 20 held by those nozzles 10 are put into a placing posture (step S5 in FIG. 7).

Next, by drive of the nozzle up-and-down devices 26, the ten nozzles 10 are moved down simultaneously from their move-enabled height positions to their component-recognition-enabled height positions (step S6 in FIG. 7), and then moved linearly above recognition camera 9, by which a recognition operation of the ten components 20 sucked and held by the ten nozzles 10 is performed (step S7 in FIG. 7). Thereafter, by drive of the nozzle up-and-down devices 26, the ten nozzles 10 are moved up simultaneously from their component-recognition-enabled height positions to their move-enabled height positions, i.e., returned to their heightwise origin positions (step S8 in FIG. 7).

Next, while the mounting head 4 is moved by drive of the X-Y robot 5 to, for example, a component placing position for a component 20 held by a first nozzle 10 (step S9 in FIG. 7), the nozzles 10 are turned individually concurrently about their axes from a placing posture angle to correction positions based on a component recognition result, by which the components 20 held by the nozzles 10 are individually corrected in posture angle (step S10 in FIG. 7). Therefore, at a time when the mounting head 4 is placed at the component placing position for the component 20 held by the first nozzle 10, a posture angle correction for all the nozzles 10 has been completed. In this operation, although all the nozzles 10 may be subjected to posture angle correction, more appropriately, only nozzle(s) 10 just before performing a placing operation are subjected to such correction when a higher-precision placing is desired.

Next, by drive of its nozzle up-and-down device 26, the first nozzle 10 alone is moved down from its move-enabled height position to its component-placing-enabled height position, by which the component held by the first nozzle 10 is placed onto the board 2 (step S11 in FIG. 7). After that, by drive of this nozzle up-and-down device 26, the first nozzle 10 alone is moved up from its component-placing-enabled height position to its move-enabled height position. Then, by drive of the θ-axis motor 25m of nozzle turning device 25, the first nozzle 10 is turned about its axis to its turning-direction origin position.

Subsequently, if component placing has not been completed for all the components 20 held by the mounting head 4 (step S12 in FIG. 7), the program proceeds to a next mounting operation.

For the next mounting operation, while the mounting head 4 is moved to, for example, a component placing position for a component 20 held by a second nozzle 10 by drive of the X-Y robot 5 (step S9 in FIG. 7), the second nozzle 10 is turned concurrently about its axis from a placing posture angle to a correction position, based on a component recognition result, by drive of its nozzle turning device 25, by which the component 20 held by the second nozzle 10 is corrected in posture angle (step S10 in FIG. 7). Only the second nozzle 10 is moved down from its move-enabled height position to its component-placing-enabled height position by drive of its nozzle up-and-down device 26, by which the component 20 held by the second nozzle 10 is placed onto the board 2 (step S11 in FIG. 7). Thereafter, by drive of its nozzle up-and-down device 26, the second nozzle 10 alone is moved up from its component-placing-enabled height position to its move-enabled height position. Then, by drive of its nozzle turning device 25, the second nozzle 10 is turned about its axis to its turning-direction origin position.

Thereafter, similarly, placing of the components 20 held by the third to tenth nozzles 10 onto the board 2 is performed one after another (step S12 in FIG. 7), and the mounting head 4 moves to above specified component feed positions of the ten component feed cassettes 80 for a next component suction operation in the X-axis direction and/or Y-axis direction by drive of the X-Y robot 5 (step S1 in FIG. 7). Then, correction of component posture angle and a component placing operation are iterated simultaneously with component suction, move to recognition positions, component recognition, and move to component placing positions of steps S2 to S12 of FIG. 7.

That is, by performing the placing-posture-angle correction operation simultaneously with the move operation to the component placing position, a time for performing the placing-posture-angle correction operation alone can be eliminated, so that a mounting time can be reduced as a whole.

It is noted that also in the first embodiment, as in the prior art, each nozzle 10 once exerts a blow just after placing of component 20 onto the board 2 so as to ensure that the component 20 leaves the nozzle 10.

Figure 10:
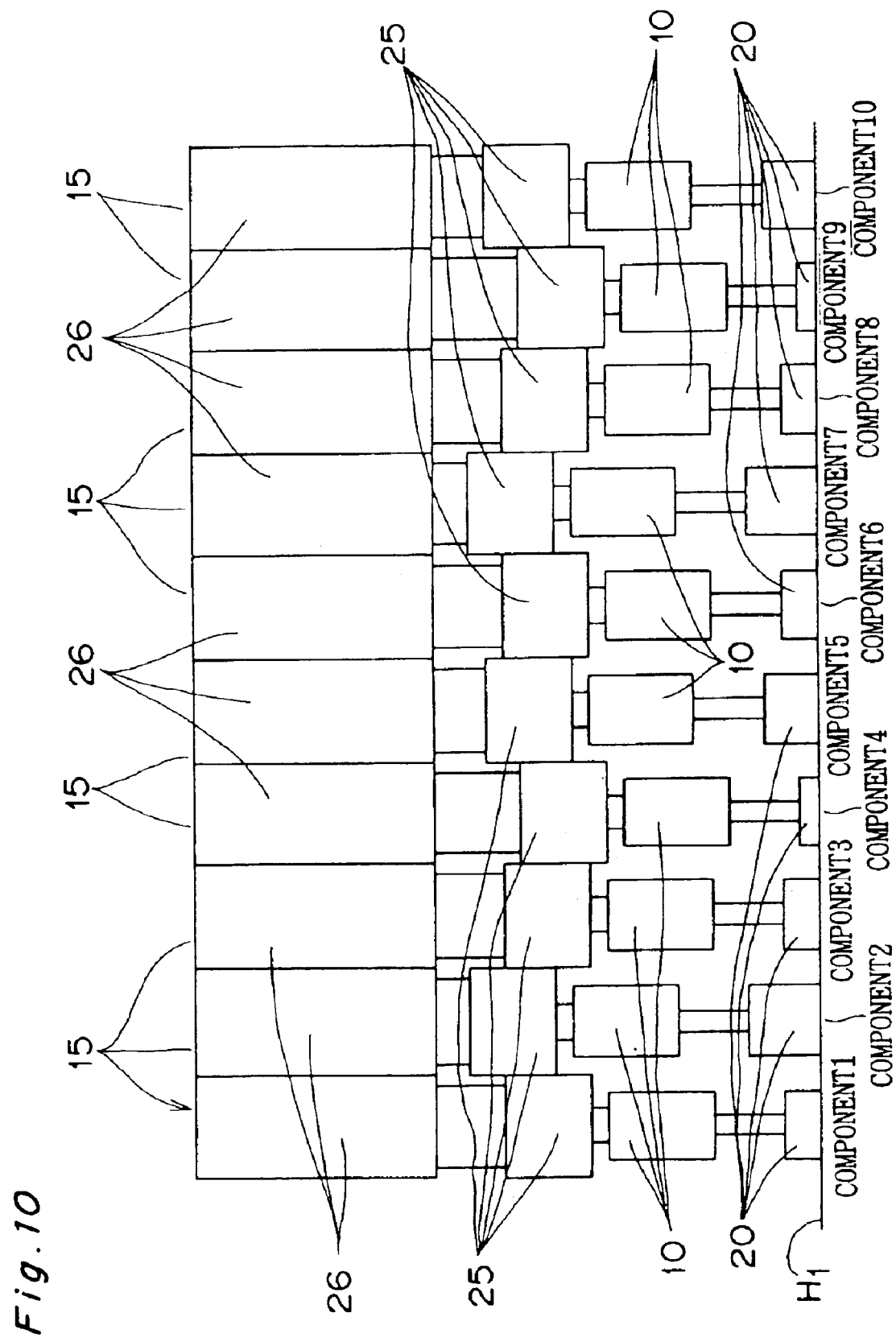
FIG. 10 is an explanatory view showing a state in which bottom faces of components sucked and held by ten nozzles are adjusted to a specified height in the component mounting apparatus of the first embodiment.
Figure 11A:
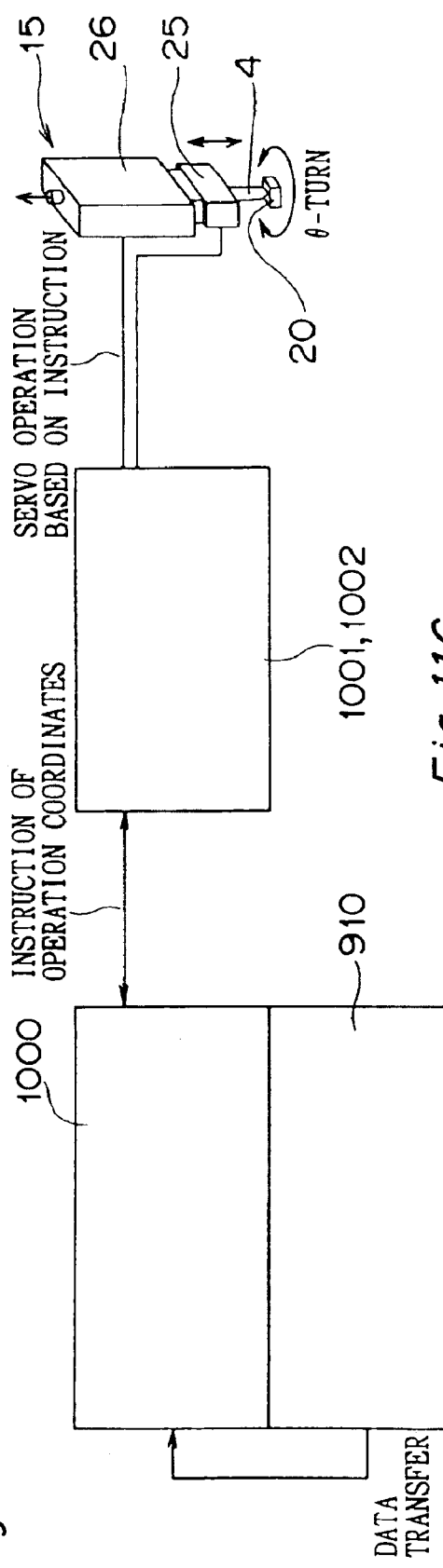
FIGS. 11A, 11B, and 11C are an explanatory views showing a relationship among the main controller, head controller, servo driver, motor, and memory, an explanatory view of information stored in a component database, and an explanatory view of component-feed-cassette arrangement data, respectively.
Figure 11C:
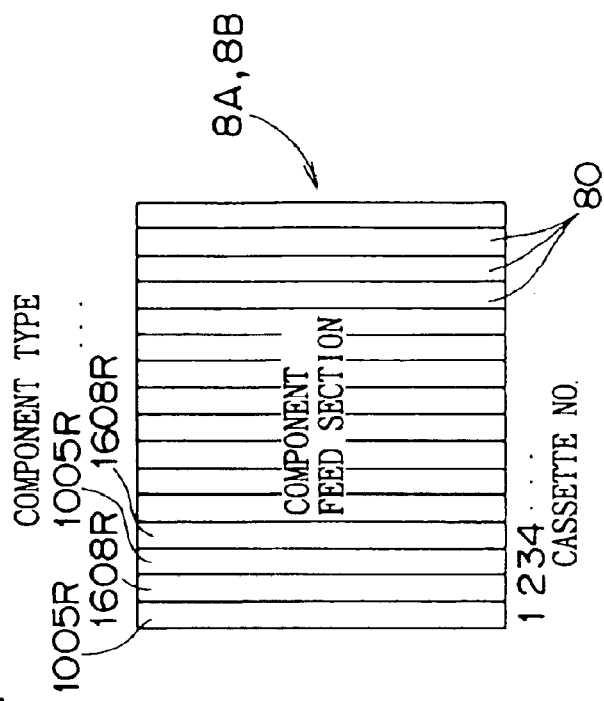
Figure 11B:
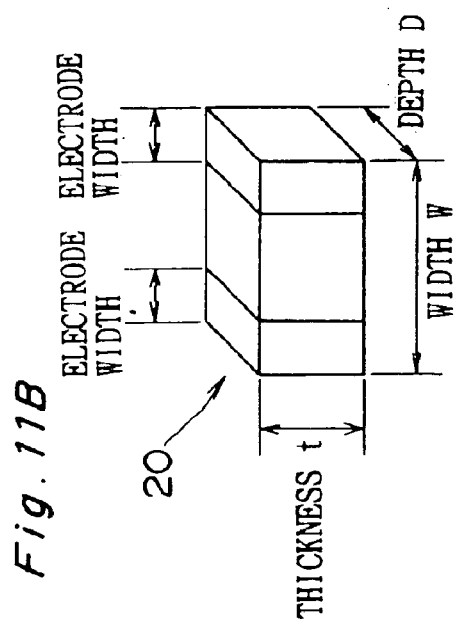
Figure 12:
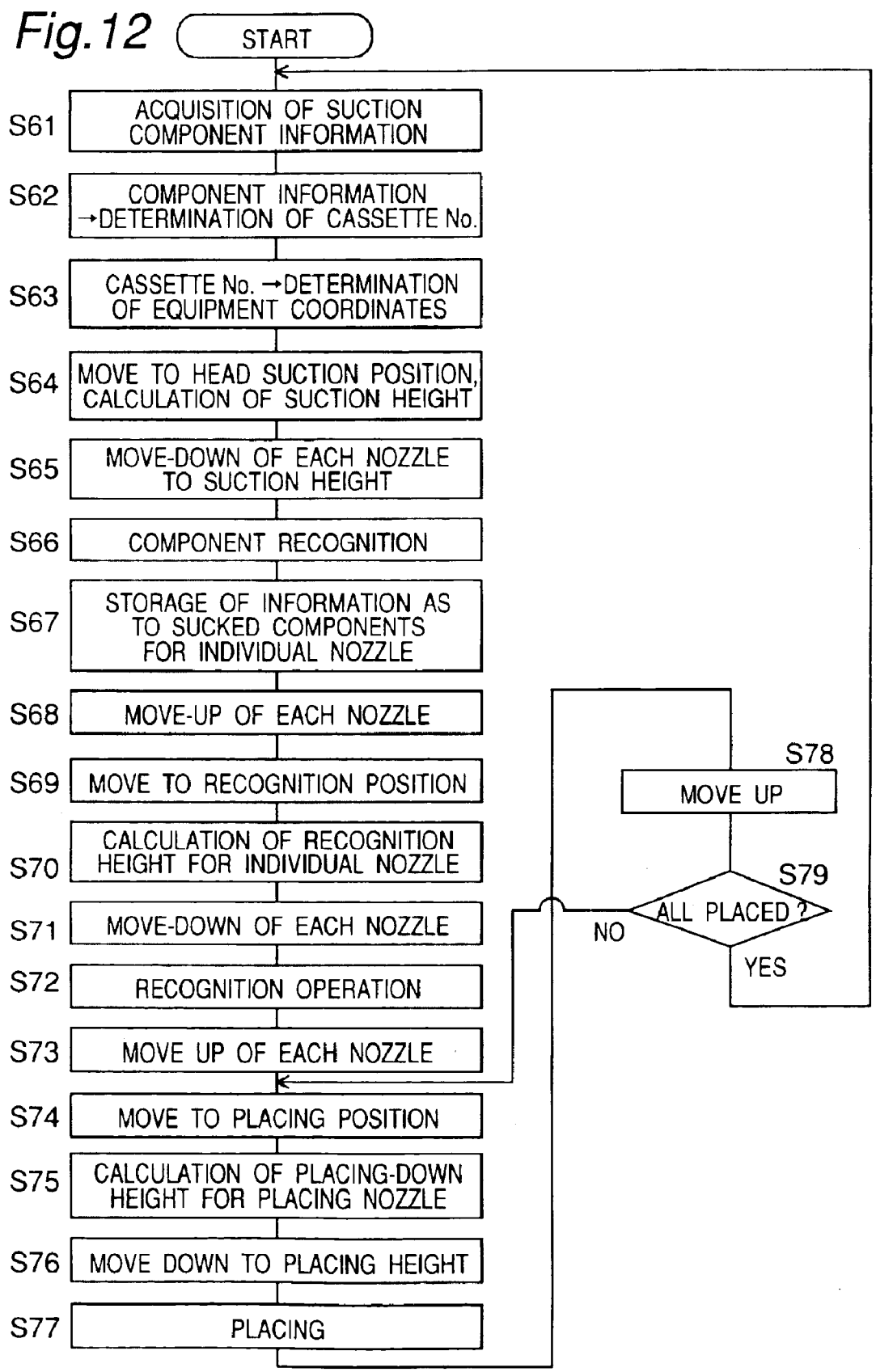
FIG. 12 is a flowchart of another example of X- and Y-directional movements of the mounting head, up-and-down operations and turning operations of the nozzles, or other mounting operations in the component mounting apparatus of the first embodiment.

It is also possible that after components 20 are sucked and held from the component feed device 8A or 8B and held by the nozzles 10 of the plurality of component suction devices 15, respectively, and before component recognition with the recognition camera 9 is started, the nozzles 10 are individually moved up and down by driving the nozzle up-and-down devices 26 under control of the main controller 1000, a head controller 1001, and servo drivers 1002 based on component-height information which has been stored in the memory 910 and which concerns the components sucked and held by the nozzles 10, so that bottom faces of the components 20 are adjusted to a constant height of H1 as shown in FIG. 10, or so that the bottom faces of the components 20 are restricted so as to fall within a constant height range, i.e., a depth of field of the recognition camera 9. More specifically, as shown in FIG. 11A, data as to operations, a component database, component-feed-cassette arrangement data, or other information are preliminarily stored in the memory 910. In the component database, as shown in FIG. 11B are stored sizes (width w, thickness t, depth D) of individual components and information concerning electrodes of the components (information as to a number of poles, electrode width and other sizes, positions, and the like). As shown in FIG. 11C, the component-feed-cassette arrangement data include serial component-feed-cassette numbers, link information with component types corresponding to the cassette numbers, link information between component types and model numbers, and the like. The term "component type" herein refers to, for example, 1005R (i.e., a resistor having a component size of 1.0 mm×0.5 mm), 1608R (i.e., a resistor having a component size of 1.6 mm×0.8 mm), and the like. Therefore, for instance, as shown in FIG. 12, the main controller 1000 first acquires suction component information for all the nozzles 10 from the memory 910 (step S61).

Next, the main controller 1000 determines cassette numbers from the suction component information by referring to link information of the memory 910 (step S62 in FIG. 7).

Next, the main controller 1000 determines cassette coordinate positions in the component mounting apparatus (equipment) from the cassette numbers by looking up to the link information of the memory 910 (step S63).

Next, the mounting head(s) 4 is moved to suction positions by driving the X-Y robot(s) 5 under control of the main controller 1000, the head controller 1001, and the servo drivers 1002, and suction heights are calculated by the main controller 1000 based on information stored in the memory 910 (e.g., information as to thicknesses of components to be sucked to the nozzles, information as to component suction positions of the cassettes and the like) (step S64).

Next, based on these calculated suction heights, the nozzle up-and-down devices 26 are driven under control of the main controller 1000, the head controller 1001, and the servo drivers 1002, by which each nozzle 10 is moved down to a corresponding calculated suction height (step S65).

Next, the valves 90 are driven under control of the main controller 1000, the head controller 1001 and the servo drivers 1002, by which a component suction operation is performed (step S66).

Next, sucked-component information for every nozzle is stored into the memory 910 by the main controller 1000 (step S67).

Next, the nozzle up-and-down devices 26 are driven under control of the main controller 1000, the head controller 1001, and the servo drivers 1002, by which each nozzle 10 is moved up to its heightwise origin position (step S68).

Next, the X-Y robot 5 is driven under control of the main controller 1000, the head controller 1001, and the servo drivers 1002, by which the mounting head(s) 4 is moved to a recognition position(s) (step S69).

Next, by the main controller 1000, a recognition height of each nozzle 10 for adjusting bottom faces of individual components 20 uniformly to a constant height H1 is calculated based on information in the memory 910 (e.g., information as to thicknesses of the components sucked by the nozzles) (step S70).

Next, based on this calculated recognition height of each nozzle 10, each nozzle up-and-down device 26 is driven under control of the main controller 1000, the head controller 1001, and the servo drivers 1002, by which each nozzle 10 is moved down from its heightwise origin position to its recognition height (step S71). During this operation, the bottom faces of the components 20 sucked and held by the nozzles 10 may be individually adjusted uniformly to the constant height H1 as shown in FIG. 10.

Next, the X-Y robot(s) 5 is driven under control of the main controller 1000, the head controller 1001, and the servo drivers 1002, by which the mounting head(s) 4 is made to pass through above the recognition camera(s) 9, allowing a recognition operation to be performed (step S72).

Next, each nozzle up-and-down device 26 is driven under control of the main controller 1000, the head controller 1001, and the servo drivers 1002, by which each nozzle 10 is moved up to its heightwise origin position (step S73).

Next, the X-Y robot 5 is driven under control of the main controller 1000, the head controller 1001, and the servo drivers 1002 so as to be moved to the mounting position (step S74).

Next, by the main controller 1000, a mounting down height is calculated based on information in the memory 910 (e.g., information as to thickness of the component to be sucked to the nozzle, information as to the board thickness, and the like) (step S75).

Next, based on this calculated mounting down height, nozzle up-and-down device 26 is driven under control of the main controller 1000, the head controller 1001, and the servo drivers 1002, by which the nozzle to perform a mounting operation is moved down to its mounting down height (step S76).

Next, this nozzle up-and-down device 26 is driven under control of the main controller 1000, the head controller 1001, and the servo drivers 1002, by which the nozzle 10 to perform the mounting operation is moved down to its mounting down height. This state is maintained for a moment, by which a component mounting operation, so as to mount a component onto the board 2, is accomplished (step S77).

Next, this nozzle up-and-down device 26 is driven under control of the main controller 1000, the head controller 1001, and the servo drivers 1002, by which the nozzle 10 that has performed the mounting operation is moved up to its heightwise origin position (step S78).

Next, it is checked by the head controller 1001 and the servo drivers 1002 whether or not a component mounting operation has been performed for all the nozzles 10 of the mounting head 4. In order that nozzles 10, that have not yet performed a mounting operation, if any, are put into operation, the program returns to step S74 (step S79). If a component mounting operation has been completed for all the nozzles 10, the program returns to step S61.

With this method as described above, since recognition surfaces, e.g., bottom surfaces of all components can be set to within the depth of field of the recognition camera 9 during a process of recognition, even those components whose thicknesses largely differ from one another can be treated collectively for a recognition operation. As a result, such disadvantages as incapability of recognition due to recognition surfaces not falling within depth of field can be eliminated without fail.

Now, communications between the main controller 1000 of a component-mounting-apparatus main body and each mounting head 4, and control operations between the main controller 1000 and each servo driver 1002 for controlling the head controller 1001, each θ-axis motor 25*m*, and each up-and-down linear motor 32 in each mounting head 4, as well as a constitution therefor, are described below.

In this first embodiment, with a view to reducing any increase in cable connections between the component-mounting-apparatus main body and the mounting heads 4 due to any increase of a number of actuators, as well as to implementing modularization of the mounting heads 4, this apparatus adopts a method in which a drive control section for individually controlling up-and-down and turning operations of the nozzles of a mounting head, which have been conventionally controlled by an NC board 901 mounted on a control unit of the component-mounting-apparatus main body, is implemented by the head controller 1001 and the servo drivers 1002, which are integrated into one unit and mounted on a mounting head 4 side, wherein communications between the head controller 1001 and the main controller 1000 are performed in a serial manner. In order to implement such a system, there is a need for reducing an amount of communications between the main controller 1000 and the head controller 1001 and, therefore, a command system by asynchronous communications is adopted. Also, communications between the head controller 1001 and each servo driver 1002 are performed by transmission in synchronous communications, while one-to-multi broadcasting is enabled from the head controller 1001 individually to the servo drivers 1002. Further, communications from the servo drivers 1002 to the head controller 1001 are individually performed in a one-to-one system in which a communication path is switched in time division with interrupt notifications given. By implementing communications in such a full duplex communication system, issues with an increase in communication traffic due to an increase in a number of actuators, i.e., a multiplication of axes can be solved.

The above-described system is explained below in detail for a case of controlling θ-axis motor 25*m*, which is a servomotor for nozzle turning device 25 of a component suction device 15, and up-and-down linear motor 32 for nozzle up-and-down device 26 in the component mounting apparatus.

Figure 14:
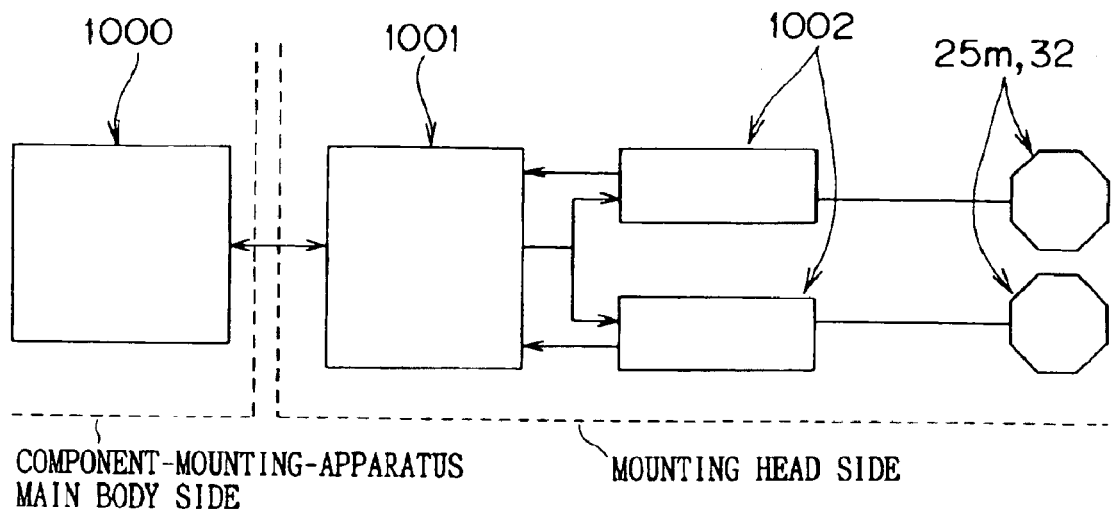
FIG. 14 is a schematic explanatory view of the control section composed of the main controller, the head controller, the servo drivers, and the like in the component mounting apparatus of the first embodiment.
Figure 16:
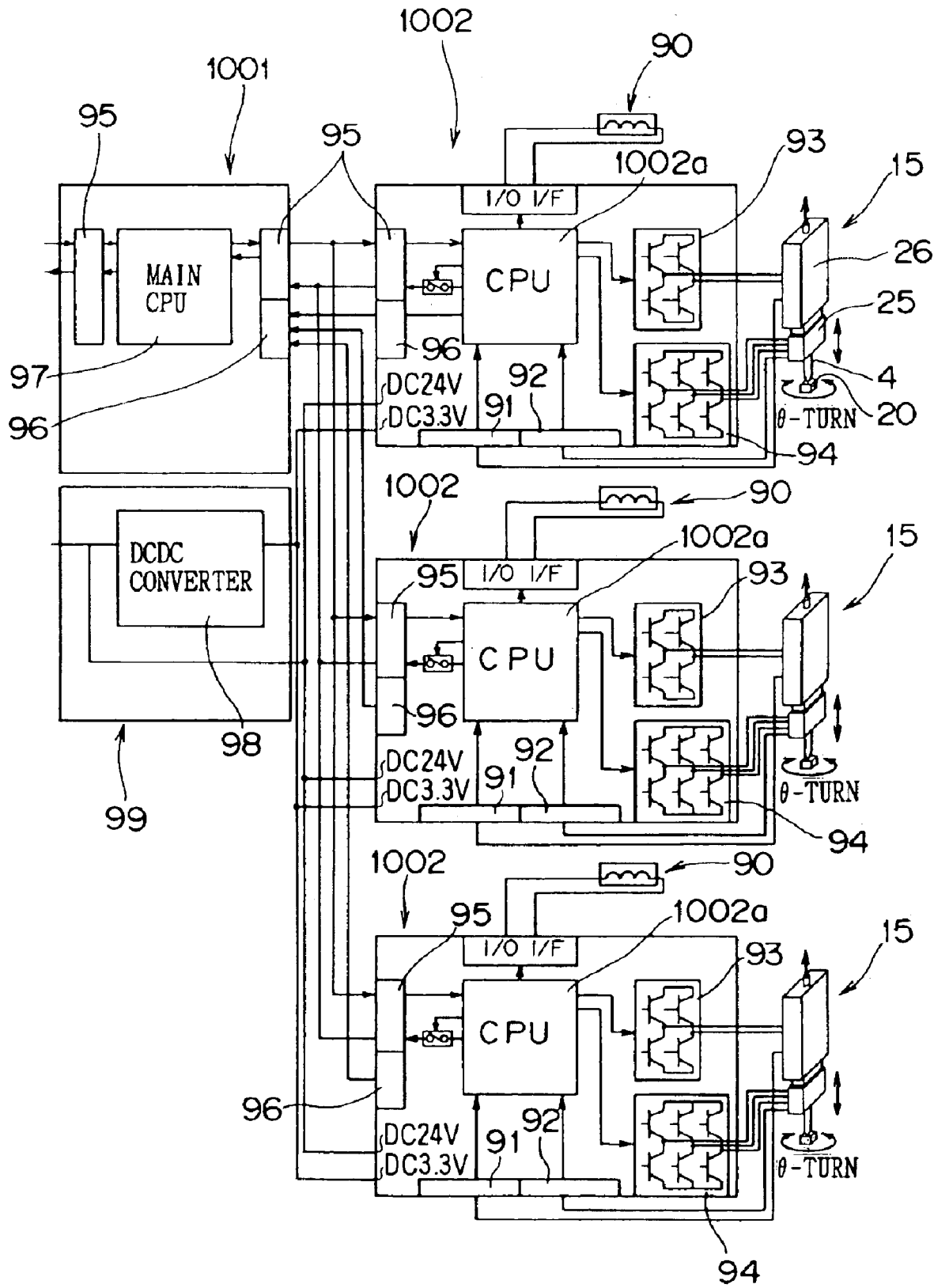
FIG. 16 is a detailed explanatory view of the control section composed of the head controller, servo drivers, and the like in the component mounting apparatus of the first embodiment.

As shown in FIGS. 13, 14 and 16, the main controller 1000, i.e. controller for controlling machine (MMC), is mounted on the component-mounting-apparatus main body, while the head controller 1001 and the servo drivers 1002, as well as members or devices to be driven and controlled, such as the θ-axis motors 25*m* or the up-and-down linear motors 32, are mounted on the mounting heads 4.

The main controller 1000 has a function of setting operating characteristics, for example, it sets travel distance, acceleration, maximum speed, and speed command waveform pattern of the members or devices to be driven and controlled.

The main controller 1000 and the head controller 1001 are connected to each other in such a serial connection as to be both switchable between a transmission side and a reception side, as required, where one-to-one communications are performed asynchronously.

In order to reduce communication traffic in this case, first, it is arranged that not only communications by individually specifying axes of nozzles 10 but also broadcasting for all the axes to the nozzles 10 are possible. Also, in order that values of operating speed and acceleration for each nozzle 10 can be selected from, for example, eight kinds of specified values, respectively, it is designed that, for example, eight kinds of specified values of speed and acceleration for the nozzles 10 are preliminarily transmitted to the head controller 1001 so as to be stored as a table in a memory 1005 connected to the head controller 1001. As a result of this, only transmitting, for example, one specified value selected out of the eight kinds, allows each nozzle 10 to operate at a desired speed or acceleration. It is further arranged that with provisions of commands for instructing a suction operation to be performed by the nozzles 10 as well as commands for instructing a placing operation to be performed by the nozzles 10, a sequence of suction and placing operation can be performed only by transmitting a travel amount and a bottom dead-point time for each operation. More specifically, for example, with information as to a suction operation to be performed by the nozzles 10 and a placing operation to be performed by the nozzles 10 preliminarily stored in the memory 1005 connected to the head controller 1001, when a suction-operation instruction command or a placing-operation instruction command is transmitted from the main controller 1000 to the head controller 1001, information as to a relevant operation is read from the memory 1005, and based on information as to a travel amount and dead-point time, the servo driver 1002 is made to perform a relevant operation. Therefore, in a case where component suction is performed by, for example, ten nozzles 10, it is only required to transmit a command for instructing a suction operation to be performed by the nozzles 10 to all ten nozzles 10, as well as a signal containing a down amount and a dead-point time for suction to be performed by each nozzle 10, and specified values of operating speed and acceleration for up-and-down move of each nozzle 10, from the main controller 1000 to the head controller 1001. Also, in a case where component placement is performed by, for example, the first nozzle 10-1 out of the ten nozzles 10, it is only required to transmit a command for instructing a placing operation to be performed by the first suction nozzle 10-1 to the first suction nozzle 10-1, as well as a signal containing a down amount and a dead-point time for the placing operation to be performed by the first suction nozzle 10-1, and specified values of operating speed and acceleration for up-and-down movement of the first suction nozzle 10-1, from the main controller 1000 to the head controller 1001.

The head controller 1001 has a function of conversion into instructions in unit time, where, for example, a travel amount for the unit time of synchronous communications is calculated based on set values from upper-order main controller 1000, and then transmitted to the servo drivers 1002.

The head controller 1001 and the servo drivers 1002 are connected to each other in a serial manner, so that one-to-multi communications are performed in synchronous communications.

With a full duplex communication system used for improvement in communication responsivity of communications in this case, it is enabled to simultaneously perform communication from the head controller 1001 to each servo driver 1002 and communication from each servo driver 1002 to the head controller 1001. Further, the communication from the head controller 1001 to each servo driver 1002 is a one-to-multi communication in which communications from the head controller 1001 are simultaneously transmitted to all the servo drivers 1002. That is, the same data, commands, or the like are transmitted to all the servo drivers 1002. Therefore, all the servo drivers 1002 have addresses different from one another, and only those correspondent in the addresses and an order of sent data, commands, or the like are individually taken into the servo drivers 1002. This allows a communication time to remain almost unchanged even if a number of the servo drivers 1002 is increased. In contrast to this, in the prior art, since data or instruction information is transmitted to servo drivers 1002 in time division, there has been an issue in that increases in a number of servo drivers 1002 would cause communication time to be prolonged proportionally. Such an issue is solved by a concurrent broadcasting of information and a check and selection according to addresses. Further, for communications from the servo drivers 1002 to the head controller 1001, a synchronization cycle is equally divided into five, and data or the like is transmitted during individual divided cycles sequentially from address 1.

Since communication responsivity can be improved with the above-described constitution, communication time remains almost unchanged even if a number of the servo drivers 1002 is increased. In contrast to this, in the prior art, since data or instruction information is transmitted to individual servo drivers 1002 in time division, there has been an issue in that increases in a number of servo drivers 1002 would cause communication time to be prolonged proportionally. Such an issue is solved by concurrent broadcasting of information and a check and selection according to addresses.

Each of the servo drivers 1002 has a function of controlling position of a corresponding servomotor ($\theta$-axis motor 25$m$) or a corresponding up-and-down linear motor 32. For example, servo driver 1002 calculates a difference between a given command and a feedback amount derived from an encoder of the servomotor or an up-and-down amount detection sensor of the up-and-down linear motor 32, and controls torque of the servomotor or an up-and-down amount of the up-and-down linear motor 32 to obtain coincidence with a targeted position.

The servo drivers 1002 and the members or devices to be driven and controlled such as the $\theta$-axis motors 25$m$ or the up-and-down linear motors 32 are connected to each other with various types of electrical wires.

As shown above, in the first embodiment, the main controller 1000 is mounted on the component-mounting-apparatus main body, while the head controller 1001, the servo drivers 1002, and the members or devices to be driven and controlled, such as the $\theta$-axis motors 25$m$ or the up-and-down linear motors 32, are mounted on the mounting heads 4.

Figure 15:
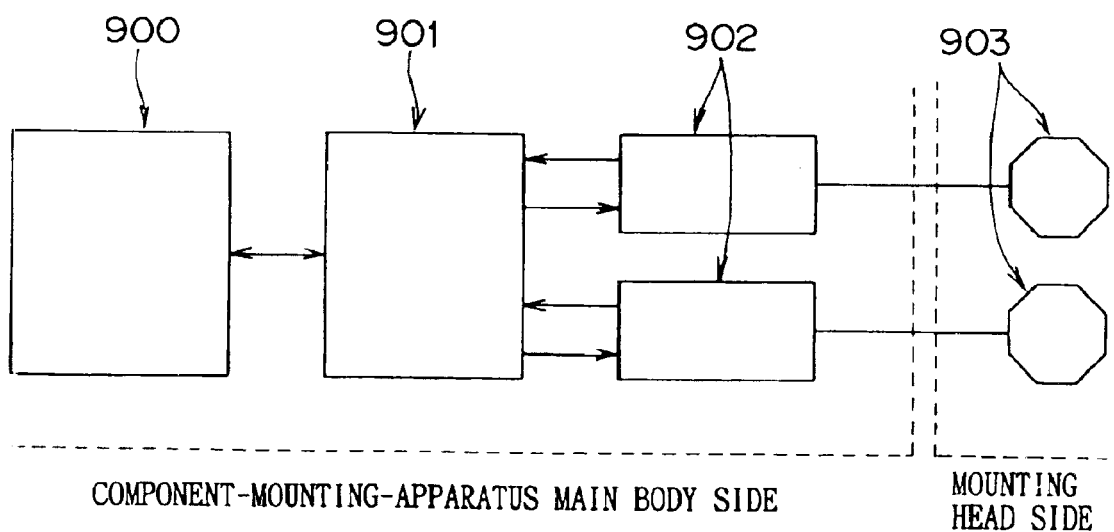
FIG. 15 is a schematic explanatory view of a control section composed of a main controller, an NC board, servo drivers, and the like in the component mounting apparatus of the prior art.

In contrast to this, in the prior art, as shown in FIG. 15, a main controller 900, an NC board 901, and servo drivers 902 for individual servomotors 903 are mounted on the control unit of the component-mounting-apparatus main body, while the servomotors 903 only are mounted on mounting head 307 of FIG. 22. The main controller 900 has a function of setting operating characteristics, and, for example, sets travel distance, acceleration, maximum speed, and speed command waveform pattern of members or devices to be driven and controlled. The main controller 900 and the NC board 901 are connected to each other in a bus connection, where one-to-one communications are performed asynchronously. The NC board 901 has a function of conversion into instructions in unit time, where, for example, a travel amount for the unit time of synchronous communications is calculated based on set values from upper-order main controller 900, and then transmitted to the servo drivers 902. The NC board 901 and the servo drivers 902 are connected to each other in a serial manner, so that one-to-multi communications are performed in synchronous communications. Each of the servo drivers 902 has a function of controlling position of a corresponding servomotor 903 (turn-actuating motor 311 or up-and-down motor 312 in FIG. 22). For example, each servo driver 902 calculates a difference between a given command and a feedback amount derived from an encoder of a corresponding servomotor 903, and controls torque of this servomotor 903 to obtain coincidence with a targeted position. With such a prior-art constitution, implementing up-and-down operations and turn-correcting operations of individual nozzles 10 independently of one another as in the first embodiment, would involve mounting a nozzle turning device 25 and a nozzle up-and-down device 26 on each nozzle 10. This would result in an increase in a number of actuators, for example, compared with the constitution of the prior-art mounting head 307 of FIG. 22, which in turn would result in an increase in a number of servo drivers 902 that control the actuators. In the prior art, the servo drivers 902 would be mounted on the fixed side, i.e., on the component-mounting-apparatus main body, while the actuators (servomotors 903) only would be mounted on the mounting head 307. With a similar constitution, in the prior art, wiring lines for connecting the servo drivers 902 and the actuators, for ten nozzles as an example, would result in a total of two wiring lines in conjunction with the servo drivers 902 since two actuators consisting of one up-and-down motor 312 and one turn-actuating motor 311 are involved, or in a total of three wiring lines in conjunction with the servo drivers 902 since three actuators consisting of one up-and-down motor 312 and two turn-actuating motors (a turn-actuating motor for odd-numbered nozzles and a turn-actuating motor for even-numbered nozzles) are involved. In contrast to this, since a total of twenty actuators consisting of ten turn-actuating motors and ten up-and-down motors for ten nozzles are involved, a total of twenty wiring lines in conjunction with the servo drivers 902 result. This is seven to ten times as large as the number of wiring lines of the prior art, making it impractical to perform wiring. Also, the servo drivers would increase in number seven to ten times, causing their installation area to increase, thereby making it difficult to accommodate those servo drivers into the component mounting apparatus. To solve these and other issues, the first embodiment is so arranged that the servo drivers 1002 are downsized, reduced in weight, and mounted on the mounting heads 4.

More specifically, first, two actuators are controlled by one servo driver 1002. In more detail, in order to control two motors of the θ-axis motor 25m and the up-and-down linear motor 32 with one servo driver 1002, a high-speed CPU 1002a is mounted as a controller dedicated to the servo driver 1002 so that servo operations for two-axis actuators can be performed with one CPU 1002a, and that a mounting area of a controller board for providing the servo driver 1002 can be reduced to enable downsizing of the servo driver 1002. Further, on the head controller 1001 side, a head controller 1001 specialized in a function of head control is mounted on mounting head 4 in order to implement one-to-one communications between the main controller 1000 and the head controller 1001 in this first embodiment, other than one-to-multi communications between the NC board 901 and the servo drivers 902 in the prior art. Further, the main controller 1000 and the head controller 1001 are connected in serial communication, thereby allowing a power supply cable and communication cable to each be one in number. In addition, it is devised to implement multi-axis control in serial communication by establishing a communication protocol, i.e., by implementing a protocol for reducing communication traffic.

Now, as an example of a signal to be transmitted from the main controller 1000 to the head controller 1001, here is discussed a case where the mounting head 4 moves up and down only selected nozzles 10, out of the ten nozzles 10, in component feed position(s) to perform component suction. While the mounting head 4 is moving toward the component feed position(s), signal(s) containing drive-amount information for servo driver(s) 1002, to be selected out of the servo drivers 1002 that control the θ-axis motors 25m of ten nozzle turning devices 25 and the up-and-down linear motors 32 of ten nozzle up-and-down devices 26 for the ten nozzles 10, are transmitted from the main controller 1000 to the head controller 1001.

The drive-amount information, as an example, contains address information of these selected servo driver(s) 1002 that should receive drive-amount information, travel or up-and-down distance design information corresponding to down amount(s) predetermined at a design stage of the nozzle(s) driven by servo driver(s) 1002 at the address(es), travel or up-and-down distance correction information which is correction information for determining an actual preferable down amount(s) for the nozzle(s) 10 from the travel or up-and-down distance design information, and check information for checking that the signal of drive-amount information has been correctly received. Therefore, the head controller 1001, which has received the drive-amount information signal from the main controller 1000, first checks that the drive-amount information signal has been correctly received, and then transmits a check result, as a check result signal, to the main controller 1000. If the signal containing drive-amount information has not been received correctly by the head controller 1001, the main controller 1000 transmits the signal containing drive-amount information once again to the head controller 1001, waiting for a check result signal from the head controller 1001. If the signal containing drive-amount information has been received correctly by the head controller 1001, the head controller 1001 calculates actual travel or up-and-down distance information from the travel or up-and-down distance design information and the travel or up-and-down distance correction information, and causes this information to be temporarily stored in the memory 1005 as required.

On the other hand, after the main controller 1000 has received an arrival signal indicating that the mounting head 4 has arrived at the component feed position, a signal containing an operation start signal is transmitted from the main controller 1000 to the head controller 1001. Operation start information, as an example, contains address information of the servo driver(s) 1002 to be started operating, and down-move start signal(s) of the nozzle(s) to be driven by the servo driver(s) 1002 at the address(es).

Once the signal containing an operation start signal has been received by the head controller 1001 as shown above, the head controller 1001 simultaneously transmits to all the servo drivers 1002 a motor-dedicated drive-amount signal containing actual travel or up-and-down distance information calculated for all the servo drivers 1002 and address information of the servo driver(s) 1002 that should receive drive-amount information. By transmission from the head controller 1001, only the servo driver(s) 1002 having the address(es) that should receive the drive-amount information receive actual travel or up-and-down distance information, and immediately drives and controls the up-and-down linear motor(s) 32 based on this actual travel or up-and-down distance information to lower the nozzle(s) 10 to make the nozzle(s) 10 perform a component suction-and-holding operation.

In addition, in a case where the ten nozzles 10 are lowered simultaneously to perform a suction operation, respective pieces of drive-amount information and a simultaneous operation start signal for each of all the servo drivers 1002 are transmitted from the main controller 1000 to the head controller 1001, and signals containing actual travel or up-and-down distance information for each of the servo drivers 1002 are transmitted simultaneously from the head controller 1001 to all the servo drivers 1002 by which the servo drivers 1002 are individually controlled so that the nozzles 10 are simultaneously lowered.

For operations (e.g., a recognition operation, placing operation or the like) other than the above-described suction operation, similarly, before members or devices which are to operate during the operations come to their operating positions, drive-amount information, as to the servo drivers 1002 that should drive and control the members or devices to operate, is transmitted from the main controller 1000 to the head controller 1001, and the head controller 1001 calculates actual travel or up-and-down distance information, wherein an operation start signal is delayed. When the members or devices to operate are located at their operating positions or have approached the operating positions, the operation start signal is transmitted from the main controller 1000 to the head controller 1001, and the head controller 1001 transmits address(es) of the servo driver(s) 1002 to be driven and controlled as well as the actual travel or up-and-down distance information to all the servo drivers 1002, by which the servo driver(s) 1002 that should perform drive control are put into operation.

Thus, by dividing a signal for communications into a signal containing drive-amount information and a signal containing operation start information, and by transmitting or receiving signals at proper timings, respectively, an amount of signal transmission can be reduced to approximately one third, compared with cases in which two signals are simultaneously transmitted.

Meanwhile, information to be transmitted in communications from the head controller 1001 to the main controller 1000 includes address information of individual servo drivers 1002, current-position information as to current positions of members or devices driven and controlled by the servo drivers 1002, and state information of the members or devices (e.g., valve on/off information, error information as to halts due to overloads or the like, electric current information, and the like), in addition to the above-described check result signal.

In addition, referring to FIG. 16, reference numeral 1002a denotes a CPU dedicated for servo drivers, 90 denotes a valve that starts/stops a suction or discharge (blow) operation of nozzle 10 which is driven and controlled by servo-driver dedicated CPU 1002a, 91 denotes an interface of signals derived from a position detector of up-and-down linear motor 32 and which are inputted to the servo-driver dedicated CPU 1002a, and 92 denotes an interface of signals derived from an encoder of θ-axis motor 25m and which are inputted to the servo-driver dedicated CPU 1002a. Numeral 93 denotes an amplifier for amplifying a drive-control current from the servo-driver dedicated CPU 1002a to the up-and-down linear motor 32, 94 denotes an amplifier for amplifying a drive-control current from the servo-driver dedicated CPU 1002a to the θ-axis motor 25m, 95 denotes a serial interface, 96 denotes an interrupt interface, 97 denotes a CPU of the head controller 1001, 99 denotes a power supply section, and 98 denotes a DC converter of the power supply section 99.

According to the first embodiment, a nozzle 10 that has sucked a component 20 can be turned to a desired angle at any arbitrary time by a corresponding nozzle turning device 25, and moreover, the nozzle 10 can be moved up and down to a desired height at any arbitrary time by a corresponding nozzle up-and-down device 26. Therefore, in each mounting head 4 equipped with a plurality of component suction devices 15, all the nozzles 10 can be turned to their respective desired angles at the same time by driving and controlling all the nozzle turning devices 25 at the same time. Accordingly, after component suction and before its recognition, components 20 can be turned, while on their respective nozzles 10, to their placing posture angles by individual drive of the nozzle turning devices 25, especially even during movement from a component suction position to a component recognition position. As a result of this, a need for largely turning the nozzles to their placing posture angles just before placing a component is eliminated, so that turning operation time can be reduced, and so that mounting cycle time as a whole can be reduced.

Also, before placing components 20, the nozzles 10 can be turned to their respective correction angles simultaneously by individual drive of the nozzle turning devices 25, so that a need for turning the nozzles individually to their correction angles just before placing the components is eliminated, and so that mounting cycle time can be reduced.

Also, since the nozzle turning devices 25 and the nozzle up-and-down devices 26 can be driven and controlled individually and independently, it is possible that during a component suction operation or a component placing operation performed by one nozzle 10 that has, for example, moved down, the other nozzles 10 perform a turning operation of sucked and held components. It is therefore possible to concurrently perform different operations by a plurality of nozzles 10, so that mounting cycle time can be shortened.

With the nozzle up-and-down device 26 arranged below the nozzle turning device 25, turning drive of the nozzle turning device 25 would cause the nozzle up-and-down device 26 to turn along with a corresponding nozzle 10, in which case wiring lines for the nozzle up-and-down device 26 and the like would be complicated in structure. However, in the first embodiment, since the nozzle up-and-down device 26 is located above the nozzle turning device 25, turning drive of the nozzle turning device 25 does not cause the nozzle up-and-down device 26 to turn along with the nozzle 10, in which case such a disadvantage as described above does not occur.

In more detail, superior working effects as shown below can be produced, in comparison with issues of the prior art.

First, the mounting head 307 as shown in FIG. 22 has had the following issues so far.

① Load factor for the motor 312 or 311 is high; because a plurality of nozzles 304 are operated by one motor 312 or 311, operation frequency of the motor 312 or 311 is high and a high-power motor is necessitated.

② Improvement in throughput is difficult; improving an operating speed and acceleration of the nozzles 304 to thereby improve a mounting cycle time (throughput) in view of issue ① would involve increase in motor size (increase in power), which in turn would cause the mounting head 307 to increase in dimensions and mass, with results of increased loads on other driver devices such as an X-Y robot that operates the mounting head 307, as well as an impossibility of providing a multi-head structure.

③ Placing precision is poor; that is, this precision becomes poor when large correction angle operations are required depending on orientation of components (e.g., when a placing posture angle is rotated, for example, 90° or 180° with respect to posture of components at a component feed position). For example, a placing operation of the prior art includes firstly performing component suction, then moving to a recognition position where component recognition is performed, then moving to a placing position where a turning operation to the placing posture angle and a turn correction operation based on a component recognition result are performed, and finally the placing operation is performed. For such operation, the turning operation to the placing posture angle (e.g., 90° or 180°) can be performed only after the component recognition is performed. A reason for this is that because multiple nozzles 304 are operated with one turn-actuating motor 311, adding a turning operation of 180°, 0°, 90° or the like before component recognition would cause throughput to decrease. In addition, when effects of eccentricity, distortion (see FIG. 17B), thermal deformation, and the like of the nozzles 304 are involved, there is another issue in that a large turning angle of the nozzles 304 would result in proportionally large errors.

Figure 17A:
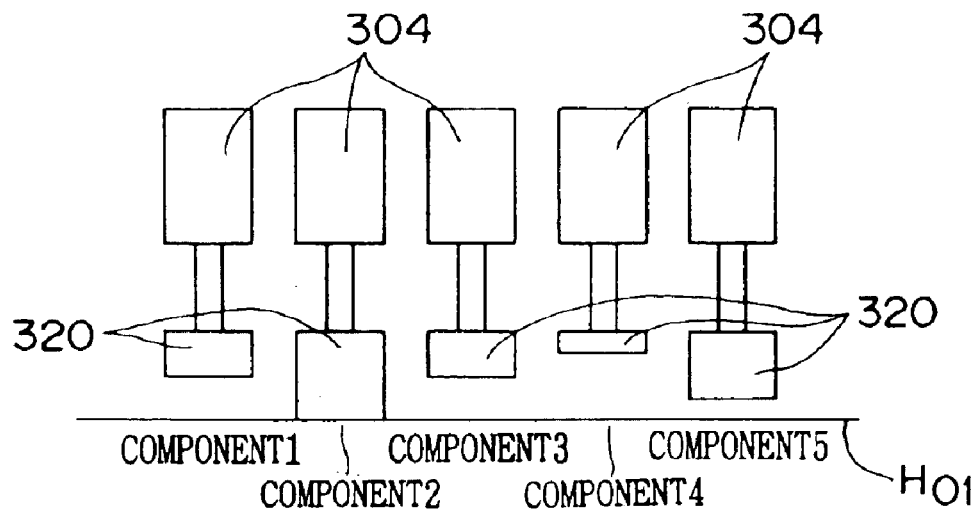
FIGS. 17A and 17B are an explanatory view showing a state that adjustment to a recognition height H01 cannot be achieved at component recognition by a mounting head, and an explanatory view showing a distortion occurring due to thermal changes of nozzles or the like in representation of solid-line nozzle and dotted-line nozzle, respectively, in the component mounting apparatus of the prior art.

④ Batch suction of components different in component thickness is difficult to perform; that is, because multiple nozzles 304 are moved up and down with the same up-and-down motor 312, it is impossible to adjust a suction height for individual nozzles 304 as shown in FIG. 17A. Therefore, as shown in FIGS. 22 and 18, the nozzles 304 are adjusted in position by contracting springs 360, which are individually provided for the nozzles 304, to an extent corresponding to thickness differences of components 320 to thereby absorb the thickness differences of components 320. However, a force exerted onto the components 320 by the springs 360 has limitations so as not to meet large differences in component thickness. Further, control responsive to component thicknesses (load control) is impossible, and adjustment to a recognition height H01 is unachievable during component recognition as shown in FIG. 17A.

⑤ For example, with a large turning angle such as 90° and 180°, when a turning operation is performed after component recognition, throughput would decrease as a whole for a mounting operation.

Such various issues of the prior art as described above can all be solved by the first embodiment as follows.

That is, since each suction nozzle 10 is equipped with actuators capable of performing an up-and-down operation and a turning operation, i.e., a nozzle up-and-down device 26 and a nozzle turning device 25, respectively, a load on one actuator can be reduced, so that the mounting head 4 having such actuators mounted thereon can improve operating acceleration without increasing a size of the motor. As a result of this, improvement in throughput can be accomplished so that the prior-art issues of ① and ② can be solved.

Also, since the nozzles 10 can be subjected to turning operations about θ-axes at any arbitrary time, independently of one another, by their respective nozzle turning devices 25, it is possible that with placing posture angles of components being largely different from a component posture angle at a component feed position by 90°, 180° or the like, components can preliminarily be turned to their placing posture angles by driving the nozzle turning devices 25 after component sucking and holding is performed by the nozzles 10, and before component recognition is performed. As a result of this, all the components are located at their placing posture angles before component recognition, thus reducing a turning amount for correction subsequent to the component recognition so that adjustment to the placing posture angles can be accomplished with proportionally higher precision.

Figure 17B:
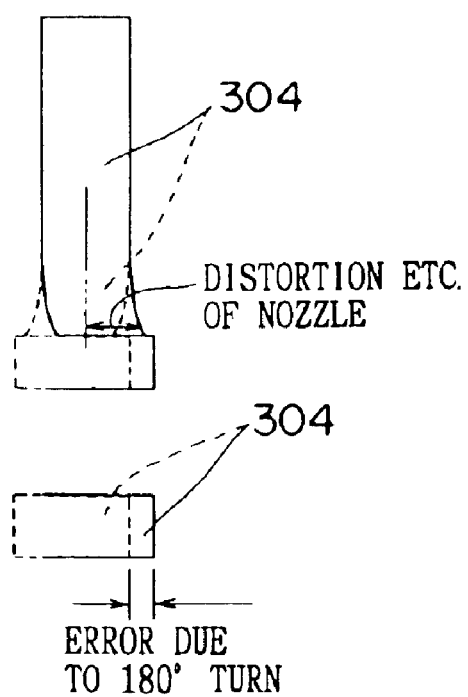

Also, effects of distortions due to thermal changes of the nozzles 10 or the like (see differences between solid-line nozzle 304 and broken-line nozzle 304 in FIG. 17B) can be minimized, so that placing precision can be improved. More specifically, assume that with a nozzle 10 under no effects of heat or the like, as shown in FIG. 23A, a center 9p of a quadrilateral image 9i of recognition camera 9, and a center 10p of the nozzle 10, are coincidently located at a position [Xn, Yn] in X-Y coordinates, and that a center 20c of a rectangular-parallelopiped component 20 sucked by the nozzle 10 is located at a position [Xp, Yp] in the X-Y coordinates that is shifted from the center 10p of the nozzle 10. Further assume that when the nozzle 10 is turned by θ=45 degrees about a nozzle axis in this state, the center 20c of the component 20 sucked by the nozzle 10 is located at a position [Xp', Yp'] in the X-Y coordinates. Then, the X-Y coordinates [Xp', Yp'] of the center 20c of the component 20 resulting after this 45 degree turn can be determined by the following equation (Eq. 1):

Eq. 1:

$$\begin{bmatrix} Xp' \\ Yp' \end{bmatrix} = \begin{bmatrix} \cos\theta & \sin\theta \\ -\sin\theta & \cos\theta \end{bmatrix} \left[ \begin{bmatrix} Xp \\ Yp \end{bmatrix} - \begin{bmatrix} Xn \\ Yn \end{bmatrix} \right] + \begin{bmatrix} Xn \\ Yn \end{bmatrix}$$

Next, in a case where the nozzle 10 is under effects of heat or the like, assume that the center 9p of the quadrilateral image 9i of the recognition camera 9, and the center 10p of the nozzle 10 are not coincident with each other as shown in FIG. 23B, wherein the nozzle 10 is distorted due to the effects of heat or the like so as to be shifted with respect to the position [Xn, Yn] in the X-Y coordinates of the center 9p of the image 9i so as to be located at a position [Xn', Yn'] in the X-Y coordinates. Further assume that the center 20c of the rectangular-parallelopiped component 20 sucked by the nozzle 10 is located at the position [Xp, Yp] in the X-Y coordinates with respect to the center 10p of the nozzle 10. When the nozzle 10 is turned by θ=45 degrees about the nozzle axis in this state, it would be expected that without any effects of heat, the center 20c of the component 20 sucked by the nozzle 10 is located at the position [Xp', Yp'] in the X-Y coordinates as in the case of FIG. 23A. However, actually, since actual X-Y coordinates of the turning center 10p of the nozzle 10 have been shifted from [Xn, Yn] to [Xn', Yn'] because of the effects of heat on the nozzle 10, calculative X-Y coordinates [Xp', Yp'] of the position of the center 20c of the component 20 with respect to the actual X-Y coordinates [Xn', Yn'] of the turning center 10p of the nozzle 10 can be determined by the following equation (Eq. 2):

Eq. 2:

$$\begin{bmatrix} Xp' \\ Yp' \end{bmatrix} = \begin{bmatrix} \cos\theta & \sin\theta \\ -\sin\theta & \cos\theta \end{bmatrix} \left[ \begin{bmatrix} Xp \\ Yp \end{bmatrix} - \begin{bmatrix} Xn \\ Yn \end{bmatrix} \right] + \begin{bmatrix} Xn \\ Yn \end{bmatrix}$$

Also, assuming that a calculative turning-center position, i.e., the center 9p of the image 9i is [Xn, Yn] in the X-Y coordinates, actual X-Y coordinates [Xp_r', Yp_r'] of a position of the component center 20c can be determined by the following equation (Eq. 3):

Eq. 3:

$$\begin{bmatrix} Xp\_r' \\ Yp\_r' \end{bmatrix} = \begin{bmatrix} \cos\theta & \sin\theta \\ -\sin\theta & \cos\theta \end{bmatrix} \left[ \begin{bmatrix} Xp \\ Yp \end{bmatrix} - \begin{bmatrix} Xn' \\ Yn' \end{bmatrix} \right] + \begin{bmatrix} Xn' \\ Yn' \end{bmatrix}$$

Therefore, a shift between the calculative X-Y coordinates of the position of the center 20c of the component 20 and the actual X-Y coordinates of the position of the component center 20c results in a placing position shift, wherein this placing position shift can be determined by the following equation (Eq. 4) from equations (Eq. 2) and (Eq. 3):

Eq. 4:

$$\begin{bmatrix} Xp' \\ Yp' \end{bmatrix} - \begin{bmatrix} Xp\_r' \\ Yp\_r' \end{bmatrix} = \begin{bmatrix} \cos\theta & \sin\theta \\ -\sin\theta & \cos\theta \end{bmatrix} - \begin{bmatrix} Xn \\ Yn \end{bmatrix} + \begin{bmatrix} Xn' \\ Yn' \end{bmatrix} + \begin{bmatrix} Xn \\ Yn \end{bmatrix} - \begin{bmatrix} Xn' \\ Yn' \end{bmatrix}$$

θ-dependent components
Translational components

In this equation (Eq. 4), without any turn of the nozzle 10, i.e., with the turning angle θ=0, there results zero error, thereby eliminating a placing position shift. In contrast to this, with the nozzle 10 turned, i.e., with the turning angle θ≠0, there occurs an error, wherein the smaller the turning angle θ, the smaller the error. Accordingly, by turning the nozzle 10 before component recognition to thereby turn component 20 to a placing posture angle, allowing the component to be recognized, and then by turning the component to an extent corresponding to a correction after the component recognition, a resulting turning angle can be reduced so that errors due to effects of heat or the like can be reduced.

Thus, the prior-art issue of ③ can be solved.

Also, based on information as to the nozzles 10 and thicknesses of components to be sucked by the nozzles 10 stored in the memory 910, up-and-down amounts for the nozzles 10 by the nozzle up-and-down devices 26 are individually adjusted under control of the main controller 1000, the head controller 1001, and the servo drivers 1002, by taking into consideration the thicknesses of the components to be sucked. Thus, even with largely different thicknesses of components, performing batch suction of a plurality of components 20 by a plurality of nozzles 10 never causes damage to the components 20. Also, based on the information as to the nozzles 10 and the thicknesses of components to be sucked by the nozzles 10 stored in the memory 910, and under control of the main controller 1000, the head controller 1001, and the servo drivers 1002, up-and-down amounts for the nozzles 10 are individually adjusted by the nozzle up-and-down devices 26 so that bottom faces of components sucked by the nozzles 10 are individually adjusted to a uniform height or to within a certain range. Thus, batch recognition of components that are largely different in height from one another is enabled. Therefore, the prior-art issue of ④ can be solved.

Further, as a result of driving θ-axis motor 25m under control of the main controller 1000, the head controller 1001, and the servo drivers 1002, the nozzles 10 are allowed to individually perform turning operations about corresponding θ-axes at any arbitrary time independently of one another. Therefore, even when a placing posture angle of a component 20 is largely different from its placing angle at a component feed position by, for example, 90° or 180°, any decrease in mounting cycle time can be prevented by, after sucking and holding of the component 20 by nozzle 10 and before recognition of the component 20, driving the nozzle turning device 25 to preliminarily turn the component 20 to its placing posture angle, as compared with a case where this turning operation is performed after component recognition and before component placement. Therefore, the prior-art issue of ⑤ can be solved.

Also, in each component suction device 15, the nozzle turning device 25 and the nozzle up-and-down device 26 for the suction nozzle 10 are provided by the same unit in an arrangement that the θ-axis motor 25m for the nozzle turning device 25 is located below the linear motor 32, which is an up-and-down motor for the nozzle up-and-down device 26, and that a center line of the θ-axis motor 25m is located at a center of thrust imported by the linear motor 32. Thus, occurrence of an unnecessary moment is prevented during up-and-down operations, by which swings due to the up-and-down operations can be prevented.

Also, the nozzle up-and-down device 26 is so structured that the magnetic-circuit forming member 26a and the mechanism forming member 26b are dividedly provided, wherein these members can be made of different materials and combined together so that the magnetic-circuit forming member 26a alone is made of steel material and the mechanism forming member 26b is made of aluminum alloy or the like, thus making it possible to reduce weight and thickness of the device.

Also, the main controller 1000 is provided on the component-mounting-apparatus main body, while the head controller 1001 and the servo drivers 1002 are mounted on the mounting head 4 side. In communications from the main controller 1000 through the head controller 1001 to the servo drivers 1002, the same broadcast communications can be performed to the servo drivers 1002 for all the nozzles 10 by transmitting addresses and drive amounts of the servo drivers 1002. Each of the servo drivers 1002 is enabled to fetch only information coincident with its own address and neglect other information, thus being capable of driving and controlling their respective motors 32, 25m without any malfunction. Thus, communication traffic and communication time can be reduced as compared with a case where communications are performed for each of the servo drivers 902.

Also, values of speed and acceleration for the nozzles 10, for example, eight kinds of specified values are preliminarily individually transmitted from the main controller 1000 to the head controller 1001 so as to be stored as a table in the memory 1005 connected to the head controller 1001. As a result of this, only transmitting, for example, one specified value, selected out of the eight kinds, allows the nozzles 10 to individually operate at a desired speed or acceleration. Thus, communication traffic and communication time can be reduced as compared with a case where concrete information as to speed and acceleration is transmitted.

Further, only by transmitting a command for instructing a suction operation to be performed by the nozzles 10, or a command for instructing a placing operation to be performed by the nozzles 10, and a travel amount as well as a dead-point time for each operation, from the main controller 1000 to the head controller 1001, relevant motors 32 or 25m can be driven and controlled via the head controller 1001 by the servo drivers 1002 to perform the suction operation or placement operation. Thus, communication traffic and communication time can be reduced as compared with a case where information as to a suction or placement operation is transmitted.

It is noted here that the present invention is not limited to the above embodiment, and may be embodied in other various ways.

For example, the above embodiment has been described for a case where simultaneous suction, simultaneous recognition and the like are performed by ten nozzles 10. However, in a case where only five nozzles 10 are used for performing a mounting operation, even with ten nozzles 10 mounted on mounting head 4, it is possible to read the above description by replacing the ten nozzles 10 with five nozzles 10. That is, a plurality of nozzles which should perform a mounting operation can be made to simultaneously perform suction, turning, recognition, or other operations.

The component mounting apparatus equipped with the above-described component suction device is not limited to the above first embodiment, and may be applied to other component mounting apparatuses.

Figure 19:
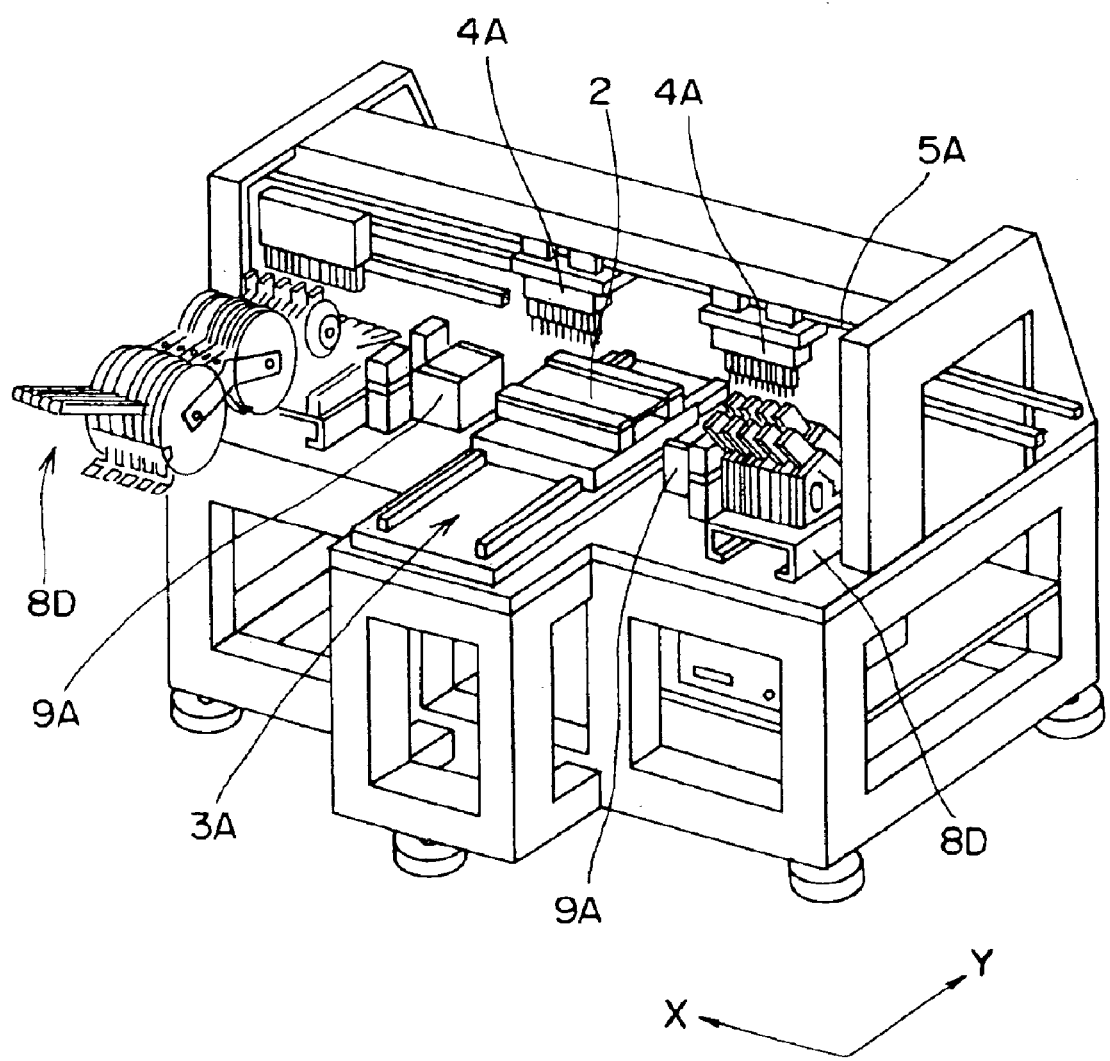
FIG. 19 is an overall schematic perspective view of a component mounting apparatus with a component suction device mounted thereon according to a second embodiment of the present invention.
Figure 20:
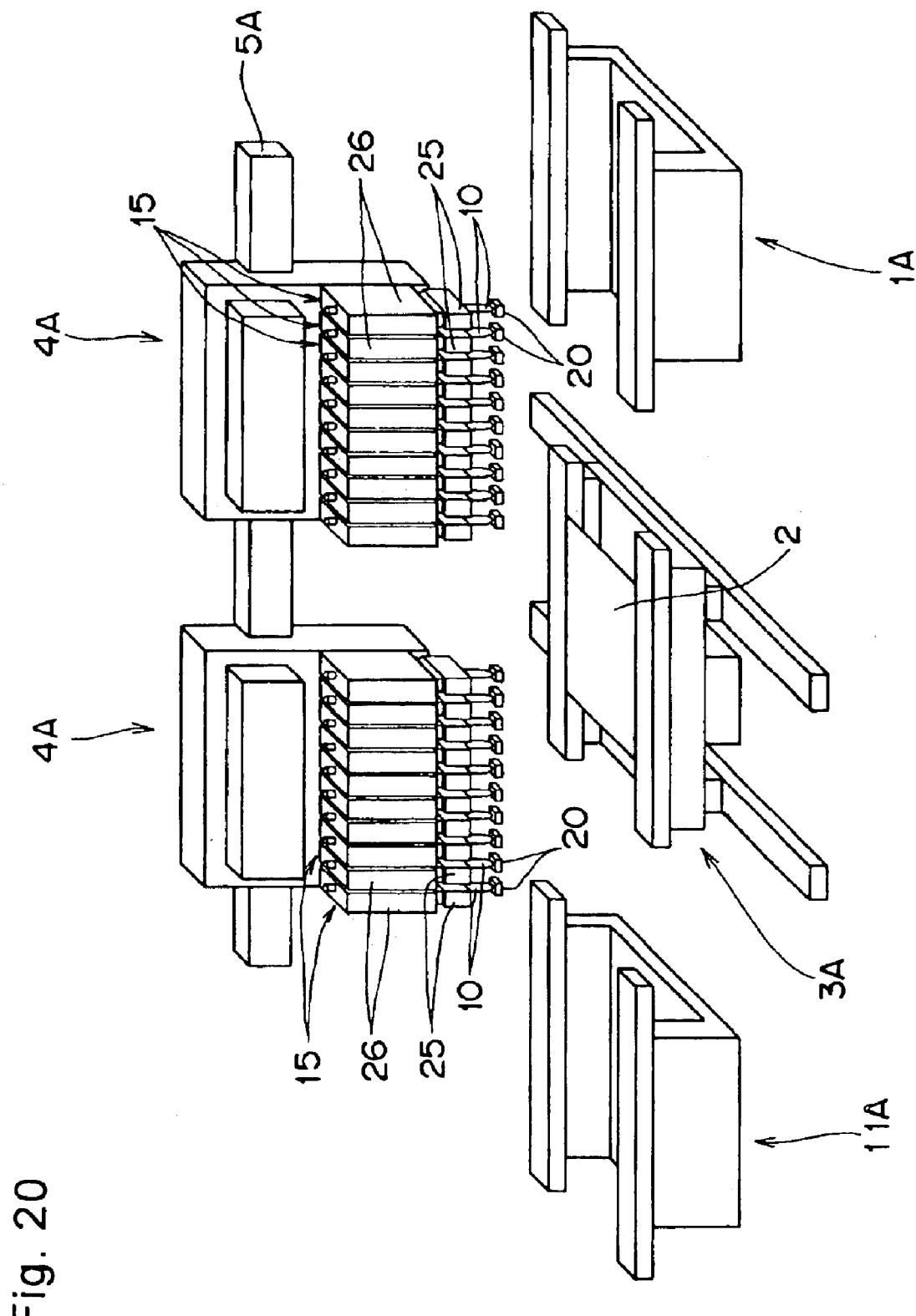
FIG. 20 is a partial perspective view of the component mounting apparatus of FIG. 19.
Figure 21:
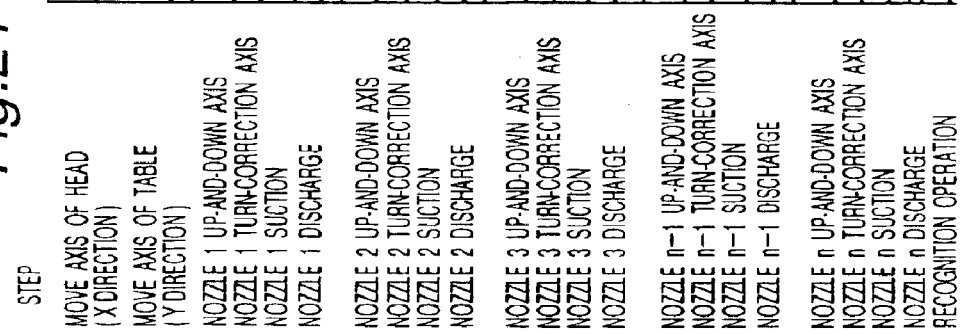
FIG. 21 is a flowchart of X- and Y-directional movements of a mounting head, Y-axis directional movement of a Y-table, up-and-down operations and turning operations of or other mounting operations in the component mounting apparatus of the second embodiment.

For example, as a component mounting apparatus according to a second embodiment of the present invention, as shown in FIGS. 19, 20, and 21, the component mounting apparatus may be one in which mounting heads 4A move only in an X-direction, while a board holding device 3A that holds board 2 moves only in a Y-direction, without being limited to those in which the mounting head 4 moves in the X- and Y-directions. More specifically, the board holding device 3A is implemented by a Y-table that advances and retreats only in the Y-axis direction, while an X-axis driver device 5A extending in the X-axis direction, perpendicular to the Y-axis direction, is provided. By the X-axis driver device 5A, the mounting heads 4A are driven only in the X-axis direction independently of one another. Also in such a component mounting apparatus, as in the component mounting apparatus of the first embodiment, nozzles that have sucked components 20 can be turned at any arbitrary time to desired angles by nozzle turning devices 25, and besides the nozzles 10 can be moved up and down at any arbitrary time to desired heights by nozzle up-and-down devices 26. Therefore, for example, after a component suction operation has been performed at a component feed cassette 8D, the nozzles 10 can be turned to their respective placing posture angles simultaneously by drive of the nozzle turning devices 25. Also, before placing components, the nozzles 10 can be turned to the their respective correction angles simultaneously by drive of the nozzle turning devices 25. In addition, in FIG. 20, reference numeral 1A denotes a loader, and 11A denotes an unloader.

Figure 24:
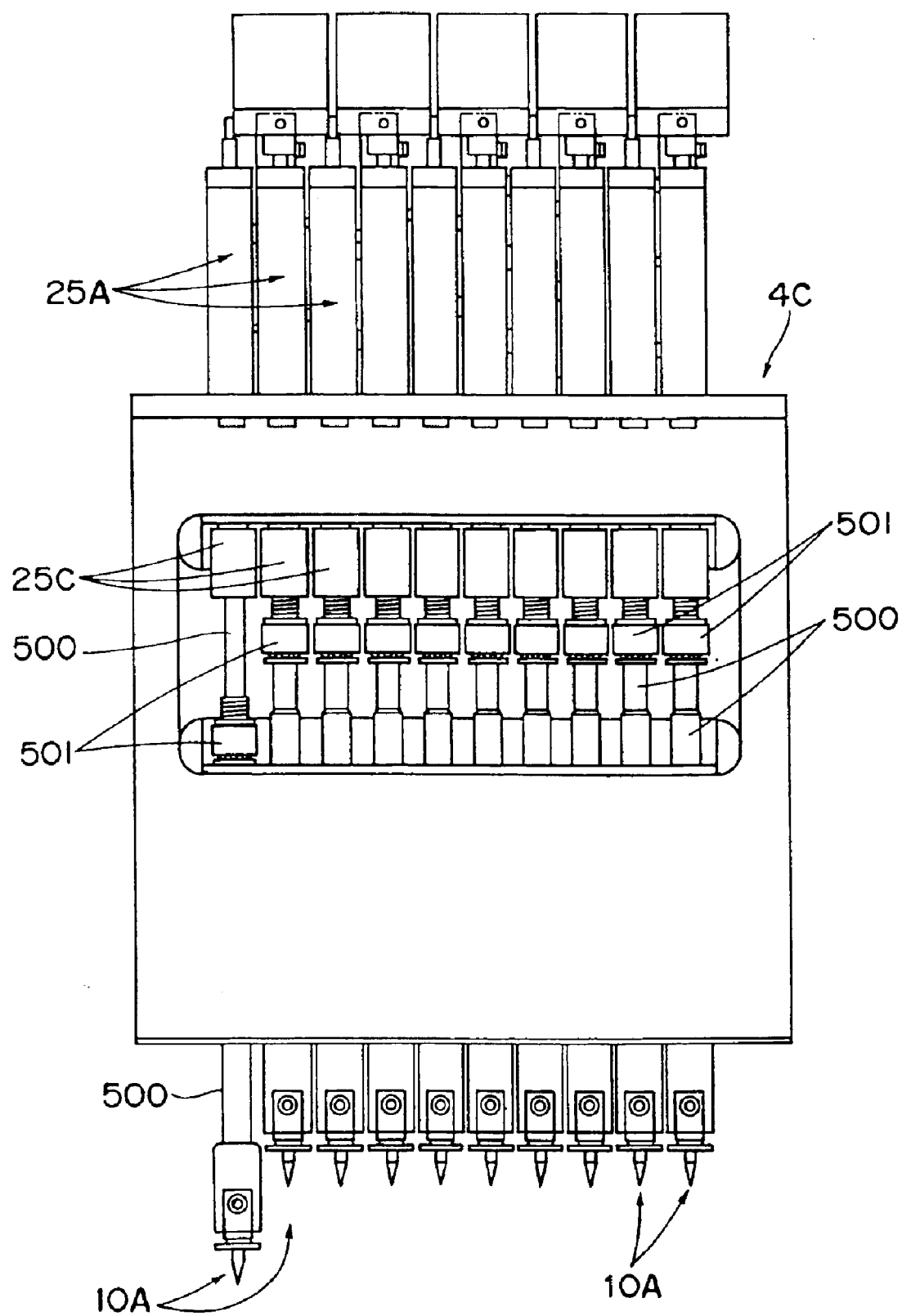
FIG. 24 is a front view of a mounting head equipped with ten component suction devices according to a third embodiment of the present invention.
Figure 25:
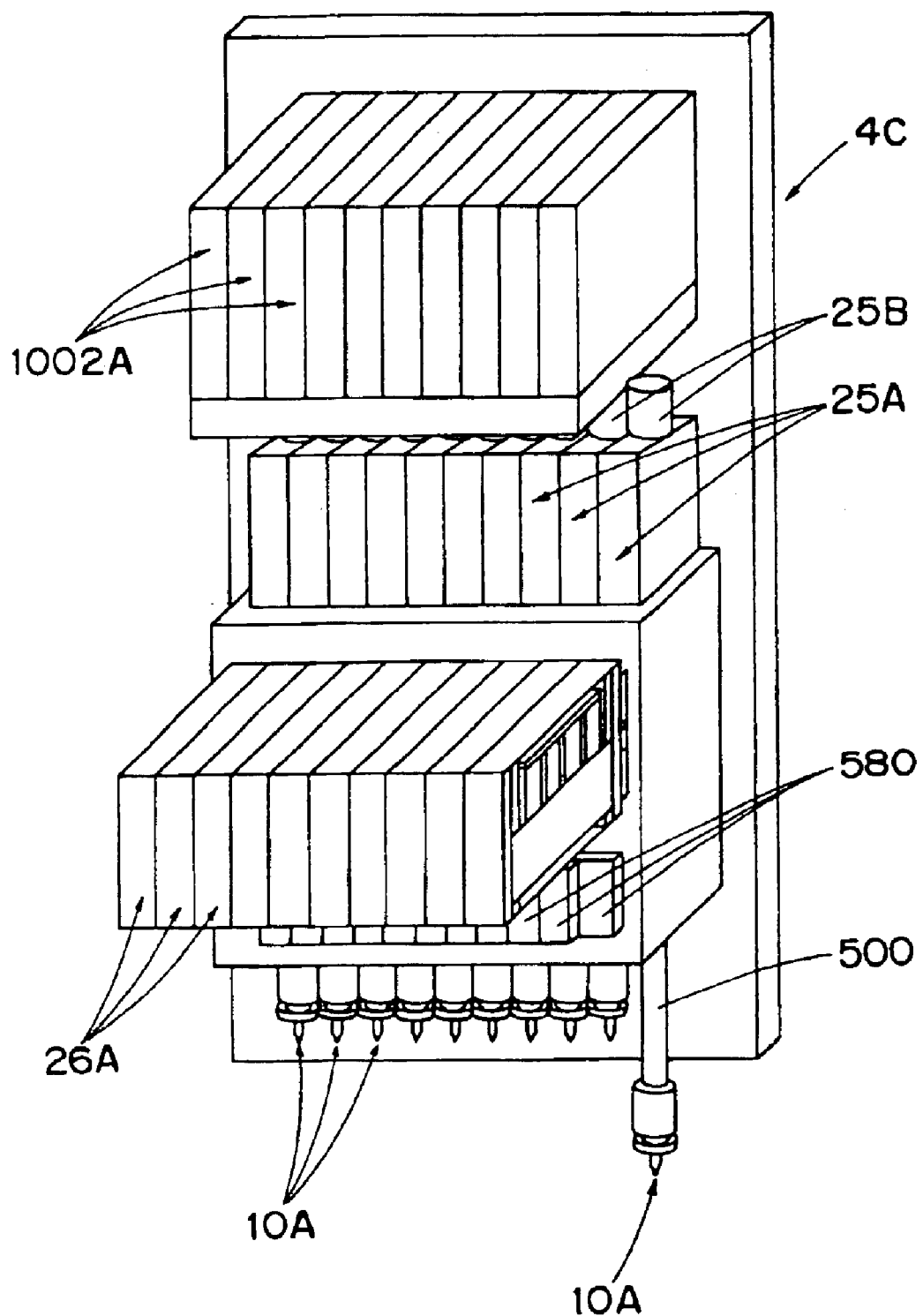
FIG. 25 is a perspective view of the component suction device of FIG. 24.

A component suction device according to a third embodiment of the present invention, as shown in FIGS. 24 and 25, includes: a drive shaft 500 which is movable up and down and turnable about its axis; a suction nozzle 10A which is fitted at a lower end of the drive shaft 500 so as to be relatively non-rotatable and up-and-down relatively immovable, and which can suck and hold component 20; a θ-turn driving motor 25A which is connected to an upper portion of the drive shaft 500 so as to be up-and-down relatively movable and relatively non-rotatable, and which turns the drive shaft 500 about its axis; an up-and-down driver device 26A which has a cylindrical first coupling section 501 connected to the drive shaft 500 up-and-down relatively immovably and relatively rotatably, and which drives up and down the first coupling section 501 to thereby drive the drive shaft 500 up and down; a driver 1002A which drives and controls the θ-turn driving motor 25A and the up-and-down driver device 26A independently of each other; and a suction control valve 580 which controls a suction operation of the nozzle 10A. The component suction device of such a constitution is provided side by side in a plural number on a mounting head 4C.

Figure 26:
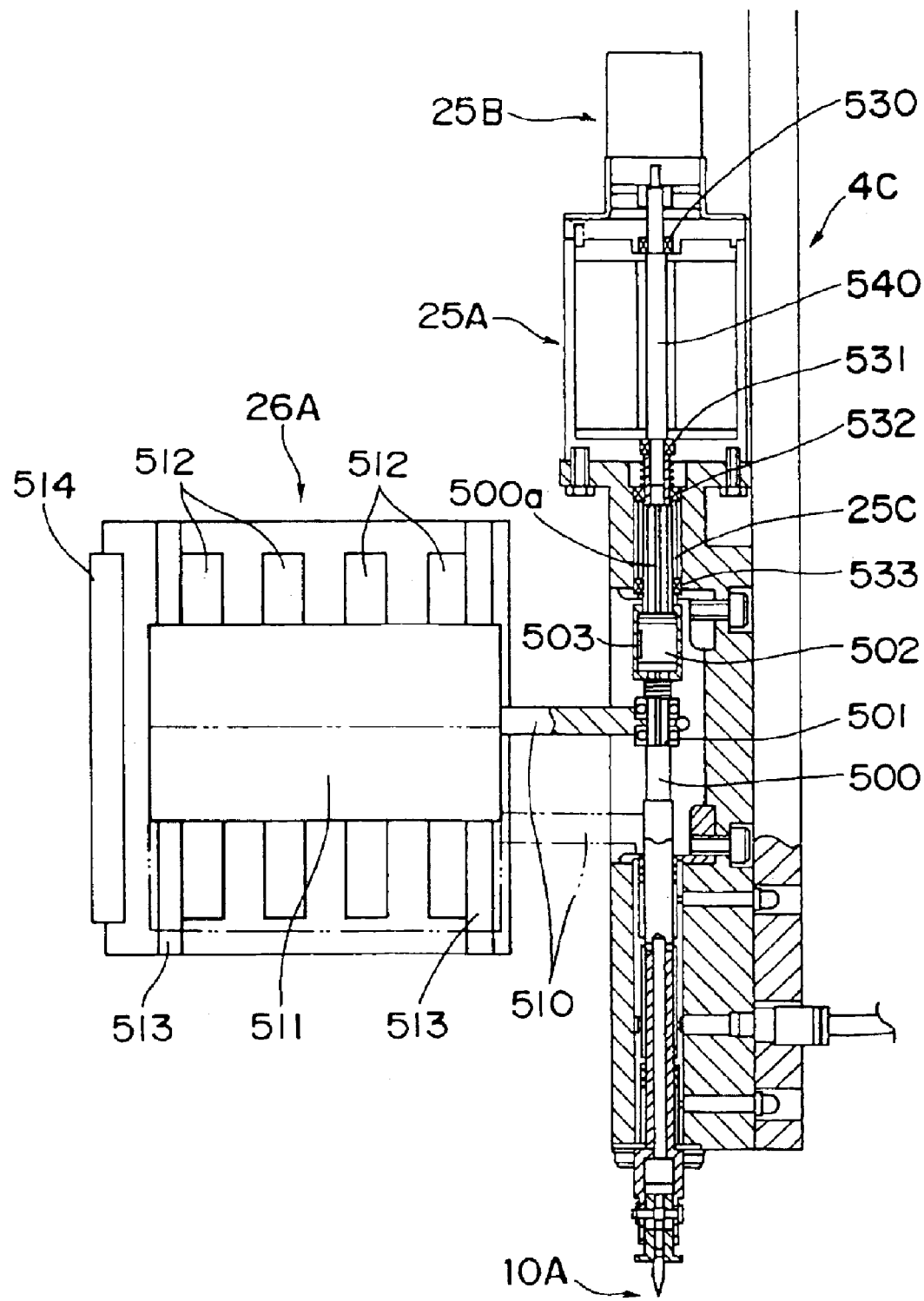
FIG. 26 is a partly sectional side view of a component suction device of FIG. 24.
Figure 27:
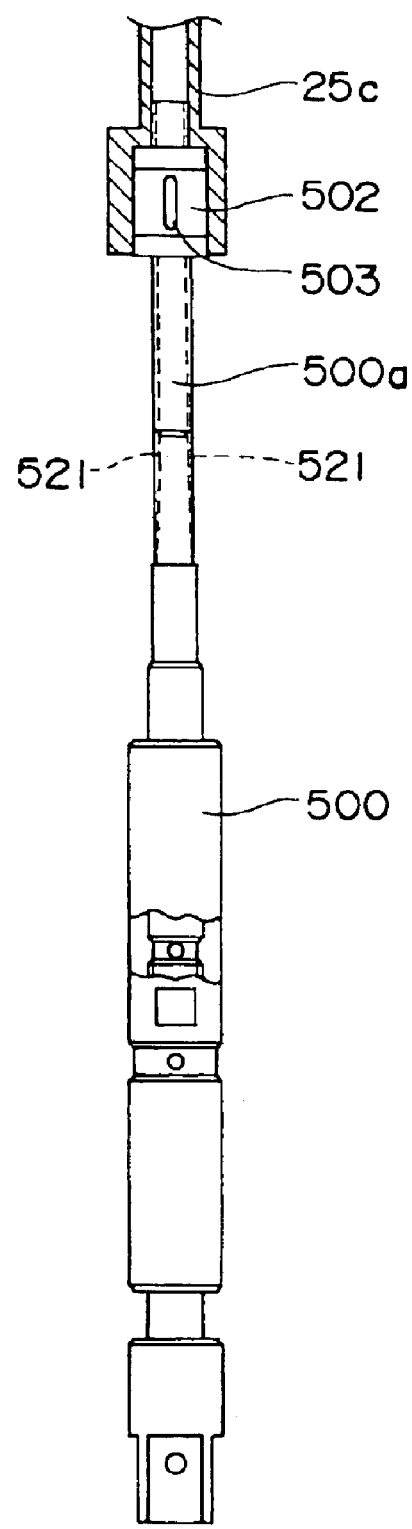
FIG. 27 is a front view of a drive shaft of the component suction device of FIG. 24.
Figure 28:
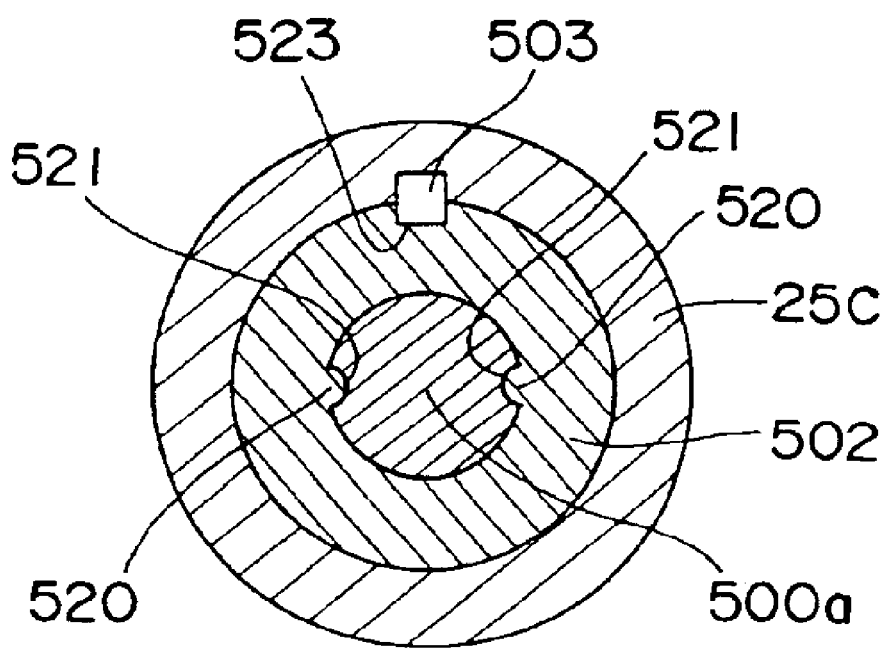
FIG. 28 is a sectional view of a spline shaft part of the drive shaft of the component suction device of FIG. 24.

As shown in FIGS. 26 and 27, the drive shaft 500 has, in an upper part thereof, a spline shaft portion 500a having a pair of recessed portions 521 at an interval of, for example, 180 degrees. Outside the spline shaft portion 500a, are fitted a cylindrical second coupling section 502 which has a pair of protrusions 520 for engaging with the pair of recessed portions 521 of the spline shaft portion 500a and which is up-and-down relatively movable and relatively non-rotatable. Further, outside the second coupling section 502 is fitted a lower end portion of an elongate, cylindrical third coupling section 25C which is connected relatively non-rotatably with a key 503 fitted into a keyway 523 of the second coupling section 502. An upper end of the third coupling section 25C is fixed to a turning shaft 540 of the θ-turn driving motor 25A.

Therefore, as the turning shaft 540 of the θ-turn driving motor 25A is driven to turn, the third coupling section 25C, the second coupling section 502 coupled to the third coupling section 25C relatively non-rotatably, the drive shaft 500 having the spline shaft portion 500a connected to the second coupling section 502 relatively non-rotatably, and nozzles 10A connected to lower ends of drive shaft 500 integrally turn.

Figure 29:
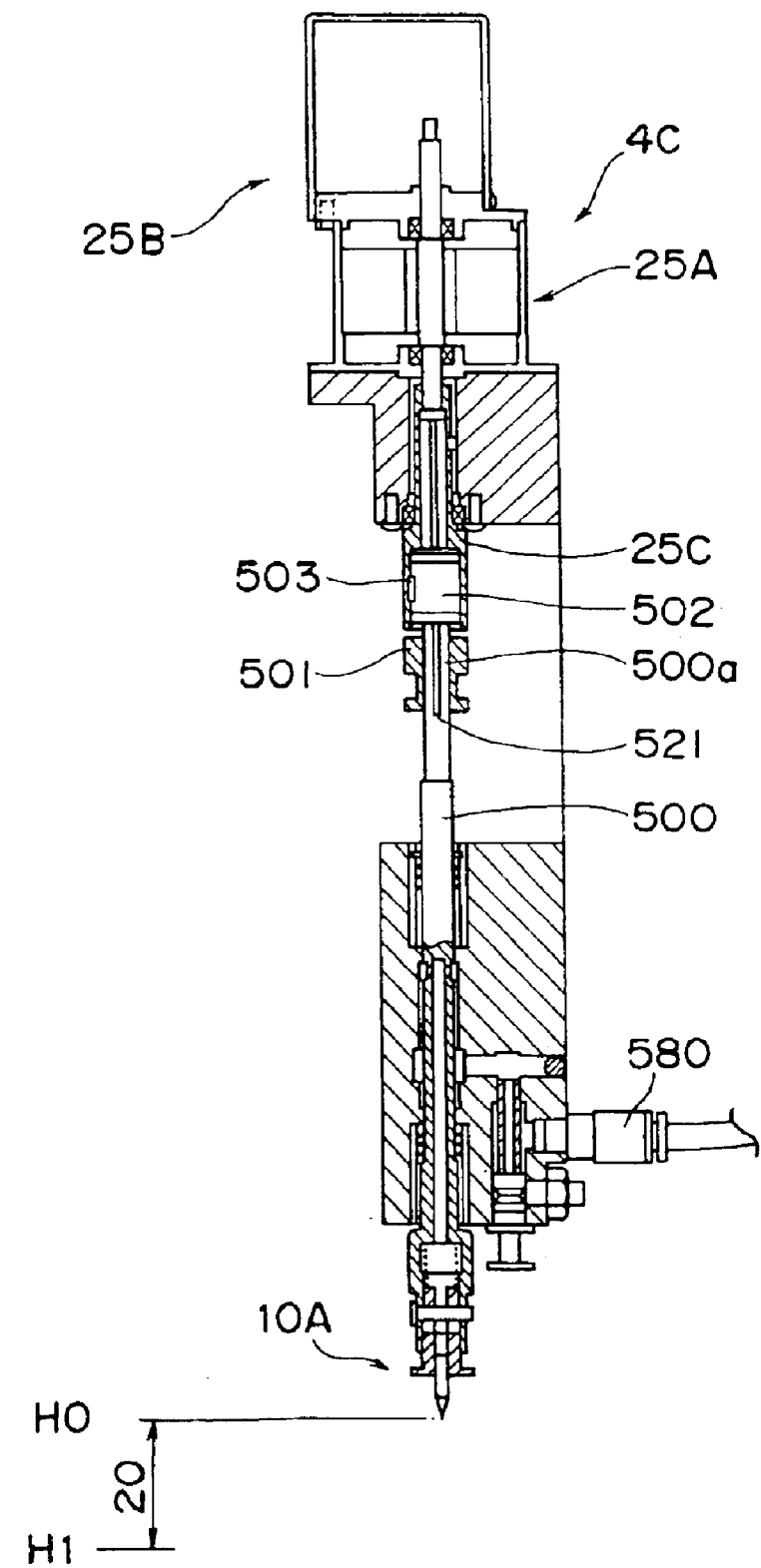
FIG. 29 is a partly sectional side view of the component suction device at an upper-end position of a nozzle in the component suction device of FIG. 24.
Figure 30:
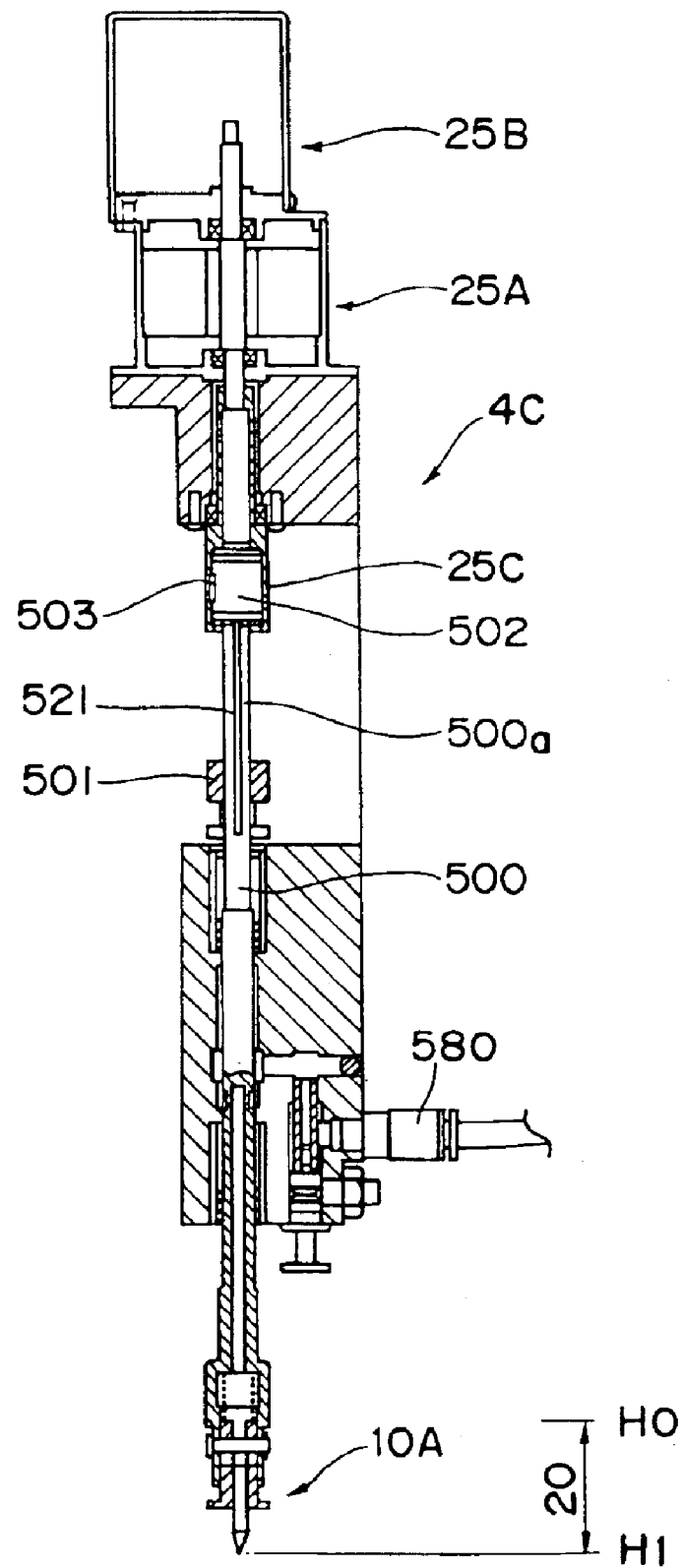
FIG. 30 is a partly sectional side view of the component suction device at a lower-end position of the nozzle in the component suction device of FIG. 24.
Figure 31:
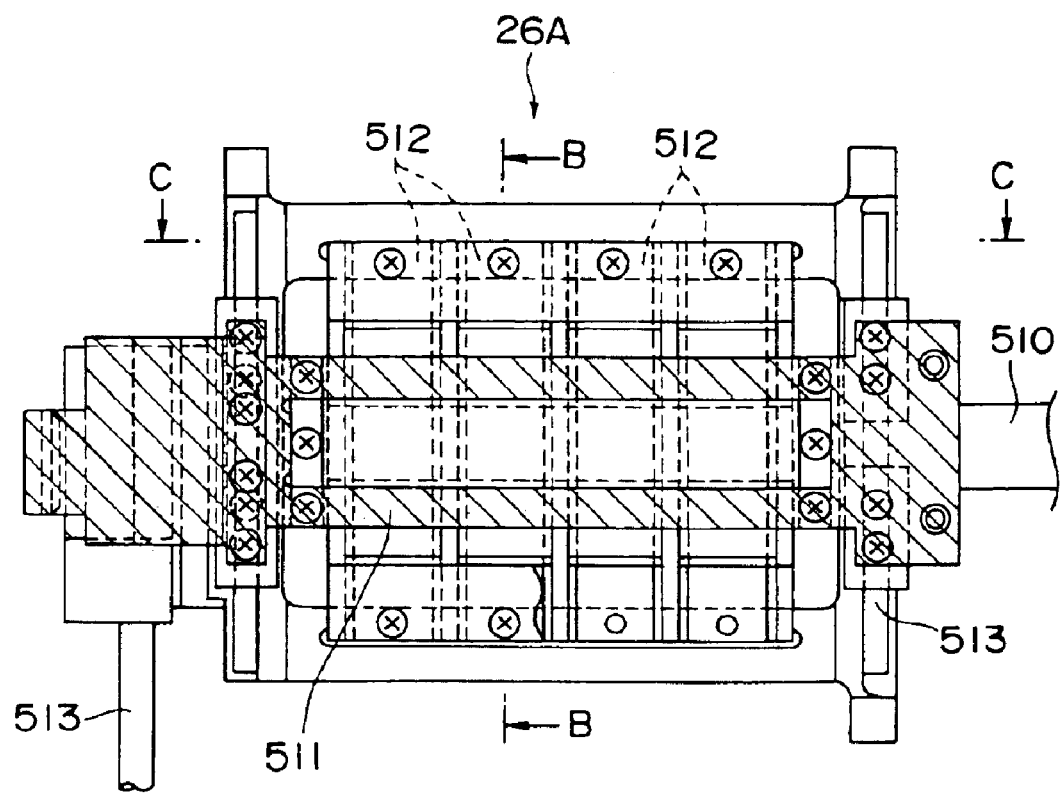
FIG. 31 is a front view of a voice coil motor of the component suction device of FIG. 24.
Figure 32:
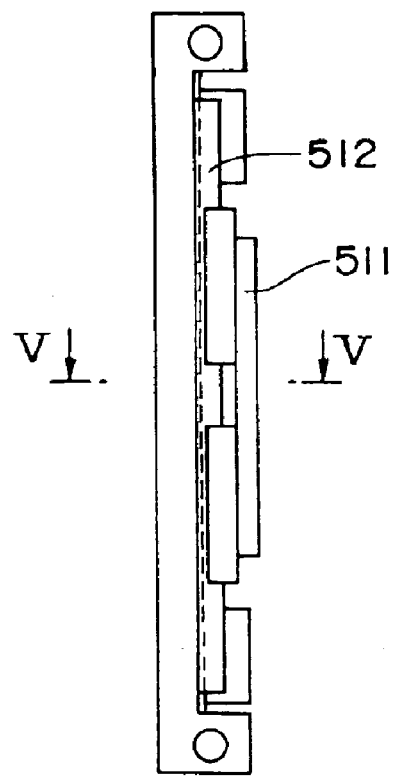
FIG. 32 is a left side view of the voice coil motor of the component suction device of FIG. 31.
Figure 33:
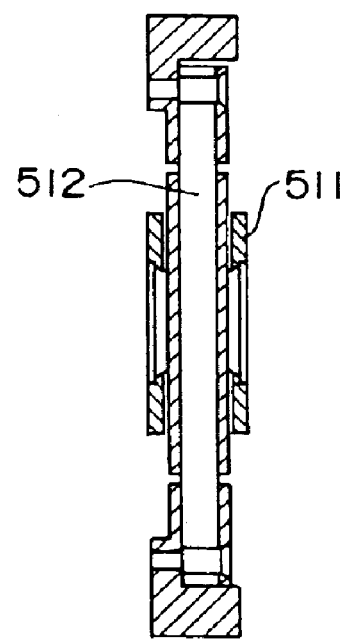
FIG. 33 is a sectional view of the voice coil motor of the component suction device of FIG. 31, taken along line B—B of FIG. 31.
Figure 34:
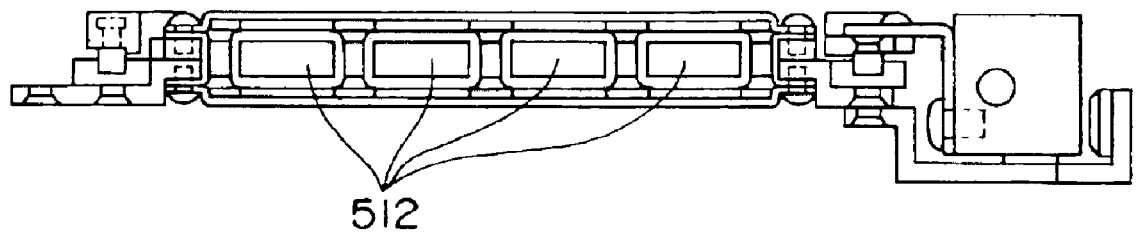
FIG. 34 is a sectional view of the voice coil motor of the component suction device of FIG. 31, taken along line V—V of FIG. 32.

Also, the cylindrical first coupling section 501 connected to the drive shaft 500 up-and-down relatively immovably and relatively rotatably is connected to the up-and-down driver device 26A via a drive arm 510. By drive of the up-and-down driver devices 26A, the drive arm 510, the first coupling section 501 connected to the drive arm 510, the drive shaft 500 connected to the first coupling section 501 up-and-down relatively immovably, and the nozzle 10A fixed to the lower end of the drive shaft 500 integrally move up and down. A distance of this movement is, as shown in FIGS. 29 and 30, between an upper-end position H0 and a lower-end position H1, for example, about 20 mm.

As shown above, the up-and-down driver device 26A is located, not coaxial with the drive shaft 500, but beside the drive shaft 500 so as to move up and down the drive shaft 500 via the drive arm 510. Therefore, heat generated by up-and-down movement of the up-and-down driver device 26A is less likely to be transferred to a drive shaft side, so that drive control by the drive shaft 500 can be enhanced and that the structure as a whole can be simplified.

The nozzles 10A are so arranged that a width of the component suction devices, i.e., an array pitch of the θ-turn driving motors 25A, an array pitch of rectangular up-and-down driver devices 26A, and a width of rectangular drivers 1002A are a pitch distance corresponding to an array pitch of a plurality of component feed sections of the component feed device, for example, component cassettes, trays, or the like. As a result of this, it becomes possible to simultaneously locate a plurality of nozzles 10A above a plurality of component cassettes or trays and then move the nozzles downwardly, thus making the nozzles 10 perform batch suction simultaneously. Thus, a width of the mounting head 4C can be minimized by setting widths of individual rectangular motors 25A, 26A and rectangular drivers 1002A according to an array pitch of the nozzles 10A. Also, when the rectangular motors or drivers are fitted to the mounting head 4C, it is possible to fix these motors or drivers in contact with one another by virtue of their rectangular shape, in which case rigidity can be improved.

Each θ-turn driving motor 25A has an encoder 25B on top thereof so as to be able to detect a turning angle of turning shaft 540. An output from the encoder 25B is fed to driver 1002A, and the θ-turn driving motor 25A is driven and controlled by drive shaft 500 at a turning angle based on a turning angle position of a corresponding nozzle 10A.

Each up-and-down driver device 26A can be implemented by a voice coil motor as an example. As shown in FIG. 26, each up-and-down driver device 26A is made up generally of a movable magnet 511 which can be moved up and down by a pair of up-and-down extending linear guides 513 and to which drive arm 510 is fixed, four coils 512, and a linear scale 514 which detects a vertical position of the movable magnet 511 with high precision. This vertical position information determined by the linear scale 514 is fed to driver 1002A, and the up-and-down driver 26A is driven and controlled based on this positional information.

This third embodiment is characterized by the following features.
1. A plurality of nozzles 10A are equipped with laterally opposed θ-motors 25A controllable independently of one another, respectively.

2. In the constitution of the above paragraph 1, the nozzles 10A can be moved up and down via drive shafts 500.
3. In the constitution of the above paragraph 1, the nozzles 10A can be moved up and down by thin type voice coil motors (VCMs) as examples of the up-and-down driver devices 26A.
4. In the constitution of the above paragraphs 1 and 3, drivers 1002A that control motors 25A, 26A are attached near the above constitutions, wherein with a method of operating from a host via serial communications, wiring can be saved by mounting the head controller on a movable section.
5. In the constitutions of the above paragraphs 1 to 4, there is such a characteristic arrangement (where ten nozzles 10A are adjusted to a minimum pitch of the component cassettes; by mounting the head controller on a movable section and by adjustment to a minimum cassette pitch, reduction in size and weight is implemented) that the motors 25A, 26A and the drivers 1002A are thinned so as to be adjusted to a width of the component cassettes as an example of a component feed section. As a result of this, weight as a whole of the mounting head 4C can be reduced to about half, and vibrations occurring with movement can be reduced to a large extent.
6. In the constitution of the above paragraph 5, a suction opening-and-closing valve of nozzle 10A is provided for each of the nozzles 10A, wherein components can be sucked and placed independently or simultaneously. That is, with the head controller mounted on the movable section, high-speed machine operation is performed by several I/O units.
7. In the constitution of the above paragraph 1, it is characterized in that after component suction and placement, one turn is made so that bearings 530, 531, 532, 533 or the like are prolonged in life. That is, after completion of suction and before movement to a next step, nozzle 10A is subjected to one turn, thereby being prolonged in life. This is explained below.

First, in a case where up-and-down movement and a θ turn are performed when component placement is performed after component suction and recognition, as in the prior-art apparatuses, it is impossible to reduce mounting cycle time because two operations of the up-and-down movement and θ turn are performed. That is, since a plurality of nozzles are turned with one θ-motor, individual nozzles cannot be θ-turned to respective placement positions before being recognized, and instead up-and-down movement and θ-turn are performed at the time of component placement, thus making it unattainable to reduce mounting cycle time. However, according to the third embodiment, after component suction and during movement to a recognition position, nozzles can be individually θ-turned to their respective placed-state positions and then recognized, and thereafter subjected to corrective turns for θ-turn positions during movement to placing positions, and then component placement only by up-and-down movement can be performed. Thus, reduction in mounting cycle time can be realized. Also, since the nozzles 10A can be adjusted in terms of placing orientation, i.e., to their θ-turn positions before being recognized, placing precision can be improved.

Next, in a case of prior-art apparatuses in which head-driving actuators are mounted within the mounting head and drivers, which are controllers therefor, are mounted on an equipment main body, increasing a number of head-driving shafts would cause wiring for connecting the head and the equipment main body to increase. However, in the third embodiment, the motors adjusted to a pitch of the nozzles 10A of the mounting head 4C (laterally opposed θ-motors 25A as an example of the θ-turn driving motors and thin-type voice coil motors 26A as an example of the up-and-down driver devices), as well as motor drivers therefor, are mounted on the mounting head 4C, and a conventional NC controller is mounted on the mounting head 4C, wherein the equipment main body and the driver controller are communicated with each other by wired or wireless communications. As a result of this, even if a number of nozzle shafts of the mounting head 4C is increased, wiring between the equipment main body and the mounting head 4C is not increased.

Next, in the prior-art apparatuses, the θ-motors, being unable to be coaxial with central axes of the nozzles, with rotary forces thereof transferred to the central axes of the nozzles via a rack and pinion or a timing belt, involves large error factors such as backlash. That is, in a case where a nozzle pitch is adjusted to a minimum pitch of component cassettes, it would be impossible to provide θ-motors for individual nozzles, respectively, and θ-turn is implemented by a belt or by a rack and pinion. As a result of this, turn errors such as backlashes of gears would be large. In contrast to this, according to the third embodiment, laterally opposed θ-motors 25A are disposed coaxial with the nozzles 10A, and turns are transferred via the spline shafts 500. That is, the laterally opposed θ-turn driving motors 25A serving as thin-type servomotors are located coaxial with the central axes of individual nozzles 10A, by which a turning force in the θ-direction can be transferred directly to the nozzles 10A, so that turning errors can be reduced.

Figure 35:
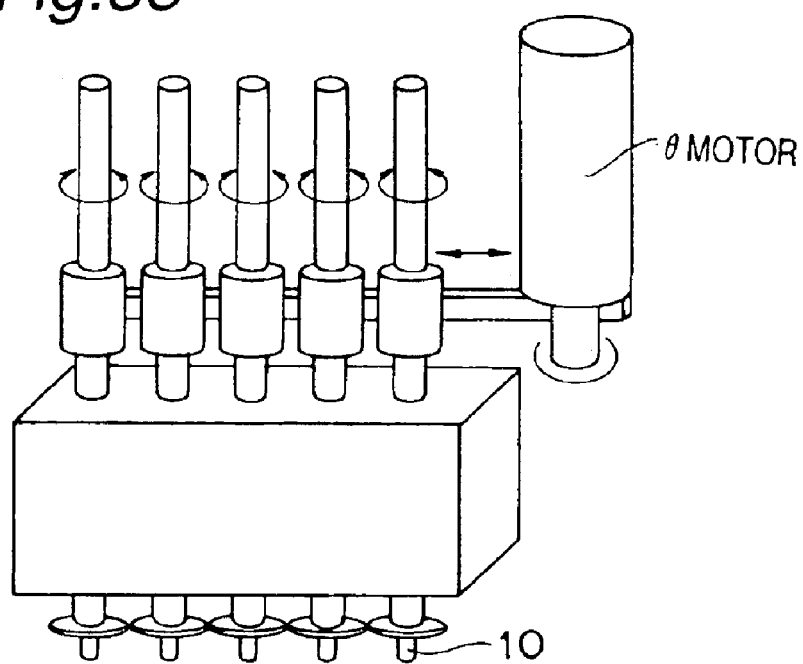
FIG. 35 is a perspective view of a prior-art mounting head for explaining life of bearings.
Figure 36A:
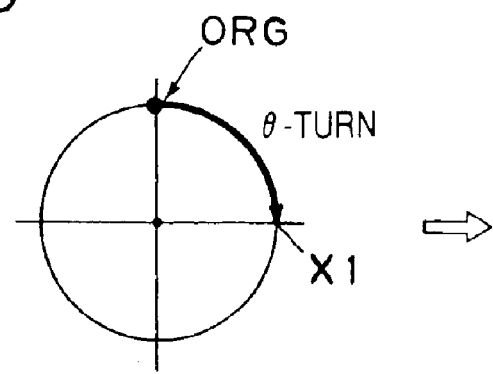
FIGS. 36A and 36B are explanatory views of turning operations of nozzles of the prior-art mounting head for explaining the life of bearings, respectively.
Figure 36B:
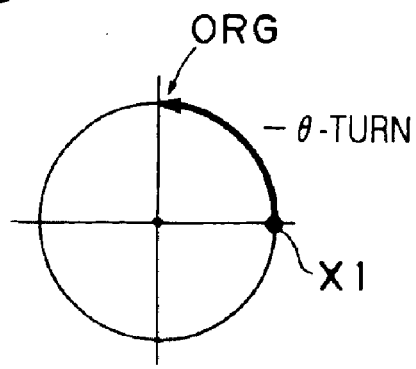
Figure 37:
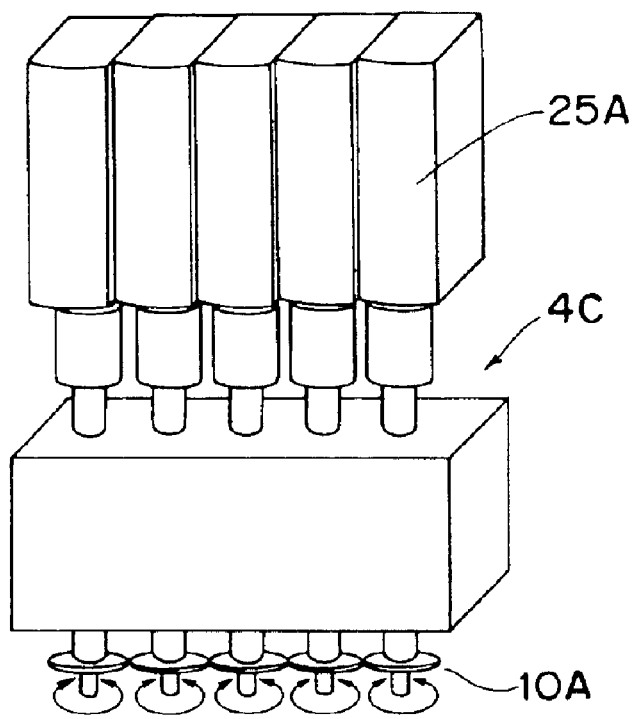
FIG. 37 is a perspective view of a mounting head of the third embodiment for explaining life of bearings.
Figure 38A:
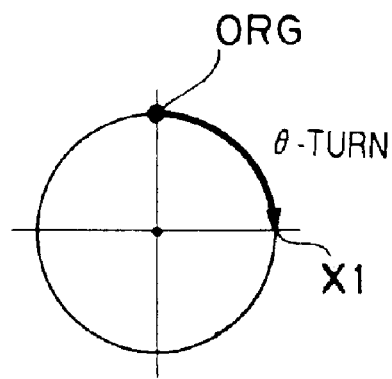
FIGS. 38A and 38B are explanatory views of turning operations of a nozzle of the mounting head of the third embodiment for explaining the life of bearings, respectively.
Figure 38B:
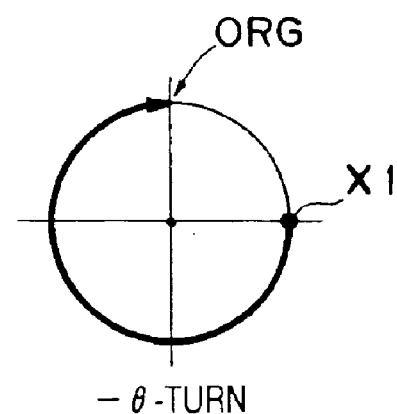

Also, in the prior-art constitution, as shown in FIG. 35, in a case where a back turn for nozzle 10, which is performed after a θ-turn from its initial angle position ORG to a placing angle position X1 in order to return the nozzle 10 to its initial position, is set to a turn equal in angle value(−θ) and opposite in direction to the turn to the placing angle position X1 (θ-turn) as shown in FIG. 36 for a purpose of speed-up of cycle time, loads would be applied to the same portions or same balls of bearings, which causes the bearings to be shortened in life. Further, when the nozzle 10 is moved for correction turn in a placing at 0°, it becomes more likely that fretting occurs to the bearings, causing the bearings to be shortened in life. In contrast to this, in the third embodiment, in a case where back turn for nozzle 10A, which is performed after a θ-turn from its initial angle position to a placing angle position in order to return the nozzle 10A to its initial position, is set to a turn of a (360°−θ) angle equal in direction to the turn to the placing angle position (θ-turn) as shown in FIGS. 37 and 38, by which the nozzle 10A is returned to its initial angle position, the nozzle 10A is turned 360° in all cases, making use of all balls of the bearings 530, 531, 532, 533 as shown in FIG. 26. As a result of this, the bearings 530, 531, 532, 533 are subjected to one turn in all cases, so that loads are applied uniformly to all the balls, allowing the bearings 530, 531, 532, 533 to be prolonged in life. It is noted that the bearings 530, 531 are bearings which rotatably support upper and lower portions of turning shaft 540 of θ-turn driving motor 25A. The bearings 532, 533 are bearings which rotatably support upper and lower portions of third coupling section 25C.

A θ-turn driving motor 25A according to a third embodiment of the present invention is explained below with reference to FIGS. 39 to 44.

Before explanation of the θ-turn driving motor 25A according to the third embodiment of the present invention proceeds, a conventional brushless motor is first explained as an example.

Figure 45:
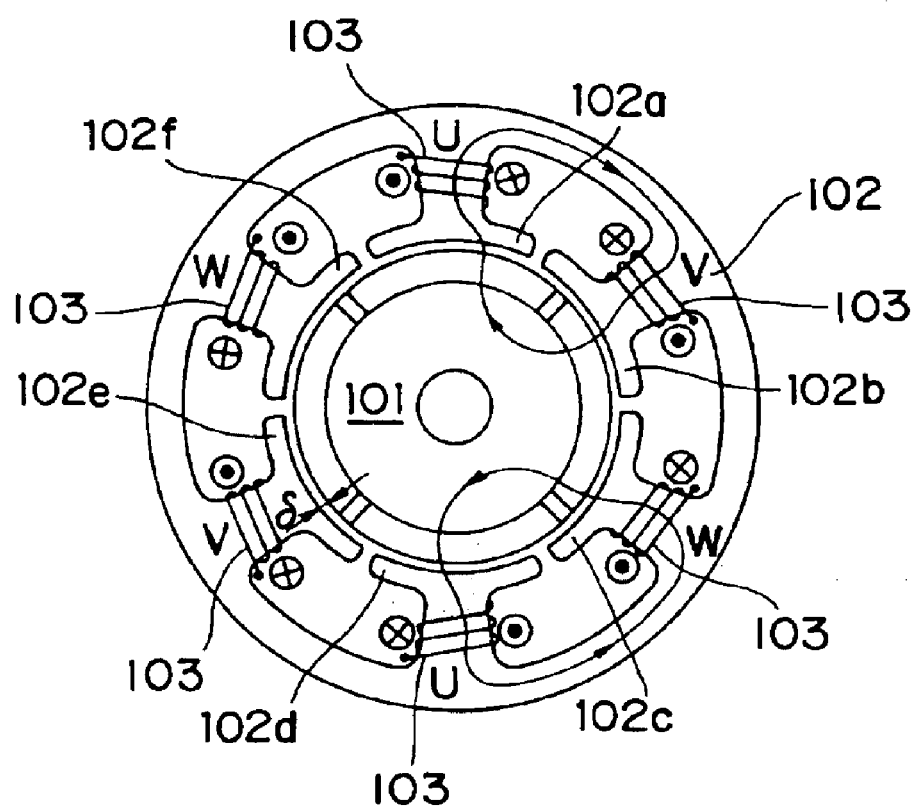
FIG. 45 is an explanatory view of a prior-art brushless motor.

The conventional brushless motor is so constructed that, as shown in FIG. 45, a rotor 101 is placed at a center, with an annular stator 102 surrounding the rotor 101. The rotor 101 is magnetized to a plurality of poles peripherally. Each of teeth 102a–102f of the stator 102 is wound with a coil 103, and fore ends of the teeth 102a–102f are close to an outer periphery of the rotor 101 with a gap δ therebetween.

In this case, a case of three phase (UVW) is shown, wherein position of the rotor 101 is detected by a separate sensor (not shown), and energization timing to the coils 103 of individual phases, UVW, are controlled in response to a position of the rotor 101 so that a rotating magnetic field is generated from the stator 102 to thereby rotationally drive the rotor 101.

Figure 46A:
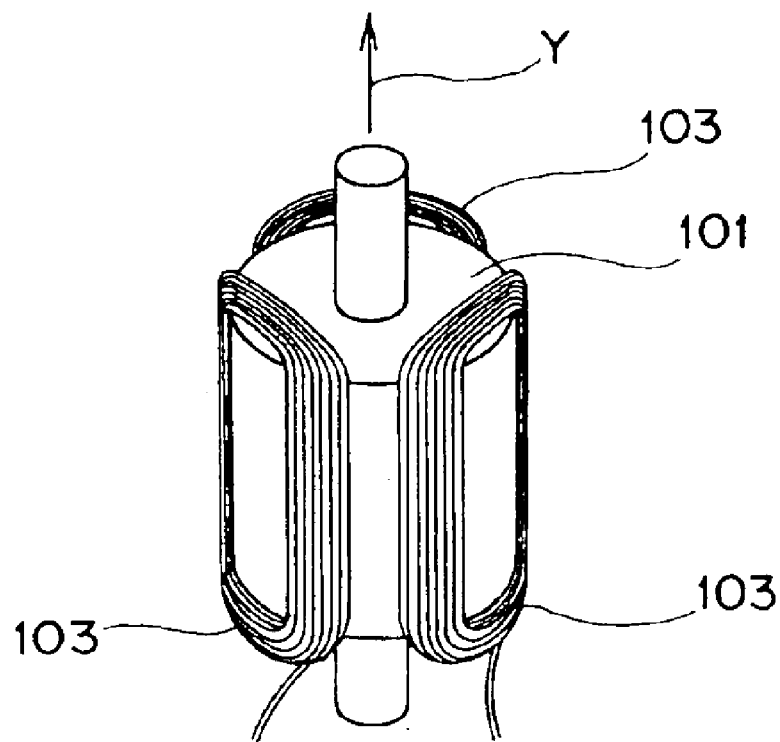
FIGS. 46A and 46B are explanatory views of a coreless brushless motor according to the prior art, respectively.
Figure 46B:
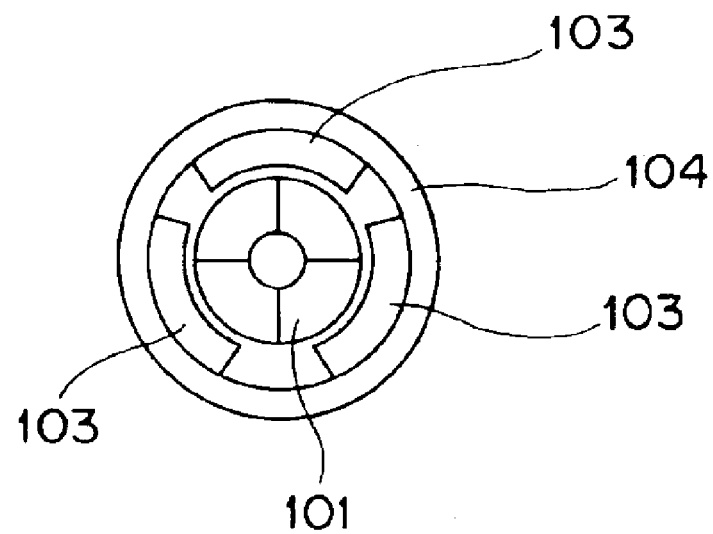
Figure 47:
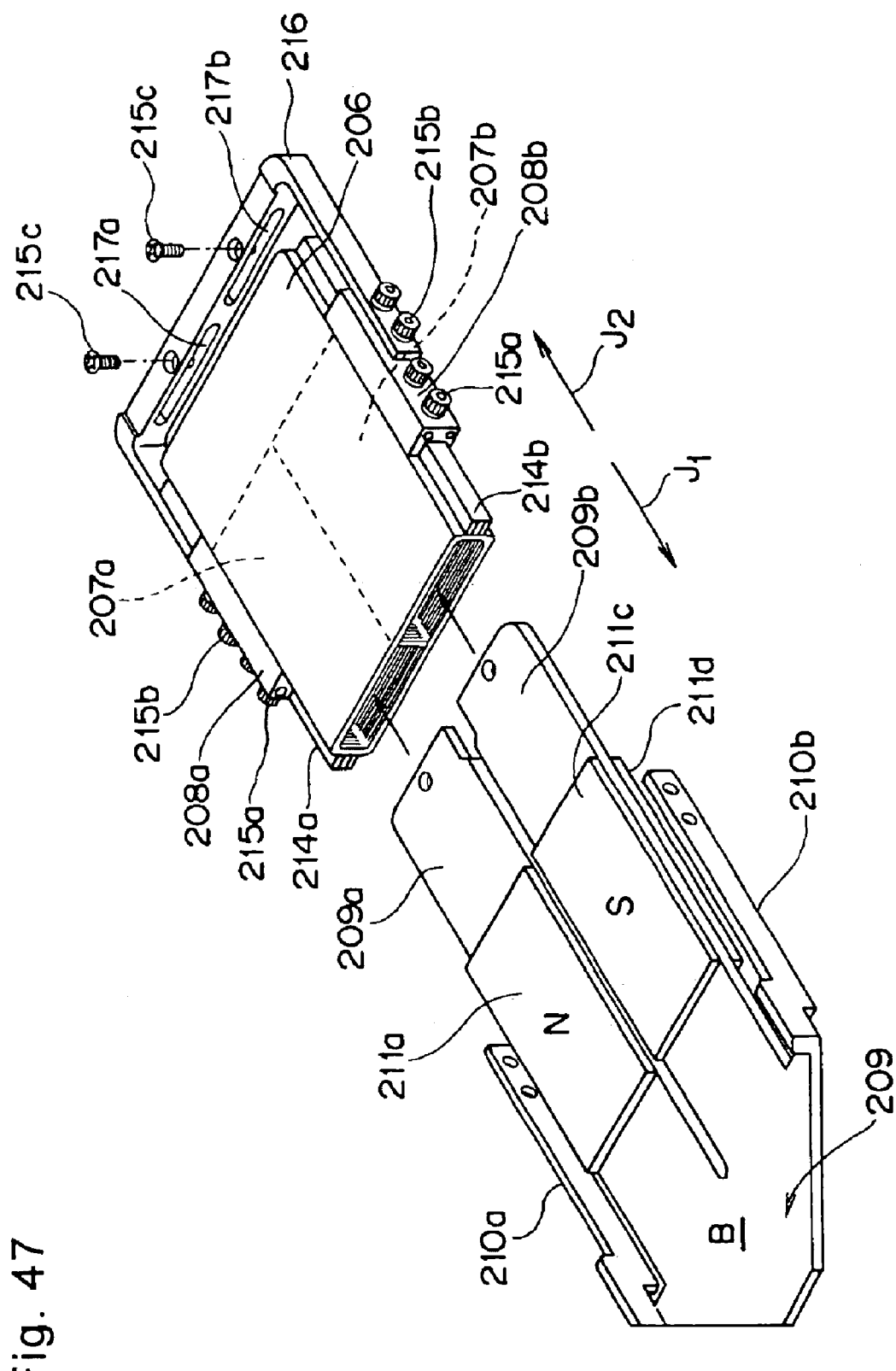
FIG. 47 is an exploded perspective view of a linear motor which is a first example of an up-and-down driver device according to the third embodiment of the present invention.

Also, there has conventionally been provided, in need for smaller size, a coreless motor in which, as shown in FIG. 46A, 46B, is so constructed that coreless coils 103 are placed around a rotor 101, with a stator yoke 104 placed on an outer periphery of the coils 103, wherein a rotating magnetic field is generated to rotationally drive the rotor 101 as in the case of FIG. 45.

However, the coreless motor is, on one hand, capable of being downsized, as compared with the brushless motor shown in FIG. 45, and on the other hand, poor at magnetic efficiency because of its having no iron core, thus resulting in an issue that high torque output cannot be achieved. Further, an attempt to obtain as high a torque as possible would only cause the rotor 101 and the coils 103 to be made longer in length in an axial direction of the rotor 101 (Y-axis direction); hence resulting in a low degree of freedom of design as it stands.

FIRST EXAMPLE

Thus, as a first example of the θ-turn driving motor 25A according to the third embodiment of the present invention, its object is to provide a brushless motor which can be downsized more than the brushless motor shown in FIG. 45, and yet which is better at magnetic efficiency and higher in torque output than the coreless motor of FIGS. 46A, 46B.

FIGS. 39 to 42 show this first example of a brushless motor according to the third embodiment of the present invention.

Figure 39:
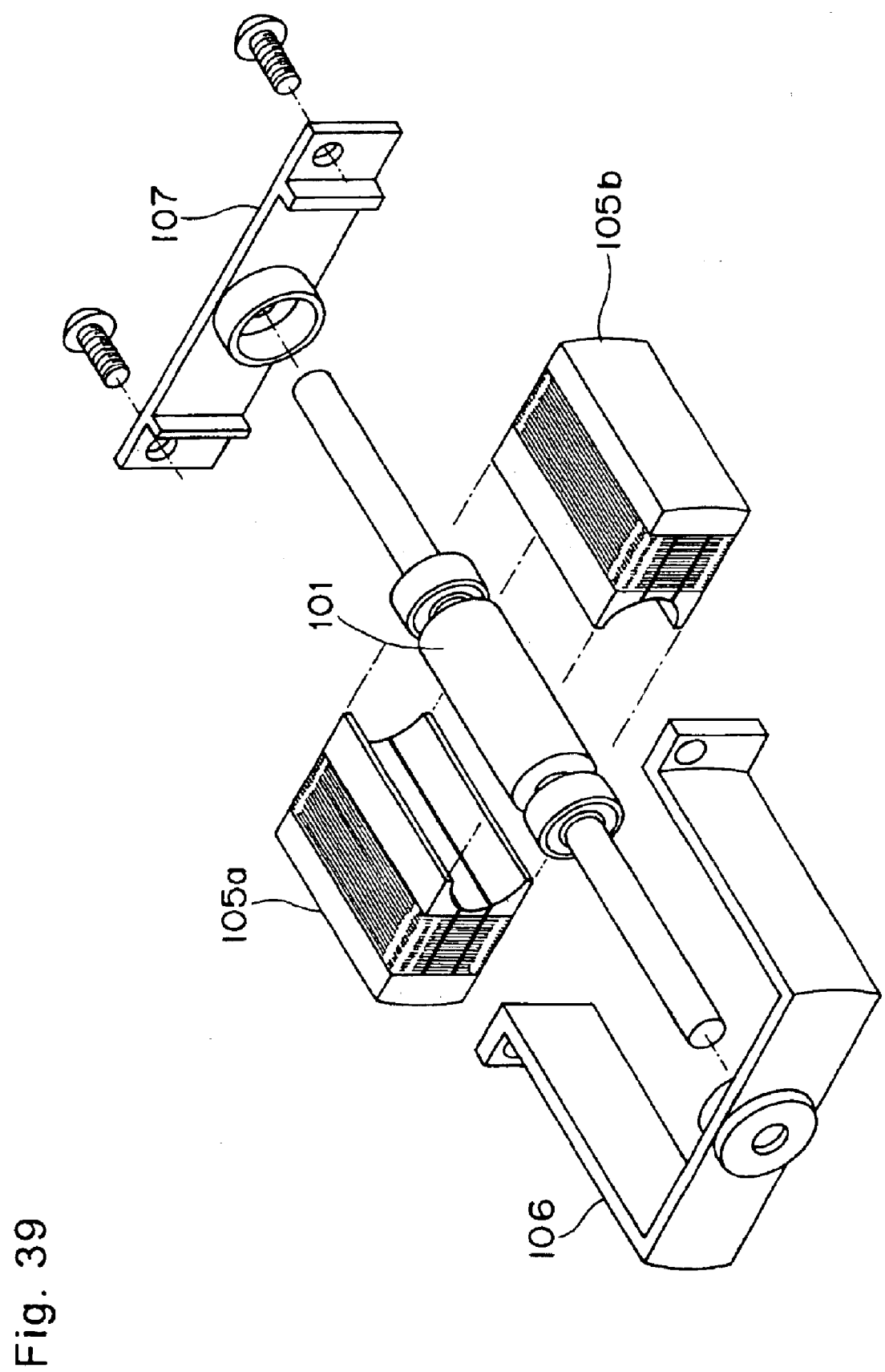
FIG. 39 is an exploded perspective view of a mechanical part of a brushless motor which is a first example of a θ-turn driving motor according to the third embodiment of the present invention.
Figure 40:
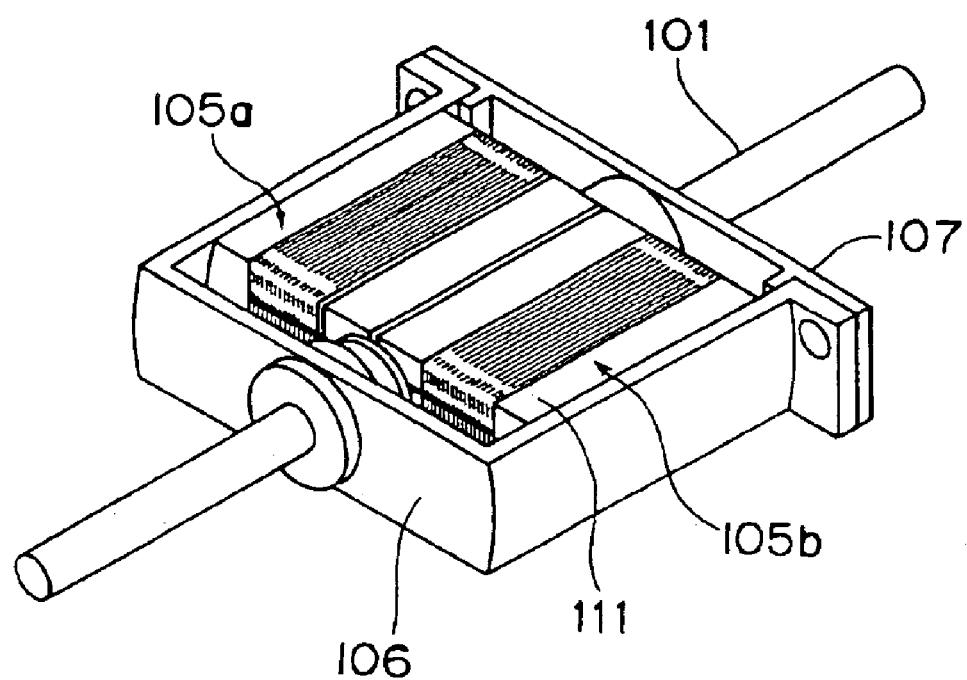
FIG. 40 is a perspective view of an assembly of the first-example brushless motor of FIG. 39.

This brushless motor according to the third embodiment of the present invention, as shown in FIG. 39, is assembled of a rotor 101, generally flat first, second stator blocks 105a, 105b, a holder body 106, and a holder plate 107, a main part of which is shown in FIG. 40.

Figure 41:
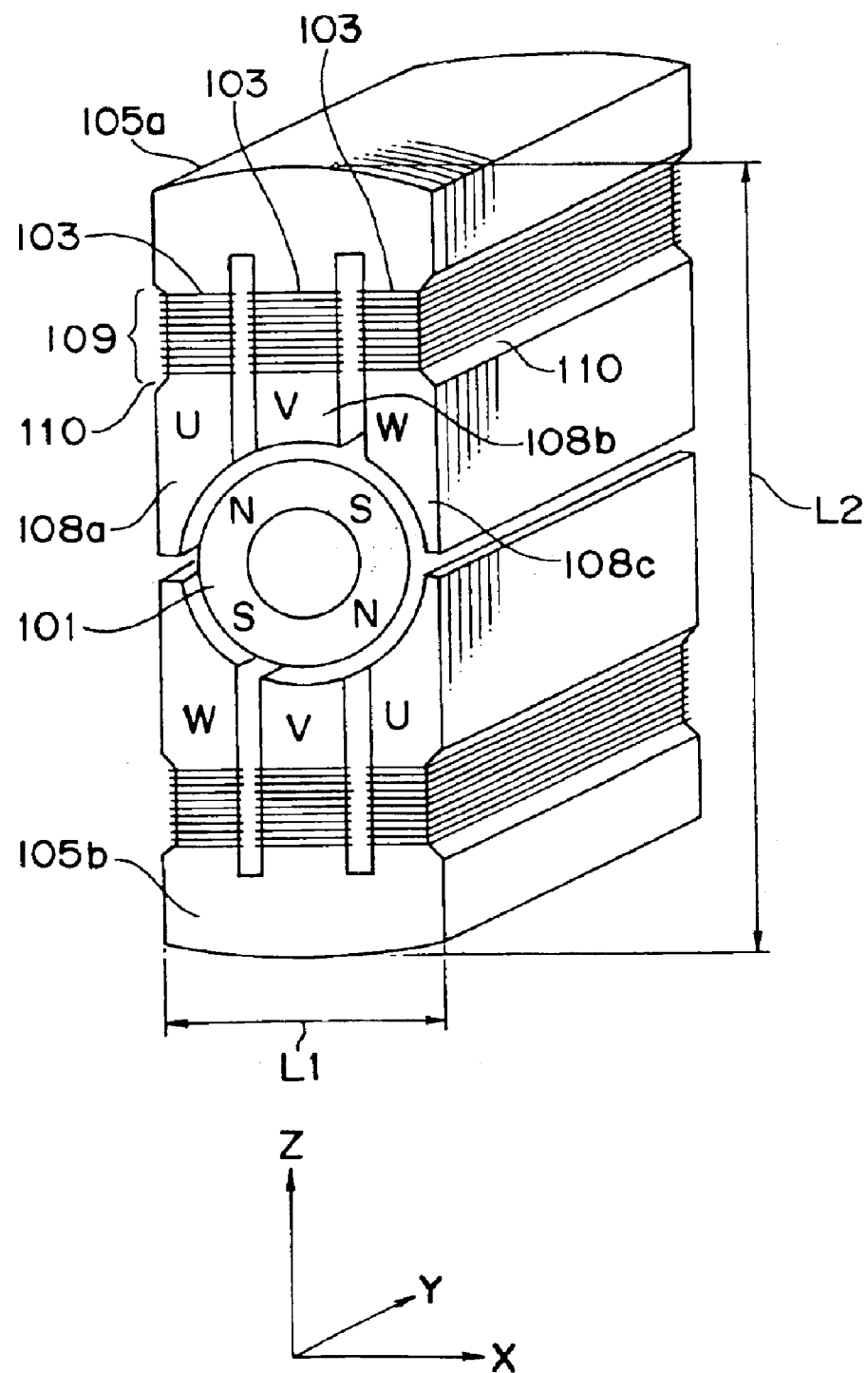
FIG. 41 is an enlarged sectional view of the first-example brushless motor of FIG. 39.
Figure 42:
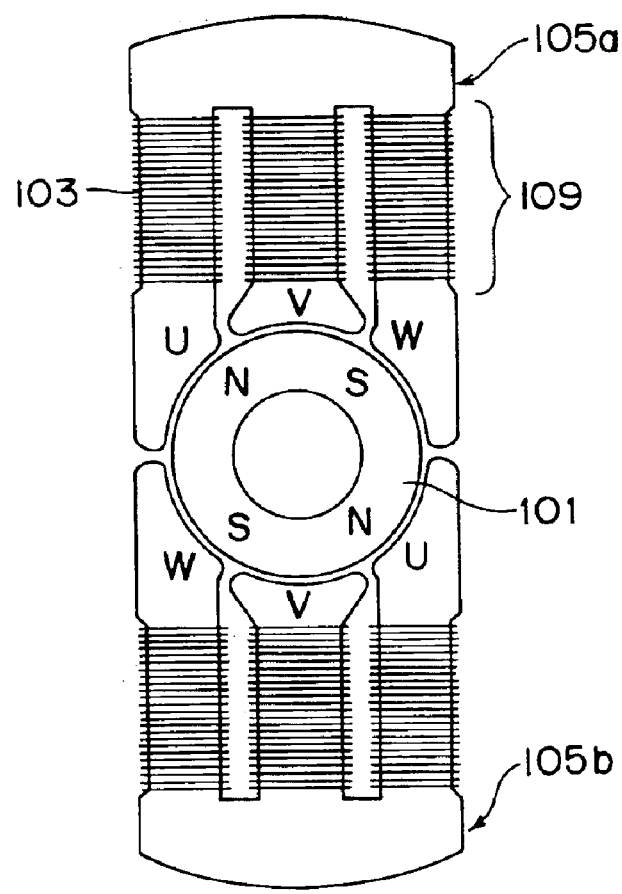
FIG. 42 is an enlarged sectional view showing a concrete configuration example of the first-example brushless motor of FIG. 39.

The rotor 101 is magnetized peripherally to a plurality of poles. Each of the first, second stator blocks 105a, 105b, as shown in FIG. 41, is made by laminating a plurality of magnetic steel plates, each punched into a generally E-shape form, and having three teeth 108a, 108b, 108c. Fore ends of the teeth are formed into a circular arc shape running along an outer periphery of the rotor 101. Each of the teeth 108a, 108b, 108c is wound with a coil 103, wherein portions of the teeth at which the coils 103 are wound are referred to as tooth winding portions 109. Winding grooves 110 are formed at the tooth winding portions 109 of the teeth 108a, 108c.

Concretely, fore ends of the teeth 108a–108c are so formed that circular-arc surfaces confronting the outer periphery of the rotor have a symmetrical 60° slot pitch as shown in FIG. 41.

In an electric circuit, position of the rotor 101 is detected by a separate sensor (not shown) such as a magnetic sensor, and energization timing to the coils of individual phases, UVW, are controlled in response to position of the rotor 101 so that a rotating magnetic field is generated from the stator blocks 105a, 105b to thereby rotationally drive the rotor 101.

Each stator block 105a, 105b has a thickness by laminating magnetic steel plates along an axial direction of the rotor 101 (the Y-direction in FIG. 41), with the teeth 108a–108c parallel to one another, and a shape along an end face of the rotor is a flat type one such that a first length L1 formed by interconnecting points of a stator, constructed from the stator blocks, corresponding to 0° and 180° about the axis of the rotor (X-axis direction shown in FIG. 41) is shorter than a second length L2 formed by interconnecting points of the stator, constructed from the stator blocks, corresponding to 90° and 270° about the axis of the rotor (Z-axis direction shown in FIG. 41). Thus, this brushless motor is smaller in size, and successful in magnetic efficiency because it is not a coreless motor, as compared with the conventional brushless motor shown in FIG. 45.

Further, larger output torque can be attained by setting longer the tooth winding portions 109 of the teeth 108a–108c in the Z-axis direction as shown in FIG. 41 to thereby enhance a magnetic field, or by forming longer the rotor 101 and the stator blocks 105a, 105b in the Y-axis direction as shown in FIG. 41. Thus, whereas a degree of freedom for designing the conventional coreless motor shown in FIGS. 46A, 46B is in one way of the Y-axis direction, a degree of freedom of design can be provided in two ways of the Y-axis direction and the Z-axis direction in this third embodiment, so that necessary torque can be outputted with an appropriate form suited to applications.

Also, in a case where the winding grooves 110 to serve as the tooth winding portions 109 are formed thicknesswise (in the Y-axis direction) on a side surface 111 crossing a direction of the first length of the first, second stator blocks 105a, 105b as described above, and where an outermost peripheral surface 112 of the coils 103 wound on the winding grooves 110 is positioned so as to be flush with the side surface 111, or inwardly of the side surface, a width of the brushless motor in the X-axis direction can be further reduced.

SECOND EXAMPLE

Figure 43:
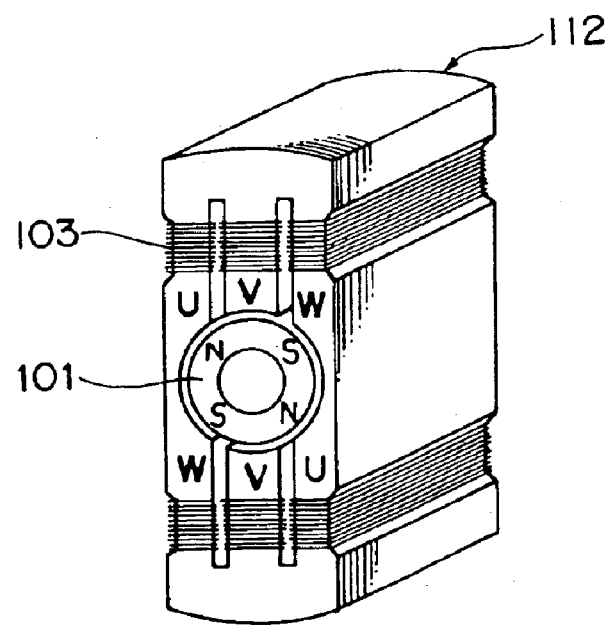
FIG. 43 is a perspective view of a stator of a brushless motor which is a second example of the θ-turn driving motor according to the third embodiment of the present invention.

FIG. 43 shows a brushless motor, which is a second example of the θ-turn driving motor 25A according to the third embodiment of the present invention.

Flat-type stators of the brushless motor according to the first example are constructed by first, second stator blocks 105a, 105b that come into contact with each other at a boundary that interconnects points of the stator, constructed from these stator blocks, corresponding to 0° and 180° about the axis of the rotor. The second example, as shown in FIG. 43, differs from the first example only in that the stator is constructed by a single stator block 112, with the rest of the constitution being the same as in the first example.

THIRD EXAMPLE

Figure 44A:
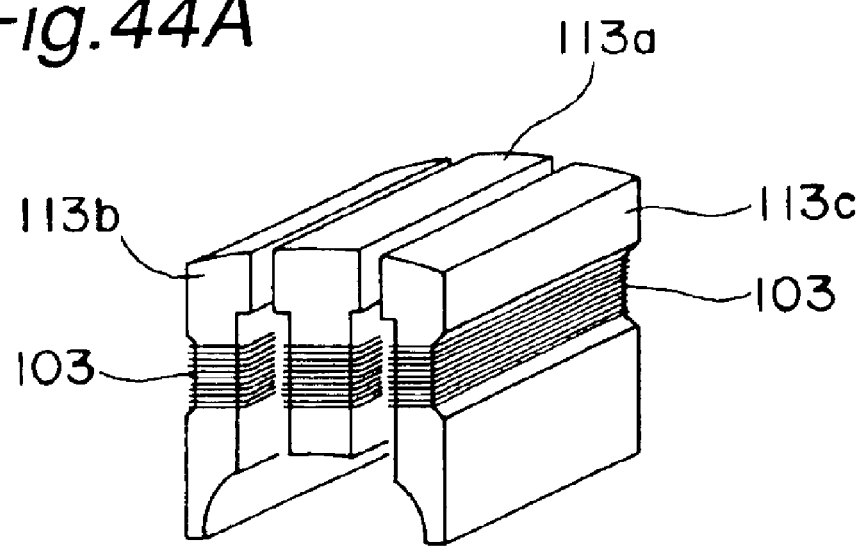
FIGS. 44A and 44B are an exploded perspective views of a stator block of the brushless motor that is a third example of the θ-turn driving motor according to the third embodiment of the present invention, and an enlarged sectional view of the third example, respectively.
Figure 44B:
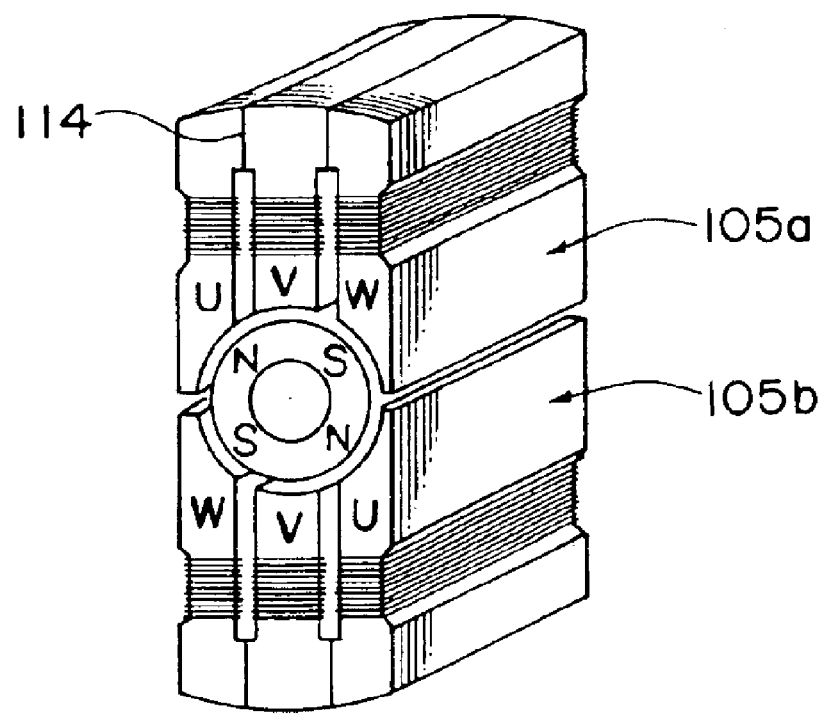

FIGS. 44A, 44B show a brushless motor, which is a third example of the θ-turn driving motor 25A according to the third embodiment of the present invention.

Whereas first, second stator blocks 105a, 105b of the brushless motor according to the first example have been constructed by forming three teeth 108a–108c in each block, it is also possible that tooth blocks 113a, 113b, 113c as shown in FIG. 44A are brought into contact with and joined together at joints 114 so as to form magnetic paths at both end portions of tooth winding portions 109 as shown in FIG. 44B. Otherwise, the brushless motor is the same as the first example.

In this case, work of winding coils on tooth winding portions 109 becomes easier.

As shown above, in the brushless motor as a θ-turn driving motor 25A according to the third embodiment of the present invention, the fore ends of the individual teeth of the stators are formed into circular-arc surfaces extending along the outer periphery of the rotor, and individual teeth winding portions are formed parallel to one another. Thus, as compared with the conventional brushless motor in which the rotor is surrounded by an annular stator, the brushless motor can be made smaller in size than the brushless motor shown in FIG. 45, and yet the brushless motor can be made better in magnetic efficiency and higher in torque output than coreless motors.

An up-and-down driver device 26A according to the third embodiment of the present invention is described below with reference to FIGS. 47 to 52.

Before explanation of the up-and-down driver device 26A according to the third embodiment proceeds, a conventional voice-coil type linear motor is first described as an example in terms of its issues.

Figure 53:
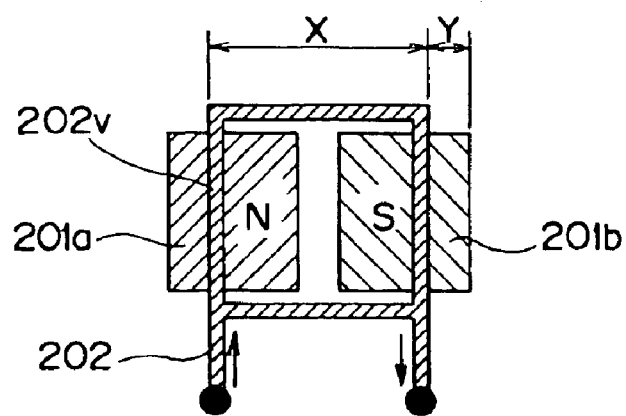
FIG. 53 is a plan view of a voice-coil type linear motor according to the prior art.

FIG. 53 shows a basic voice-coil type linear motor.

In this voice-coil type linear motor, magnets 201a, 201b as stationary-side magnets are located on a lower side, and a frame coil 202 is located on its upper side with gaps between the magnets 201a, 201b so as to be movable left and right in this case of FIG. 53. For the magnet 201a, its face opposite the frame coil 202 is magnetized to an N pole. For the magnet 201b, its face opposite the frame coil 202 is magnetized to an S pole.

When electric current is passed through the frame coil 202 in the direction of arrows, a magnetic action of the magnets 201a, 201b and a magnetic field generated in a vertical interval 202v of the frame coil 202 causes movable-side frame coil 202 to be driven by a distance Y to the right side, in this case, against the magnets 201a, 201b.

Figure 54:
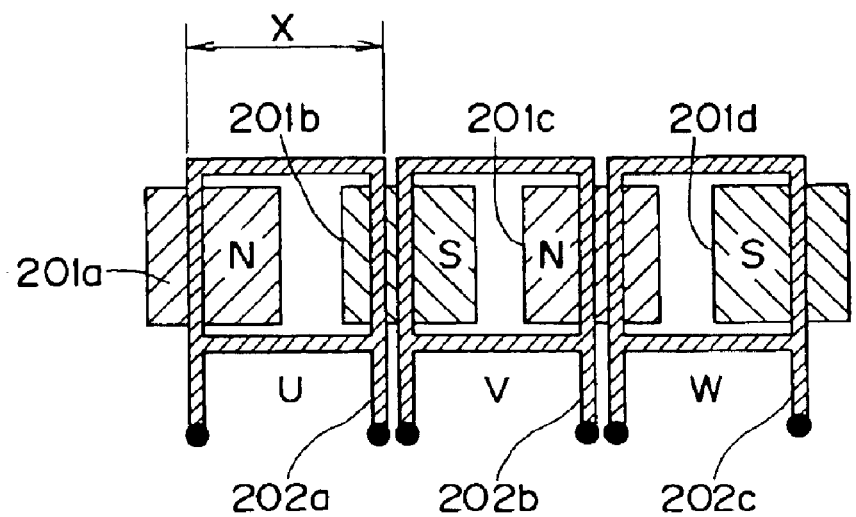
FIG. 54 is a plan view of a three-phase type linear motor according to the prior art.

FIG. 54 shows a case of three phases (UVW), wherein a magnet 201a magnetized to an N pole, a magnet 201b magnetized to an S pole, a magnet 201 c magnetized to an N pole, and a magnet 201d magnetized to an S pole, all of which are so magnetized at their upper surfaces, are placed at specified intervals on a stationary side, and over these members, frame coils 202a, 202b, 202c are located on a movable side, movable left and right in this FIG. 54, with gaps provided between the magnets 201a–201d on an upper side of the frame coils.

When electric current is passed through the frame coils 202a, 202b, 202c, the same magnetic action as described above causes the movable side to be driven, in this case, laterally.

Figure 55:
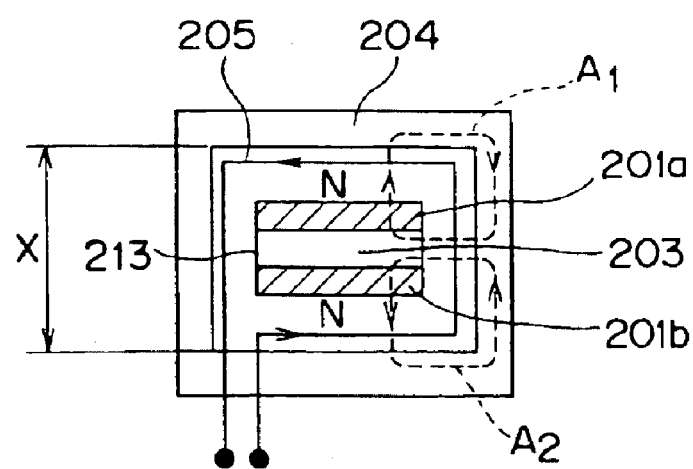
FIG. 55 is a side view of another example of the linear motor according to the prior art.

As another example of the prior art, magnets 201a, 201b are fitted on both sides of a central pole 203 as shown in FIG. 55, a yoke 204 is provided so as to surround an outer peripheral portion thereof, and a frame coil 205 is disposed on the yoke 204, which is a movable side, so as to surround the central pole 203. An attraction-and-repulsion action of a magnetic field generated by passage of electric current through the frame coil 205 and generated magnetic fields A1, A2 of the magnets 201a, 201b causes the movable side to move in a direction perpendicular to the drawing sheet of FIG. 55.

In the above structures of the prior art as described above, in all cases, a span section X of the frame coils 202a–202c and 205 do not contribute to a thrust and result in a loss.

Also, in the type shown in FIG. 55, magnetic flux is concentrated at the central pole 203 so that magnetic saturation is more likely to occur, thereby posing an issue that high torque output is unattainable.

The up-and-down driver device 26A according to the third embodiment of the present invention is proposed to provide a linear motor of higher thrust than conventional counterparts. That is, the up-and-down driver device 26A according to this third embodiment is a linear motor which is driven to slide in such a direction that stationary side and movable side located in opposition to each other are prevented from changing in a gap of opposition by magnetic action.

FIRST EXAMPLE

FIGS. 47 to 50 show a linear motor which is a first example of the up-and-down driver device 26A according to the third embodiment of the present invention. It is noted that although the linear motor for actual use is made up of four coils for larger thrust, the following description is made for a case of two coils. Also in the following description, the coils correspond to first, second teeth 209a, 209b. A pair of linear guides correspond to guide rails 214a, 214b. A movable-side member (e.g., outer yoke 206) corresponds to a movable magnet.

Figure 48:
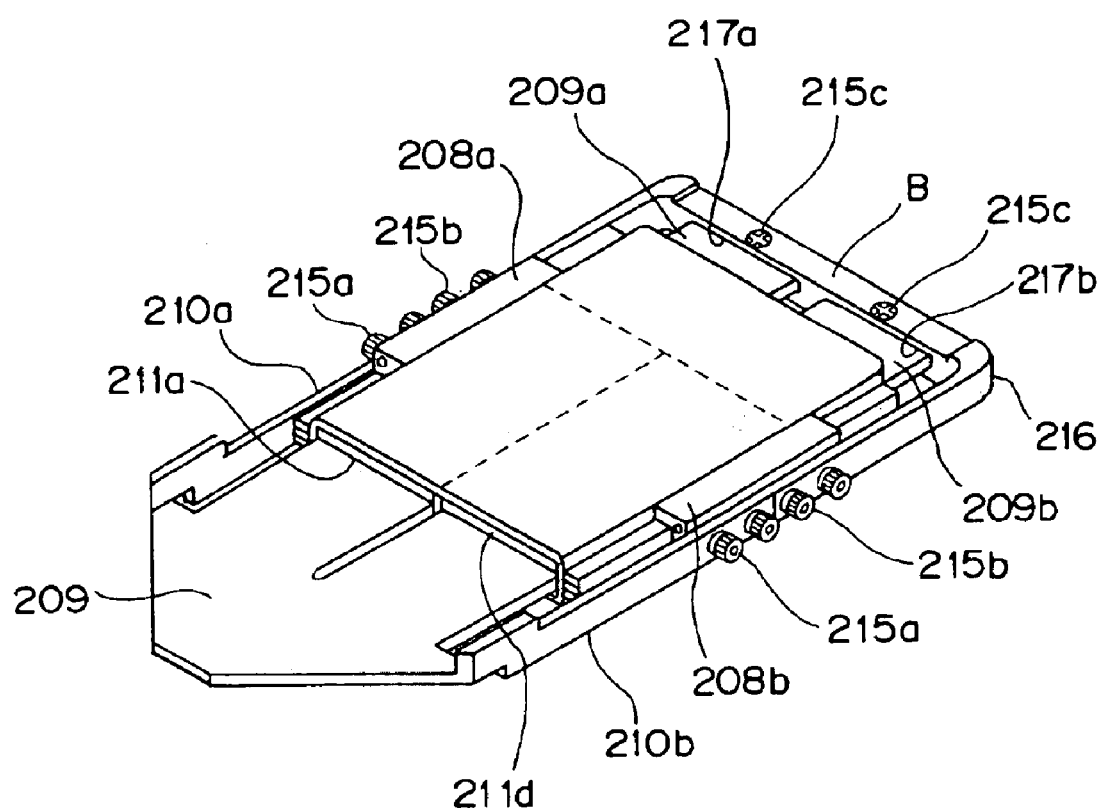
FIG. 48 is a perspective view showing an assembled state of the first-example linear motor.
Figure 49:
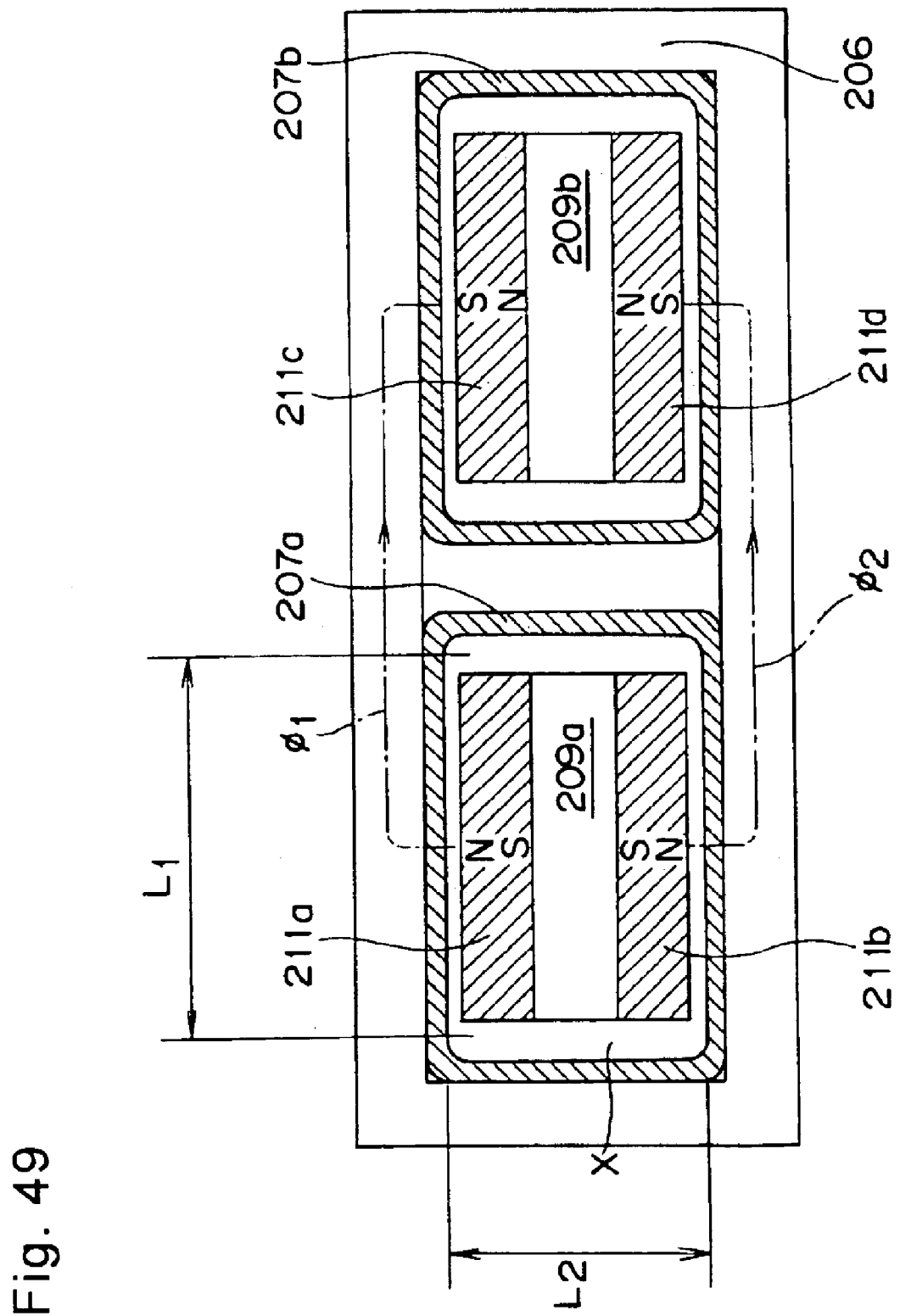
FIG. 49 is an enlarged sectional view showing a part of an assembled state of the first-example linear motor.

This linear motor according to the first example is an internal-magnet type linear motor, in which frame coils 207a, 207b are provided inside an outer yoke 206 on a stationary side. Guide rails 214a, 214b are provided on side faces of the outer yoke 206, and sliders 208a, 208b are movably fitted to the guide rails 214a, 214b. Support arms 210a, 210b of an inner yoke 209, which is a movable side, are attached with screws 215a on one-side ends of the sliders 208a, 208b as shown in FIG. 48, and the inner yoke 209 is supported so as to be slidable in such directions as to pass through cylindrical outer yoke 206 (directions of arrows J1, J2). Also, a back yoke 216 is attached with screws 215b to other-side ends of the sliders 208a, 208b.

The inner yoke 209 is of such a U-shape that the first, second teeth 209a, 209b are connected to each other with a base-end magnetic communicating portion B. As shown also in FIG. 49, S poles that are one-side poles of first, second magnets 211a, 211b are stuck to upper and lower surfaces of the first tooth 209a, respectively, so that the upper and lower surfaces arc made into N poles, while N poles that are other-side poles of third, fourth magnets 211c, 211d are stuck to upper and lower surfaces of the second tooth 209b, respectively, so that these upper and lower surfaces are made into S poles.

A frame coil 207a is provided inside the outer yoke 206 so as to surround an exterior of the first tooth 209a with a gap therebetween, and a frame coil 207b is provided inside the outer yoke 206 so as to surround an exterior of the second tooth 209b with a gap therebetween.

Further, fore ends of the first, second teeth 209a, 209b are inserted into recessed portions 217a, 217b of the back yoke 216 and further engaged with screws 215c as shown in FIG. 48, wherein the back yoke 216 serves as the magnetic communicating portion B. In this way, the linear motor according to the first example is assembled.

With the constitution as described above, as shown in FIG. 50, a magnetic flux φ1 radiated from the N pole of the first magnet 211a flows toward the second tooth 209b adjoined by the outer yoke 206, flows into the S pole of the third magnet 211c, further flows from the N pole of the third magnet 211c into the second tooth 209b, further flows from the second tooth 209b via the magnetic communicating portion B into the first tooth 209a, and reaches the S pole of the first magnet 211a. The magnetic flux φ1 flows in circulation.

Similarly, a magnetic flux φ2 radiated from the N pole of the second magnet 211b flows toward the second tooth 209b adjoined by the outer yoke 206, flows into the S pole of the fourth magnet 211d, further flows from the N pole of the fourth magnet 211d into the second tooth 209b, further flows from the second tooth 209b via the magnetic communicating portion B into the first tooth 209a, and reaches the S pole of the second magnet 211b. The magnetic flux φ2 flows in circulation.

Figure 50:
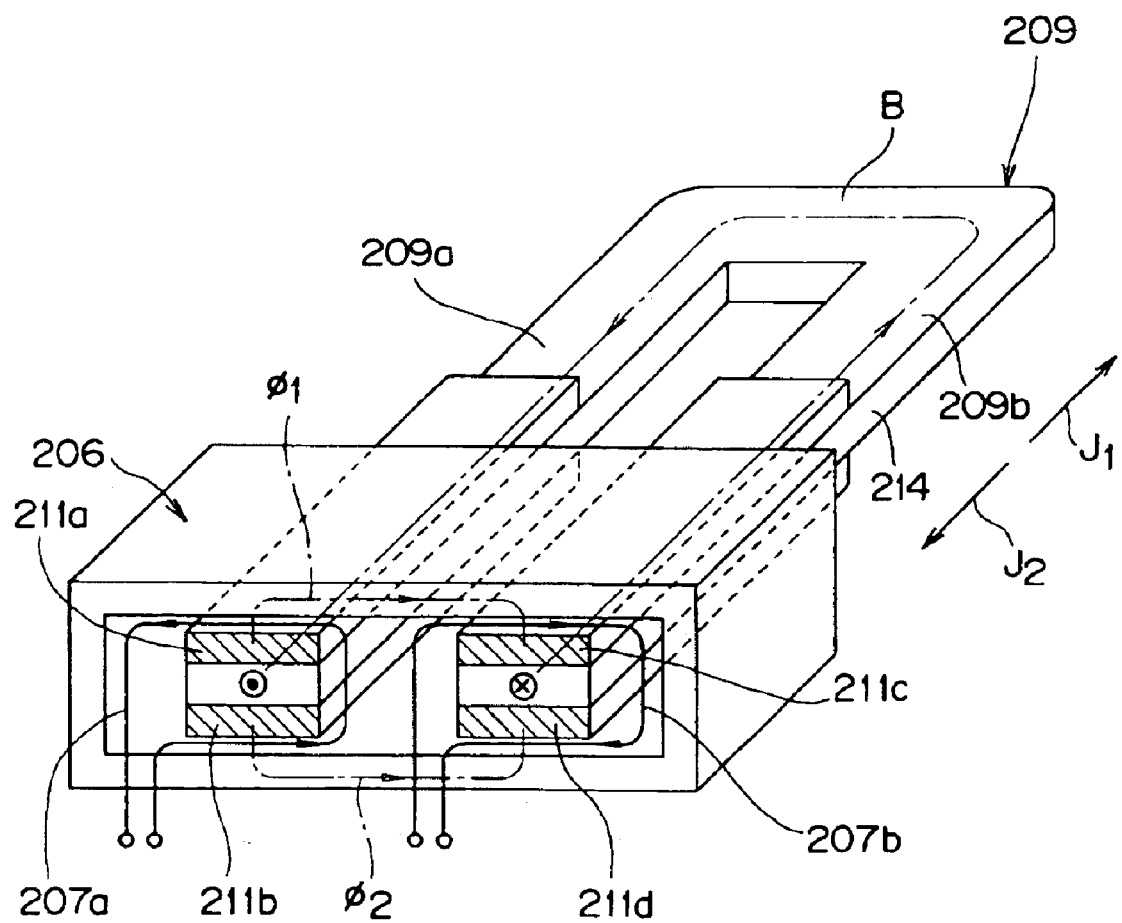
FIG. 50 is an explanatory view showing a state of magnetic fluxes of the first-example linear motor.

In this state, with electric current passed through the frame coils 207a, 207b in a direction shown in FIG. 50, magnetic fields generated by the frame coils 207a, 207b act on the magnetic fluxes φ1, φ2, causing the inner yoke 209 to be moved along the direction of arrow J1.

In this connection, the frame coils 207a, 207b each have an opening face having a rectangular shape such that a length L1 of its side line opposite a corresponding magnet is longer than a length L2 of its span section X, thus allowing large thrust to be obtained. Still, because the inner yoke 209 has driving force generated at two members, i.e. the first, second teeth 209a, 209b, thrust larger than that of the prior-art system shown in FIG. 55 can be obtained.

Further, the first, second teeth 209a, 209b have less tendency of such magnetic saturation as seen in the constitution of FIG. 55, thus being capable of obtaining thrust that changes nearly proportionally over a wide range of strength of magnetic fields generated by the frame coils 207a, 207b. More concretely, in FIG. 55, which shows a prior-art example, magnetic fluxes A1, A2 circulatively flow from yoke 204 into a small side face 213 of central pole 203, resulting in magnetic saturation. On the other hand, in the first example, as shown in FIG. 50, magnetic fluxes φ1, φ2 aggressively flow into upper and lower faces (surfaces on which the first to fourth magnets are arranged) larger in area than side faces of the first, second teeth 209a, 209b, thus allowing such magnetic saturation as described above to be reduced to a great extent.

In this first example, the magnetic communicating portion B has been provided at both ends of the first, second teeth 209a, 209b. However, by taking into consideration assembly concerns, the magnetic communicating portion B may also be provided at only base ends of the first, second teeth 209a, 209b, with other ends being opened.

SECOND EXAMPLE

Figure 51:
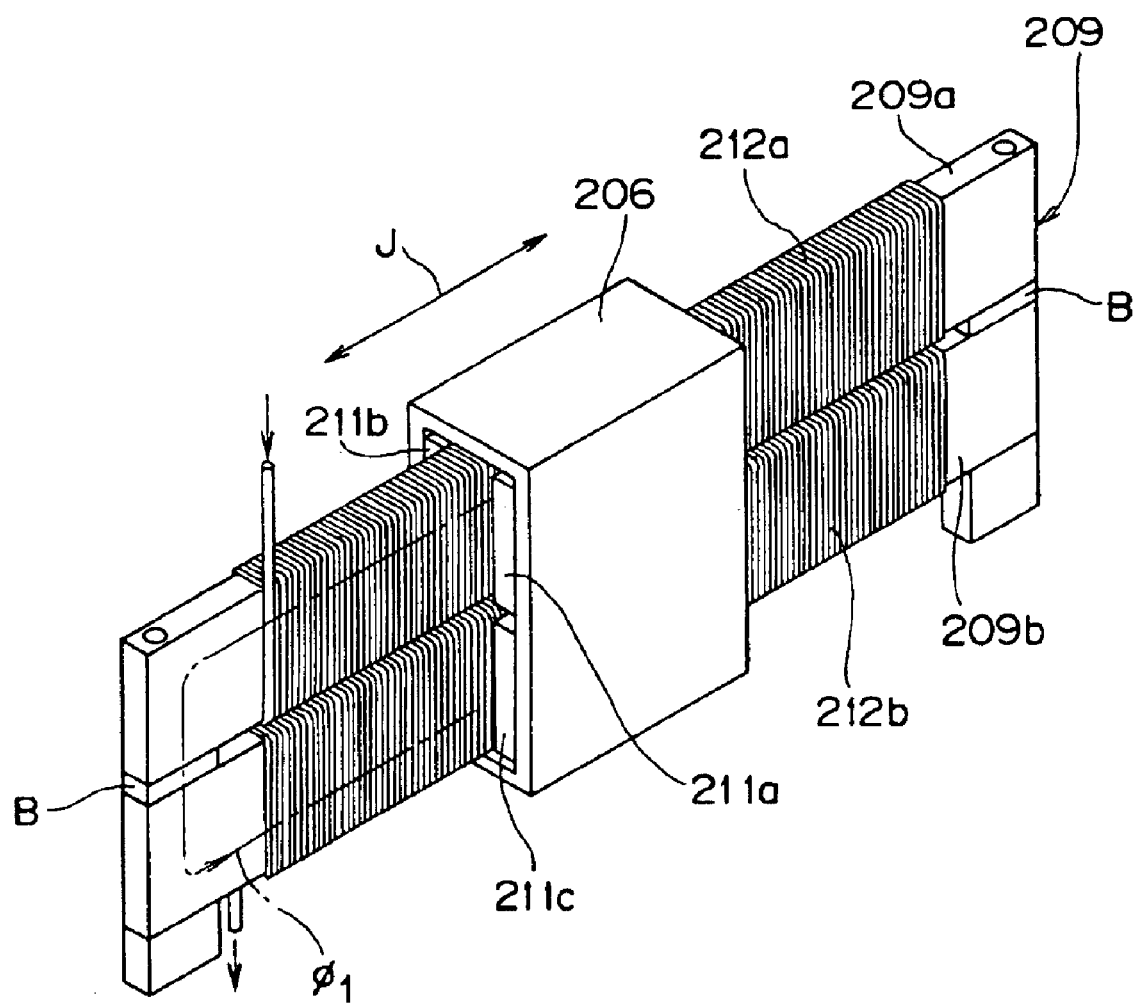
FIG. 51 is an appearance perspective view of a linear motor which is a second example of the up-and-down driver device according to the third embodiment of the present invention.
Figure 52:
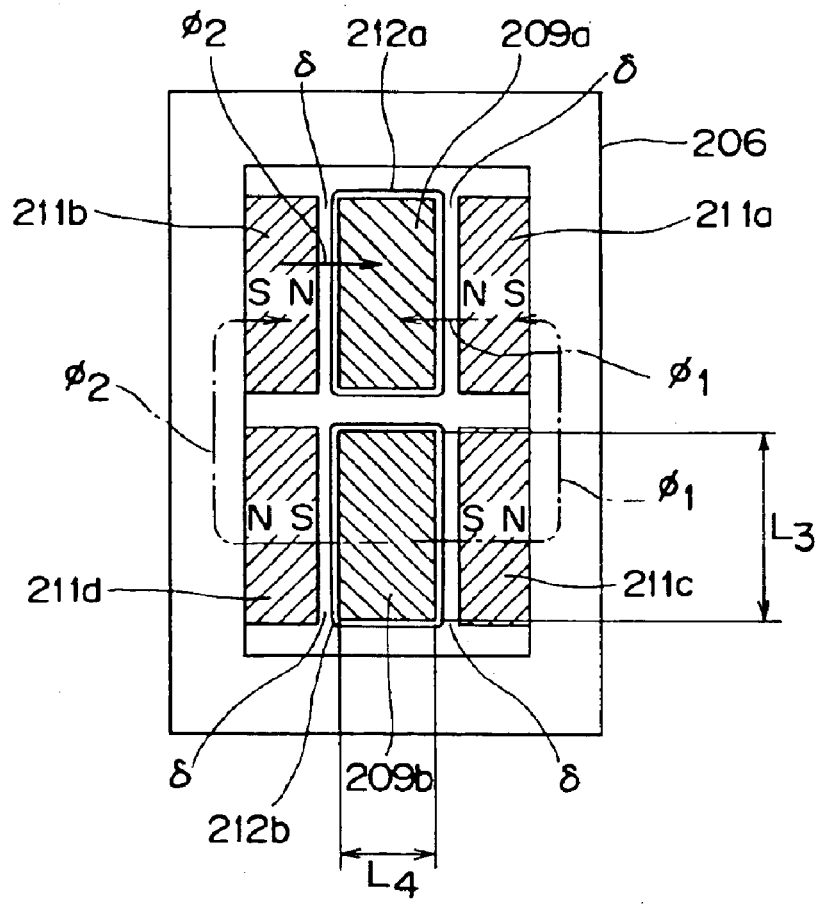
FIG. 52 is an explanatory view showing a state of magnetic fluxes of the second-example linear motor.

FIGS. 51 and 52 show a linear motor which is a second example of the up-and-down driver device 26A according to the third embodiment of the present invention.

This linear motor according to the second example is an exterior-magnet type linear motor, in which an outer yoke 206 moves relative to an inner yoke 209.

The inner yoke 209 has first, second teeth 209a, 209b, both ends of which are connected to each other with magnetic communicating portion B, and the outer yoke 206 externally surrounds the first, second teeth 209a, 209b, with the outer yoke being supported so as to be slidable in a longitudinal direction of the first, second teeth 209a, 209b (direction of arrow J) with a gap between the teeth and the outer yoke.

Inside the outer yoke 206, first, second, third, fourth magnets 211a, 211b, 211c, 211d are provided opposite both faces of the teeth so that faces of two magnets opposed to faces of one tooth are of a single pole different in polarity from faces of the other two magnets opposed to faces of the other tooth.

More specifically, as shown in FIG. 52, S poles of the first, second magnets 211a, 211b are stuck to opposed interior faces of the outer yoke 206 so that one side of the first tooth 209a becomes one polarity, which is the N pole. N poles of the third, fourth magnets 211c, 211d are stuck to the opposed interior faces of the outer yoke 206 so that one side of the second tooth 209b becomes the other polarity, which is the S pole.

A coil 212a is arranged and concentratedly wound on the first tooth 209a, and a coil 212b is arranged and concentratedly wound on the second tooth 209b, wherein a gap δ is formed between the coil 212a and the first, second magnets 211a, 211b and between the coil 212b and the third, fourth magnets 211c, 211d.

As a result of such a constitution as described above, magnetic fluxes φ1, φ2 radiated from the N poles of the first, second magnets 211a, 211b flow through the first tooth 209a toward the magnetic communicating portion B, and flow from the second tooth 209b into the S poles of the third, fourth magnets 211c, 211d, thus reaching from the N poles of the third, fourth magnets 211c, 211d via the outer yoke 206 to the S poles of the first, second magnets 211a, 211b. Thus, the magnetic fluxes φ1, φ2 flow in circulation.

In this state, with electric current passed through the frame coils 212a, 212b, magnetic fields generated by the frame coils 212a, 212b act on the magnetic fluxes φ1, φ2, causing the inner yoke 209 to be moved along the direction of arrow J responsive to a direction of current passage.

In this connection, the first, second teeth 209a, 209b each have a rectangular shape such that a length L3 of its side line opposite to a corresponding one of the first to fourth magnets 211a–211d is longer than a length L4 of a connection side connecting opposite sides, so that the coils 212a, 212b wound on these first, second teeth 209a, 209b are relatively shorter in their span sections X. Thus, as in the first example, a thrust larger than that of the prior-art system shown in FIG. 55 can be obtained.

Although both ends of the teeth 209a, 209b have been connected to each other with the magnetic communicating portion B in this second example, one-side ends thereof may be opened.

In addition, although the first, second teeth 209a, 209b have been provided as the teeth of the inner yoke 209 in the foregoing examples, three or more teeth may also be provided in parallel with a similar constitution.

As shown above, with use of the linear motor of the up-and-down driver device 26A according to the third embodiment of the present invention, thrust higher than that of conventional counterparts can be attained by combination of an inner yoke which has a plurality of teeth with a magnet attached to each of the teeth, and an outer yoke in which frame coils are attached.

Also, with use of the linear motor of the up-and-down driver device 26A according to the third embodiment of the present invention, thrust higher than that of conventional counterparts can be attained by combination of an inner yoke which has a plurality of teeth with a coil wound on each of the teeth, and an outer yoke in which magnets are attached.

In addition, combining any arbitrary embodiments from among the foregoing various embodiments, as required, makes it possible to produce their individual effects.

According to the present invention, actuators, or a nozzle up-and-down device and a nozzle turning device, capable of performing up-and-down operations and turn correction for every component suction device, i.e., every suction nozzle, can be provided, so that loads on one actuator can be reduced. A mounting head on which such actuators are mounted can fulfill an improvement in operating acceleration without increasing a size of the motor. As a result of this, throughput can be improved.

Also, since the nozzles can be subjected to turning operations about their axes at any arbitrary time, independently of one another, by their respective nozzle turning devices, it is possible that with components whose placing posture angle is largely different from a component posture angle at a component feed position by 90°, 180° or the like, components can preliminarily be turned to their placing posture angles by driving the nozzle turning devices after component sucking and holding is performed by the nozzles, and before component recognition is performed. As a result of this, all the components are located at their placing posture angles before component recognition, thus reducing a turning amount for correction subsequent to component recognition so that adjustment to the placing posture angles can be accomplished with proportionally higher precision. Also, effects of distortions due to thermal changes of the nozzles or the like can be minimized, so that placing precision can be improved.

Also, based on information as to the nozzles and thicknesses of components to be sucked by the nozzles, up-and-down amounts for the nozzles by the nozzle up-and-down devices are individually adjusted by taking into consideration the thicknesses of the components to be sucked by the nozzles. Thus, even with largely different thicknesses of components, performing batch suction of a plurality of components by a plurality of nozzles never causes damage to the components. Also, based on information as to the nozzles and thicknesses of components to be sucked by the nozzles, up-and-down amounts for the nozzles are individually adjusted by the nozzle up-and-down devices so that bottom faces of the components sucked by the nozzles are adjusted to a uniform height or to within a certain range. By doing so, batch recognition of components that are largely different in height from one another is enabled.

Further, since the nozzles can be subjected to a turning operation, about their axes at any arbitrary time independently of one another, it is possible that with components whose placing posture angle is largely different from a component posture angle at a component feed position by 90°, 180° or the like, components can preliminarily be turned to their placing posture angles by driving the nozzle turning devices after component sucking and holding is performed by the nozzles and before component recognition is performed. As a result of this, any decrease in mounting cycle time can be prevented as compared with a case where a turning operation is performed after component recognition and before component placement.

Further, with the nozzle up-and-down device arranged below the nozzle turning device, turning drive of the nozzle turning device would cause the nozzle up-and-down device to turn along with the nozzle, in which case wiring lines for the nozzle up-and-down device and the like would be complicated in structure. However, in the present invention, since the nozzle up-and-down device is located above the nozzle turning device, turning drive of the nozzle turning device does not cause the nozzle up-and-down device to turn along with the nozzle, in which case such issues as described above do not occur.

Also, in a case where the nozzle up-and-down device is so structured that a magnetic-circuit forming member and a mechanism forming member are dividedly provided, those members can be made of different materials and combined together so that the magnetic-circuit forming member alone is made of steel material and the mechanism forming member is made of aluminum alloy or the like, thus making it possible to reduce weight and thickness of the device.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for mounting components, comprising:
   via suction nozzles mounted on a mounting head of a component mounting apparatus, sucking and holding components, respectively; then
   under control of drivers provided on a side of said mounting head, individually and independently turning said suction nozzles, respectively, thereby individually and independently turning said components to placement posture angles, respectively; then
   recognizing postures of said components, respectively; then
   correcting postures of said components, respectively, based on recognition results corresponding to the recognized postures, respectively; and then
   placing said components onto a circuit-forming body.

2. The method according to claim 1, wherein
   individually and independently turning said components to placement posture angles comprises simultaneously individually and independently turning said components to said placement posture angles.

3. The method according to claim 1, wherein
   individually and independently turning said components to placement posture angles comprises individually and independently turning said components to said placement posture angles immediately after sucking and holding said components via said suction nozzles.

4. Component suction devices for sucking components that are to be mounted onto a circuit-forming body, each of said component suction devices being mounted on the same mounting head and comprising:
   a suction nozzle for sucking and holding a component;
   a nozzle turning device for holding said suction nozzle and turning said suction nozzle;
   a nozzle up-and-down device located above said nozzle turning device and connected to said suction nozzle, for moving said suction nozzle up and down along an axial direction of said suction nozzle; and
   a driver for respectively controlling said nozzle turning device and said nozzle up-and-down device,
   wherein said suction nozzles of said component suction devices are independently controllable for recognition and correction of the components sucked and held thereby.

5. The component suction devices according to claim 4, wherein said suction nozzles of said component suction devices are linearly arranged along a direction that is orthogonal to the axial direction of said suction nozzles.

6. The component suction devices according to claim 5, wherein
said nozzle up-and-down device includes an up-and-down linear motor for moving said nozzle turning device up and down along the axial direction of said suction nozzle, such that when said nozzle turning device is moved up and down by said up-and-down linear motor said suction nozzle is moved up and down along the axial direction of said suction nozzle.

7. The component suction devices according to claim 6, wherein
said up-and-down linear motor comprises a magnetic-circuit forming member fixed to a mechanism forming member, a coil that is movable up-and-down relative to said magnetic-circuit forming member, and a support member supporting said coil,
with said nozzle turning device being fixed to said support member.

8. A component mounting apparatus comprising:
a mounting head having thereon component suction devices for sucking components that are to be mounted onto a circuit-forming body, each of said component suction devices including
(i) a suction nozzle for sucking and holding a component,
(ii) a nozzle turning device for holding said suction nozzle and turning said suction nozzle,
(iii) a nozzle up-and-down device, located above said nozzle turning device and connected to said suction nozzle, for moving said suction nozzle up and down along an axial direction of said suction nozzle, and
(iv) a driver for respectively controlling said nozzle turning device and said nozzle up-and-down device,
wherein said nozzle turning device of said each of said component suction devices is to be driven individually and independently of said nozzle turning device of each other of said component suction devices, and said nozzle up-and-down device of said each of said component suction devices is to be driven individually and independently of said nozzle up-and-down device of each other of said component suction devices.

9. A component mounting apparatus comprising:
a mounting head having thereon component suction devices for sucking components that are to be mounted onto a circuit-forming body, each of said component suction devices including
(i) a suction nozzle for sucking and holding a component,
(ii) a nozzle turning device for holding said suction nozzle and turning said suction nozzle,
(iii) a nozzle up-and-down device, located above said nozzle turning device and connected to said suction nozzle, for moving said suction nozzle up and down along an axial direction of said suction nozzle, and
(iv) a driver for respectively controlling said nozzle turning device and said nozzle up-and-down device; and
a main controller for controlling operation of said driver of said each of said component suction devices so as to control said nozzle turning device and said nozzle up-and-down device of said each of said component suction devices such that controlled is
(a) turning of a component, sucked and held by said suction nozzle of said each of said component suction devices, to a placement posture angle of the component,
(b) recognition of a posture of the component after the component has been turned to the placement posture angle,
(c) correction of a posture of the component based on a result corresponding to the recognition of the posture of the component after the component has been turned to the placement posture angle, and
(d) mounting of the component onto the circuit-forming body after the correction of the posture of the component.

10. The component mounting apparatus according to claim 9, wherein
said main controller is for controlling operation of said driver of said each of said component suction devices so as to control said nozzle turning device of said each of said component suction devices such that turning of the component, sucked and held by said suction nozzle of said each of said component suction devices, to the placement posture angle of the component occurs simultaneously with turning of each component sucked and held by said suction nozzle of each other of said component suction devices to the placement posture angle of this each component.

11. The component mounting apparatus according to claim 9, wherein
said main controller is also for controlling operation of said driver of said each of said component suction devices such that, after sucking and holding of the component by said suction nozzle of said each of said component suction devices and before recognition of the posture of the component, said suction nozzle of said each of said component suction devices moves up or down such that a bottom face of the component is aligned with each component sucked and held by said suction nozzle of each other of said component suction devices.

12. A component mounting apparatus comprising:
a mounting head having thereon component suction devices for sucking components that are to be mounted onto a circuit-forming body, each of said component suction devices including
(i) a suction nozzle for sucking and holding a component,
(ii) a nozzle turning device for holding said suction nozzle and turning said suction nozzle,
(iii) a nozzle up-and-down device, located above said nozzle turning device and connected to said suction nozzle, for moving said suction nozzle up and down along an axial direction of said suction nozzle, and
(iv) a driver for respectively controlling said nozzle turning device and said nozzle up-and-down device; and
a main controller for controlling operation of said driver of said each of said component suction devices so as to control said nozzle turning device and said nozzle up-and-down device of said each of said component suction devices such that controlled is
(a) turning of a component, sucked and held by said suction nozzle of said each of said component suction devices, to a placement posture angle of the component, simultaneously with turning of each component sucked and held by said suction nozzle of each other of said component suction devices to a placement posture angle of this each component,
(b) mounting of the component, sucked and held by said suction nozzle of said each of said component suction devices, after this component has been turned to its placement posture angle, and (c) mounting of each component, sucked and held by said suction nozzle of said each other of said component suction devices, after this each component has been turned to its placement posture angle.

13. A component mounting apparatus comprising:
a mounting head having thereon component suction devices for sucking components that are to be mounted onto a circuit-forming body, each of said component suction devices including
   (i) a suction nozzle for sucking and holding a component,
   (ii) a nozzle turning device for holding said suction nozzle and turning said suction nozzle,
   (iii) a nozzle up-and-down device, located above said nozzle turning device and connected to said suction nozzle, for moving said suction nozzle up and down along an axial direction of said suction nozzle, and
   (iv) a driver for respectively controlling said nozzle turning device and said nozzle up-and-down device; and
a main controller for controlling operation of said driver of said each of said component suction devices so as to control said nozzle turning device and said nozzle up-and-down device of said each of said component suction devices such that controlled is
   (a) immediately after sucking and holding a component by said suction nozzle of said each of said component suction devices, individual and independent operation of said driver of said each of said component suction devices so as to control turning of the component to a placement posture angle of the component, and
   (b) placing of the component onto the circuit-forming body after the component has been turned to the placement posture angle.

14. A component mounting apparatus comprising:
a main body;
a mounting head having thereon component suction devices for sucking components that are to be mounted onto a circuit-forming body, each of said component suction devices including
   (i) a suction nozzle for sucking and holding a component,
   (ii) a nozzle turning device for holding said suction nozzle and turning said suction nozzle, and
   (iii) a nozzle up-and-down device, located above said nozzle turning device and connected to said suction nozzle, for moving said suction nozzle up and down along an axial direction of said suction nozzle;
a main controller, on said main body, for controlling a component mounting operation;
a head controller, on said mounting head and connected to said main controller, for performing one-to-one asynchronous communications serially with said main controller in association with drive-control related information; and
servo drivers, on said mounting head and connected to said head controller, for performing one-to-multi synchronous communications serially with said head controller in association with the drive-control related information when obtained from said head controller so as to respectively drive and control said nozzle up-and-down device and said nozzle turning device of said each of said component suction devices.

15. The component mounting apparatus according to claim 14, wherein
said servo drivers have addresses different relative to one another, and
the drive-control related information includes
   (i) drive-amount information containing the addresses of said servo drivers and information pertaining to drive amounts for said nozzle turning device and said nozzle up-and-down device of said each of said component suction devices, and
   (ii) an operation start signal to be communicated at a time other than when the drive-amount information is communicated,
such that after the drive-control related information has been received by a properly addressed servo driver, said properly addressed servo driver, upon receiving the operation start signal, exerts control so that a respective said nozzle up-and-down device or a respective said nozzle turning device is driven based on the drive-amount information.

16. Component suction devices for sucking components that are to be mounted onto a circuit-forming body, each of said component suction devices being mounted on the same mounting head and comprising:
a drive shaft up-and-down movable and rotatable about an axis;
a suction nozzle, fitted at a lower end of said drive shaft so as to be non-rotatable and up-and-down immovable relative to said drive shaft, for sucking and holding a component;
a θ-turn driving motor, connected to an upper portion of said drive shaft so as to be non-rotatable and up-and-down movable relative to said drive shaft, for rotating said drive shaft about said axis;
a first coupling section connected to said drive shaft so as to be up-and-down immovable and rotatable relative to said drive shaft;
an up-and-down driver device for driving said first coupling section up and down so as to drive said drive shaft up and down; and
a driver for respectively controlling said θ-turn driving motor and said up-and-down driver device,
wherein said suction nozzles of said component suction devices are independently controllable for recognition and correction of the components sucked and held thereby.

17. The component suction devices according to claim 16, wherein said suction nozzles of said component suction devices are linearly arranged along a direction that is orthogonal to the axis about which said drive shaft is rotatable.

18. The component suction devices according to claim 17, wherein
said up-and-down driver device comprises a linear motor.

19. The component suction devices according to claim 17, wherein
said θ-turn driving motor comprises a brushless motor.

20. The component suction devices according to claim 17, further comprising:
a suction control valve for controlling a suction operation of said suction nozzle.

21. The component suction devices according to claim 19, wherein
said brushless motor comprises
   (i) a rotor supported so as to be rotatable about a rotor axis, said rotor being magnetized so as to have plural poles about its periphery, and
   (ii) a stator having teeth with fore end portions opposed to an outer periphery of said rotor, and a coil wound around tooth winding portions of said teeth so that said rotor rotates along with a rotating magnetic field of said stator,
with each of said fore end portions having a circular-arc surface extending along said outer periphery of said rotor, and said tooth winding portions being parallel to one another.

22. The component suction devices according to claim 21, wherein
the circular-arc surfaces have a symmetrical slot pitch.

23. The component suction devices according to claim 21, wherein
said stator has a thickness along said rotor axis and a flat shape along an end face of said rotor such that a first length interconnecting points of said stator corresponding to 0° and 180° about said rotor axis is shorter than a second length interconnecting points of said stator corresponding to 90° and 270° about said rotor axis.

24. The component suction devices according to claim 23, wherein
said stator comprises first and second stator blocks contacting each other at a boundary connection between points of said stator corresponding to 0° and 180° about said rotor axis.

25. The component suction devices according to claim 24, wherein
each of said first and second stator blocks comprises plural tooth blocks joined together so that a magnetic path is defined by base end portions of tooth winding portions of said plural tooth blocks.

26. The component suction devices according to claim 23, wherein
said stator comprises a single stator block.

27. The component suction devices according to claim 23, wherein
said stator has grooves, serving as said tooth winding portions, formed thicknesswise in a side surface of said stator crossing a direction of said first length,
with said coil being wound on said grooves such that an outermost peripheral surface of said coil is positioned so as to be flush with said side surface or inward of said side surface.

28. The component suction devices according to claim 18, wherein
said linear motor comprises
(i) frame coils inside a cylindrical outer yoke on a stationary side,
(ii) an inner yoke having teeth passing through said frame coils, and a magnetic communicating portion at at least one end of said teeth and adjoining said teeth,
(iii) magnets provided on both surfaces of each of said teeth, so that faces of one of said teeth opposed to one of said frame coils have a single polarity, while faces of another of said teeth opposed to another of said frame coils have a different single polarity,
such that when a magnetic flux is radiated from one of said magnets on said one of said teeth the magnetic flux flows to said another of said teeth via said outer yoke, passes through said magnetic communicating portion, and flows back to said one of said magnets through said one of said teeth, and
such that when an electric current is supplied to said frame coils, a movable side composed of said magnets and said inner yoke moves in a longitudinal direction of said teeth.

29. The component suction devices according to claim 28, wherein
said inner yoke is U-shaped.

30. The component suction devices according to claim 28, wherein
each of said frame coils has an opening face having a rectangular shape such that a length of a side of said each of said frame coils opposite a respective one of said magnets is longer than a length of a span section of said each of said frame coils.

31. The component suction devices according to claim 18, wherein
said linear motor comprises
(i) an inner yoke having teeth and a magnetic communicating portion at at least one end of said teeth and adjoining said teeth,
(ii) an outer yoke which externally surrounds said teeth,
(iii) magnets provided inside said outer yoke and opposed to both faces of each of said teeth, so that faces of said magnets opposed to one of said teeth are of a single polarity and faces of said magnets opposed to another of said teeth are of a single different polarity, and
(iv) coils wound on said one of said teeth and said another of said teeth, respectively,
such that when a magnetic flux is radiated from one of said magnets opposed to said one of said teeth the magnetic flux flows to said another of said teeth via said outer yoke, passes through said magnetic communicating portion, and flows back to said one of said magnets through said one of said teeth, and
such that when an electric current is supplied to said coils, a movable side composed of said magnets and said outer yoke moves in a longitudinal direction of said teeth.

32. The component suction devices according to claim 31, wherein
each of said teeth has a rectangular shape such that a length of opposite sides of said each of said teeth, opposed to respective ones of said magnets, is longer than a length of a side of said each of said teeth that interconnects said opposite sides of said each of said teeth.

33. The component suction devices according to claim 17, wherein an array pitch of said up-and-down driver device of one of said component suction devices and said up-and-down driver device of another of said component suction devices, and an array pitch of said θ-turn driving motor of said one of said component suction devices and said θ-turn driving motor of said another of said component suction devices, are equal to an array pitch of said suction nozzle of said one of said component suction devices and said suction nozzle of said another of said component suction devices and are to be equal to an array pitch of component feed sections of a component feed device which is to feed components that are to be sucked and held by said suction nozzle of said one of said component suction devices and said suction nozzle of said another of said component suction devices.

* * * * *

UNITED STATES PATENT AND TRADEMARK OFFICE
CERTIFICATE OF CORRECTION

PATENT NO. : 7,017,261 B2 Page 1 of 1
APPLICATION NO. : 10/130118
DATED : March 28, 2006
INVENTOR(S) : Kenji Okamoto et al.

It is certified that error appears in the above-identified patent and that said Letters Patent is hereby corrected as shown below:

ON THE FRONT PAGE

In item (56) References Cited, change "6,550,134 B1 * 4/2003 Asai et al. ... 29/833" to --6,550,134 B2 * 4/2003 Asai et al. ... 29/833--.

Signed and Sealed this

Sixth Day of February, 2007

JON W. DUDAS
*Director of the United States Patent and Trademark Office*